US012745371B2

(12) United States Patent
Narayanan et al.

(10) Patent No.: US 12,745,371 B2
(45) Date of Patent: Sep. 22, 2026

(54) MODULAR COFTA-BASED NETWORKING DEVICE SYSTEM

(71) Applicant: Dell Products L.P., Round Rock, TX (US)

(72) Inventors: Padmanabhan Narayanan, Chennai (IN); Neal Beard, Austin, TX (US); Vamshidhar Varre, Hyderabad (IN)

(73) Assignee: Dell Products L.P., Round Rock, TX (US)

( * ) Notice: Subject to any disclaimer, the term of this patent is extended or adjusted under 35 U.S.C. 154(b) by 162 days.

(21) Appl. No.: 18/899,057

(22) Filed: Sep. 27, 2024

(65) Prior Publication Data

US 2025/0287545 A1 Sep. 11, 2025

Related U.S. Application Data

(63) Continuation-in-part of application No. 18/600,978, filed on Mar. 11, 2024.

(51) Int. Cl.
*G06F 1/20* (2006.01)
*G06F 1/183* (2026.01)
(Continued)

(52) U.S. Cl.
CPC ......... *H05K 7/20727* (2013.01); *G06F 1/183* (2013.01); *G06F 1/20* (2013.01); *H05K 7/1487* (2013.01); *H05K 7/20836* (2013.01)

(58) Field of Classification Search
CPC ........... H05K 7/20727; H05K 7/20172; H05K 7/20145; H05K 7/1438; H05K 7/20209;
(Continued)

(56) References Cited

U.S. PATENT DOCUMENTS 10,372,178 B2 * 8/2019 Chang ........................ G06F 1/26
11,641,726 B1 * 5/2023 Jagadeesan ........ H05K 7/20172 361/679.48

(Continued)

*Primary Examiner* — Mandeep S Buttar
(74) *Attorney, Agent, or Firm* — Joseph Mencher

(57) ABSTRACT

A modular Computer-On-Fan-Tray-Assembly (COFTA) networking device system includes a networking device chassis housing a circuit board coupled to a plurality of non-networking components and including: a networking processing system coupled to networking ports that are accessible on the networking device chassis, a networking processing system management connector coupled to the networking processing system, a non-networking component management connector coupled to the non-networking components, and a networking software management connector. At least two COFTA systems are each connected to a different subset of the networking processing system management connector, the non-networking component management connector, and the networking software management connector. Each COFTA system provides a respective operating system that manages a different subset of the networking processing system via the networking processing system management connector, the plurality of non-networking components via the non-networking component management connector, and networking software via the networking software management connector.

20 Claims, 35 Drawing Sheets

(51) Int. Cl.
*H05K 7/14* (2006.01)
*H05K 7/20* (2006.01)

(58) Field of Classification Search
CPC ........... H05K 7/20718; H05K 7/20581; H05K 7/20563; G06F 1/20; G06F 1/185; G06F 1/184; G06F 1/206; G06F 1/181; G06F 2200/201; G06F 2213/0026
See application file for complete search history.

(56) References Cited

U.S. PATENT DOCUMENTS

| | | | | |
|---|---|---|---|---|
| 12,495,514 | B2 * | 12/2025 | Su | F04D 29/644 |
| 2020/0315067 | A1 * | 10/2020 | Shearman | H04Q 1/023 |
| 2021/0181817 | A1 * | 6/2021 | Lu | G06F 1/20 |
| 2025/0351307 | A1 * | 11/2025 | Fremrot | H05K 7/20727 |

* cited by examiner

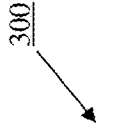
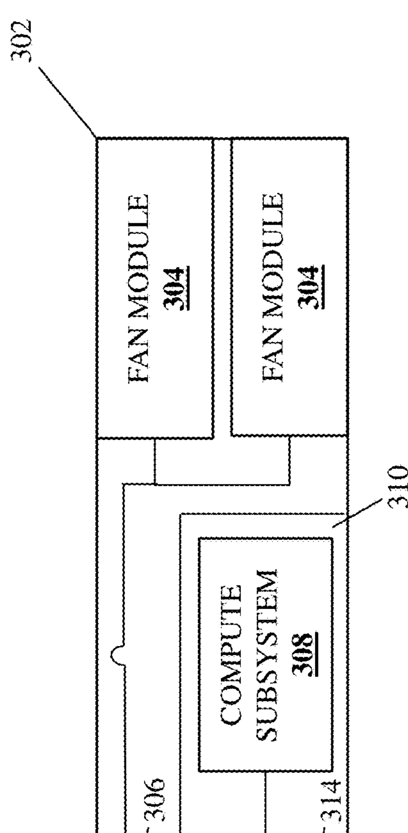
FIG. 3A

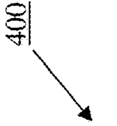
400
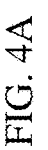
FIG. 4A
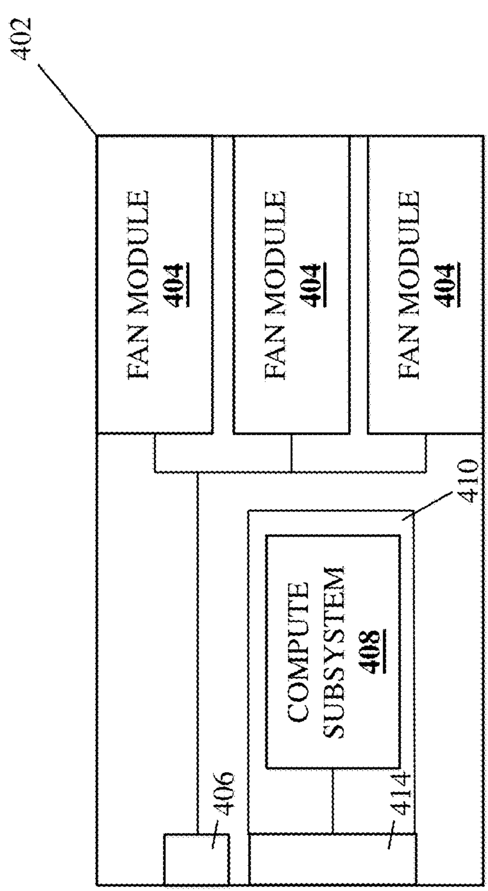
402
FAN MODULE
404
FAN MODULE
404
FAN MODULE
404
410
COMPUTE
SUBSYSTEM
408
406
414

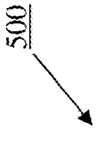
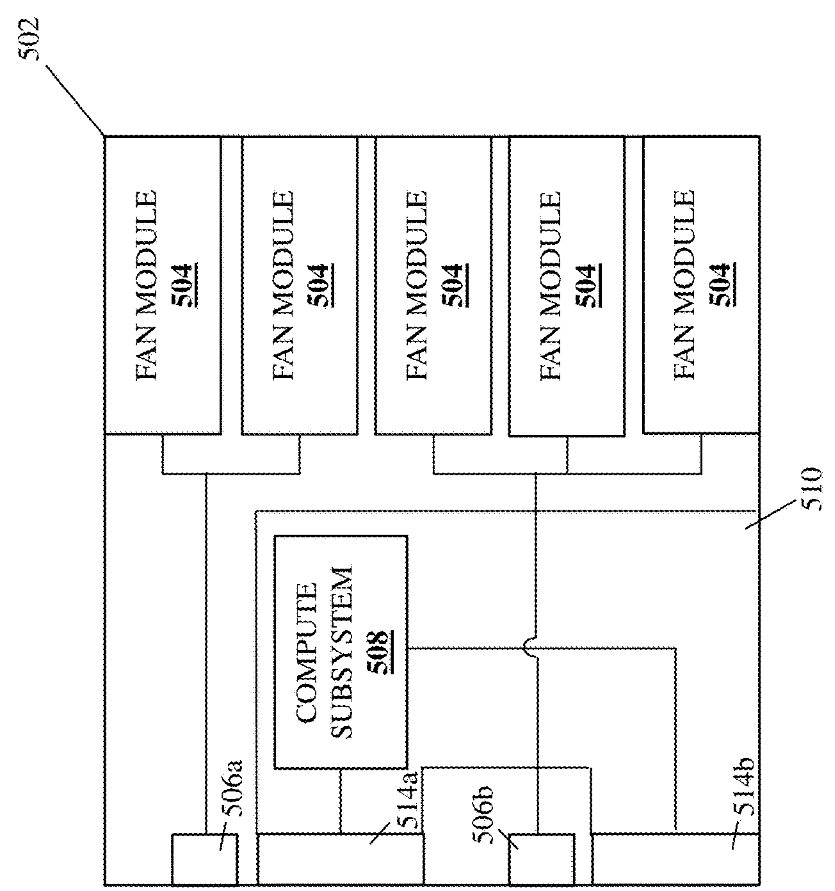
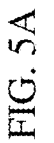
FIG. 5A

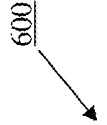
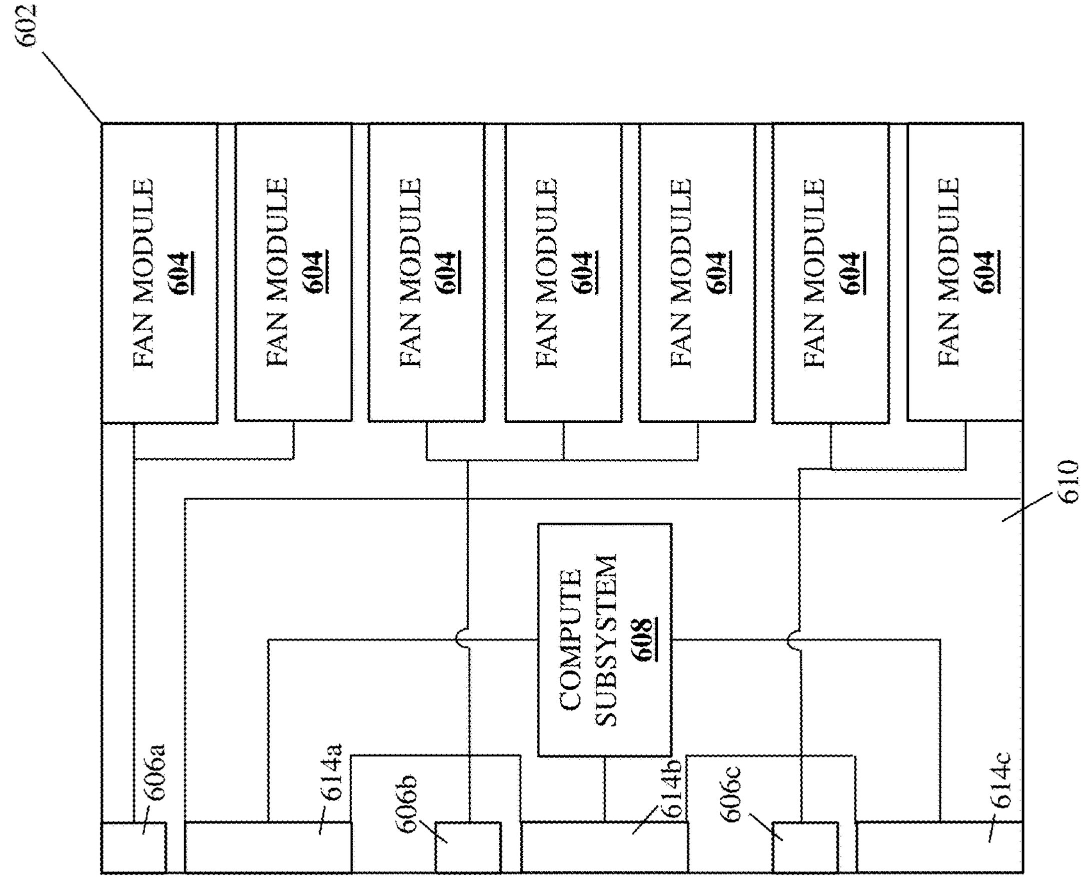
FIG. 6A

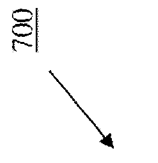
700

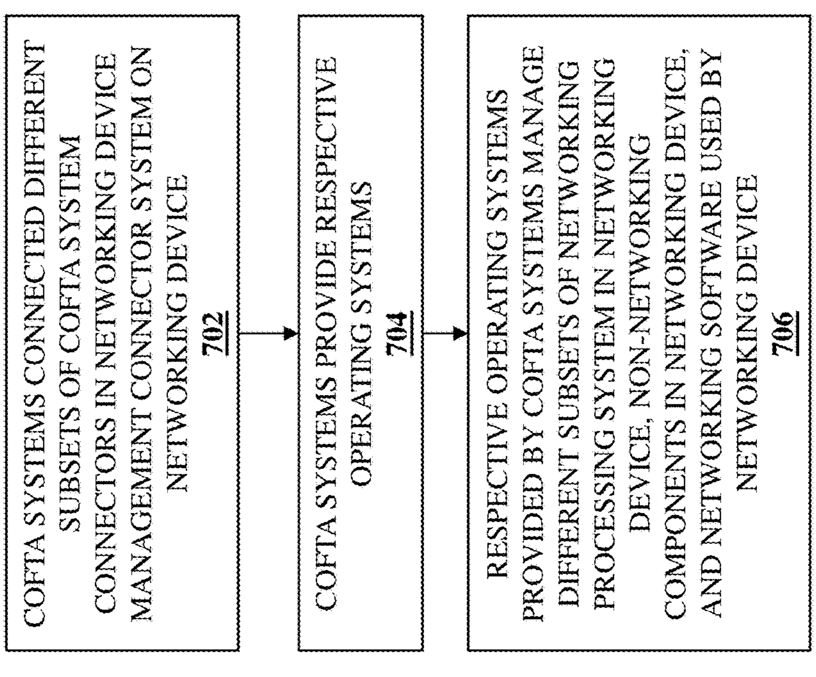
COFTA SYSTEMS CONNECTED DIFFERENT SUBSETS OF COFTA SYSTEM CONNECTORS IN NETWORKING DEVICE MANAGEMENT CONNECTOR SYSTEM ON NETWORKING DEVICE
702
COFTA SYSTEMS PROVIDE RESPECTIVE OPERATING SYSTEMS
704
RESPECTIVE OPERATING SYSTEMS PROVIDED BY COFTA SYSTEMS MANAGE DIFFERENT SUBSETS OF NETWORKING PROCESSING SYSTEM IN NETWORKING DEVICE, NON-NETWORKING DEVICE, NON-NETWORKING COMPONENTS IN NETWORKING DEVICE, AND NETWORKING SOFTWARE USED BY NETWORKING DEVICE
706

FIG. 7

MODULAR COFTA-BASED NETWORKING DEVICE SYSTEM

CROSS-REFERENCE TO RELATED APPLICATION

The present disclosure is a continuation-in-part of U.S. patent application Ser. No. 18/600,978, filed Mar. 11, 2024, the disclosure of which is incorporated by reference herein in its entirety.

BACKGROUND

The present disclosure relates generally to information handling systems, and more particularly to a modular networking information handling system provided using Computer-On-Fan-Tray-Assembly (COFTA) systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices and other networking devices known in the art, may be provided with a variety of switch management functionality that can vary based on different networking applications/use cases and that can affect their cost. However, such switch management functionality generally provides for management of the networking processing system (e.g., a Network Processing Unit (NPU), switch Application-Specific Integrated Circuit (ASIC), etc.) and associated networking components in the switch device, networking software utilized by the switch device, and non-networking hardware in the switch device. In conventional switch devices, a motherboard or other monolithic switch circuit board that includes the networking processing system is typically provided with a Central Processing Unit (CPU) that is integrated with the networking processing system and other components in the switch device and configured to provide a Networking Operating System (NOS) that operates to perform all of the switch management functionality described above.

However, the networking processing system and associated networking components in the switch device, the networking software utilized by the switch device, and the non-networking hardware in the switch device may each be provided by a different source, which can present issues with their management via the NOS discussed above. For example, capabilities of the networking drivers and Switch Abstraction Interface (SAI) used by the networking processing system may differ depending on the NOS being used, errors that occur in the switch device may present difficulties with regard to identifying their root cause (e.g., errors due to the operation of the networking processing system, networking software, or non-networking hardware), and/or other issues that would be apparent to one of skill in the art in possession of the present disclosure.

Accordingly, it would be desirable to provide a networking device that addresses the issues discussed above.

SUMMARY

According to one embodiment, a networking device includes a networking device chassis; a circuit board that is housed in the networking device chassis; a plurality of networking ports that are included on the circuit board and that are accessible on the networking device chassis; a networking processing system that is included on the circuit board and that is coupled to the plurality of ports; a plurality of non-networking components that are couped to the circuit board; and a networking device management connector system that is included on the circuit board and that includes: a networking processing system management connector that is coupled to the networking processing system; a non-networking component management connector that is coupled to the non-networking components; and a networking software management connector, wherein the networking device management connector system is configured to connect to at least two Computer-On-Fan-Tray-Assembly (COFTA) systems that are each configured to provide a respective operating system that is configured to manage a different subset of the networking processing system via networking processing system management connector, the non-networking components via the non-networking component management connector, and networking software via networking software management connector.

BRIEF DESCRIPTION OF THE DRAWINGS

FIG. 3A is a schematic view illustrating an embodiment of a COFTA system that may provide the modular COFTA-based networking device system of the present disclosure.

FIG. 4A is a schematic view illustrating an embodiment of a COFTA system that may provide the modular COFTA-based networking device system of the present disclosure.

FIG. 5A is a schematic view illustrating an embodiment of a COFTA system that may provide the modular COFTA-based networking device system of the present disclosure.

FIG. 6A is a schematic view illustrating an embodiment of a COFTA system that may be used with the modular COFTA-based networking device system of the present disclosure.

FIG. 7 is a flow chart illustrating an embodiment of a method for providing a modular COFTA-based networking device.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
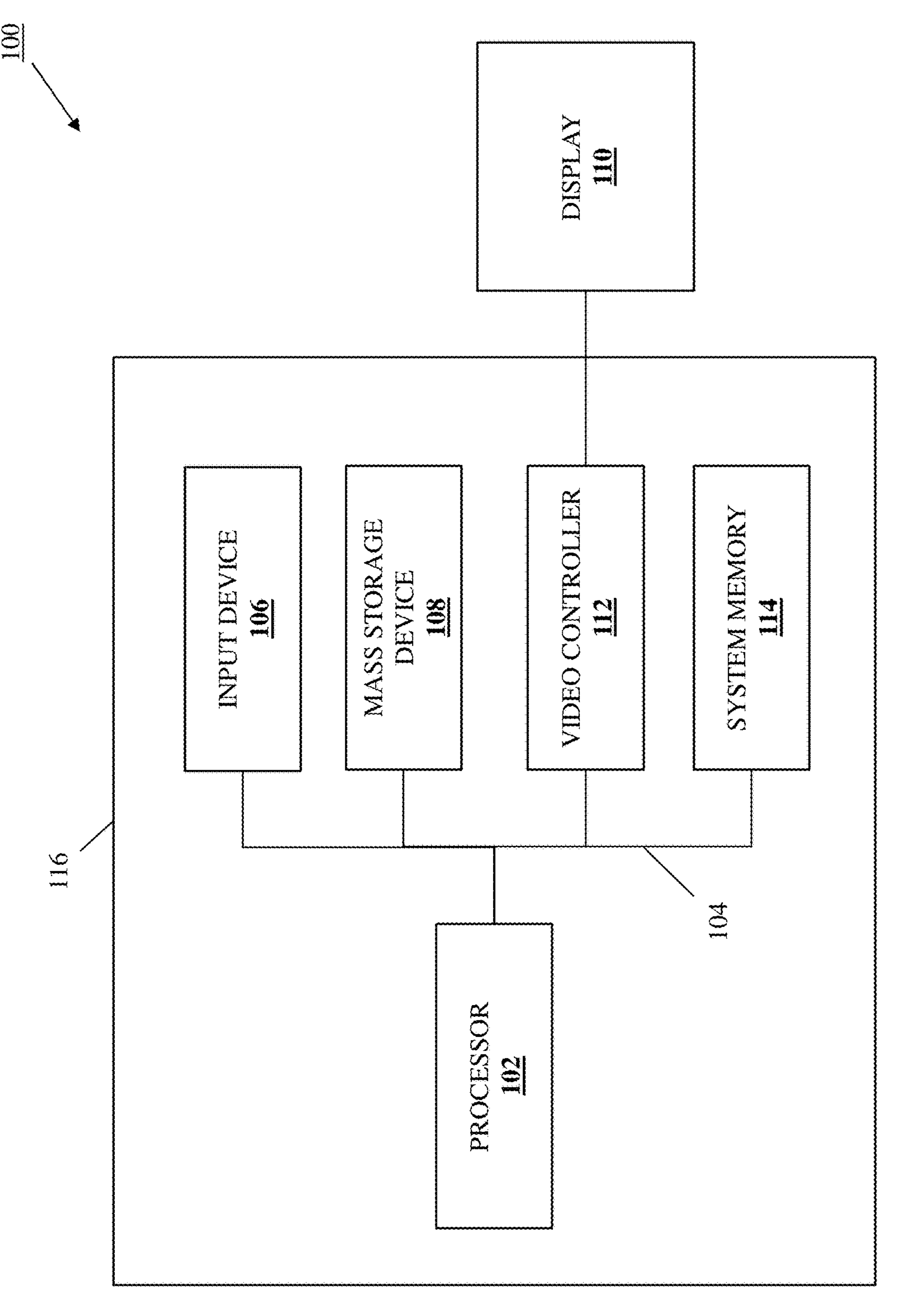
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
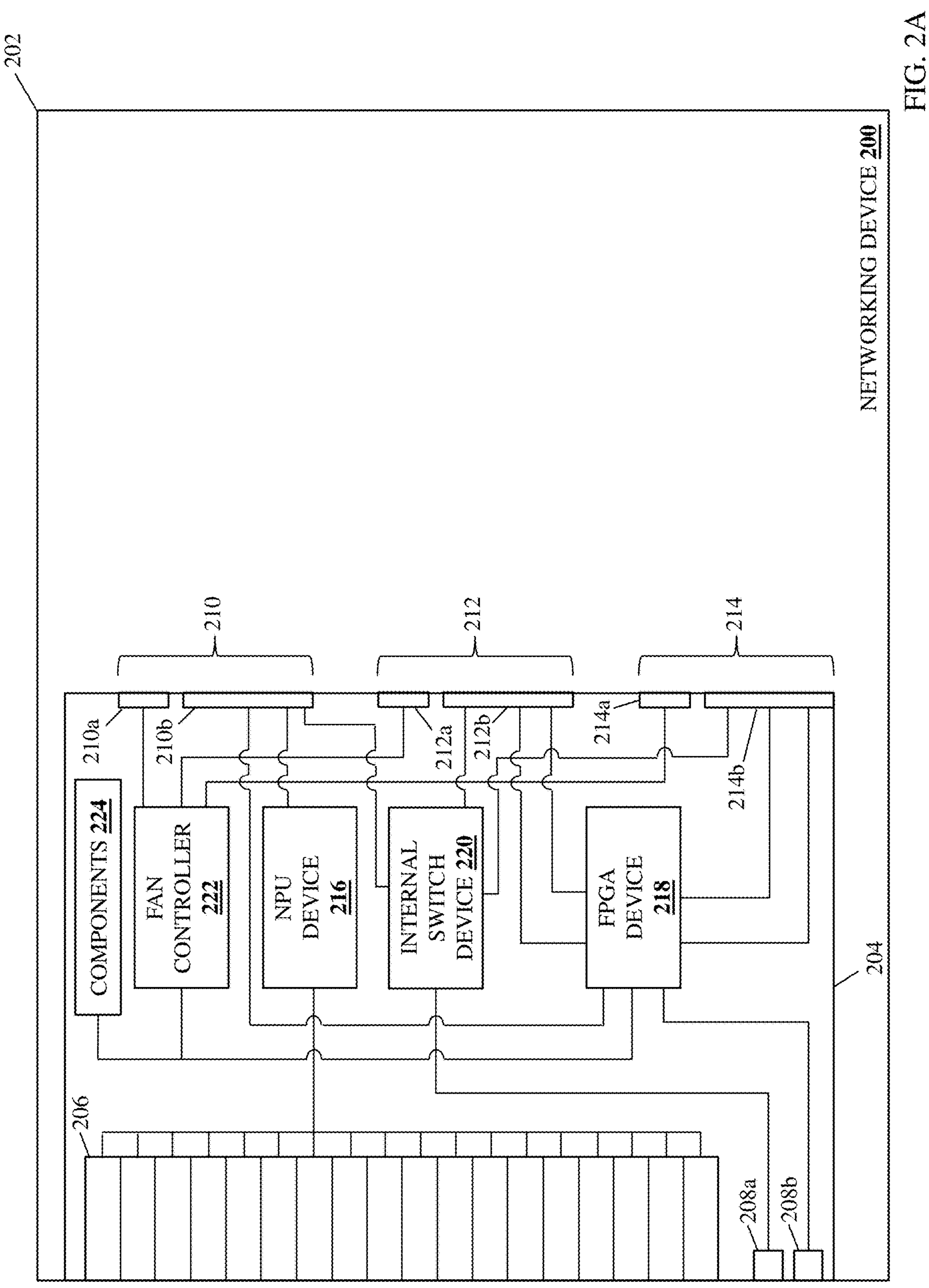
FIG. 2A is a schematic view illustrating an embodiment of a networking device that may provide the modular COFTA-based networking device system of the present disclosure.
Figure 2B:
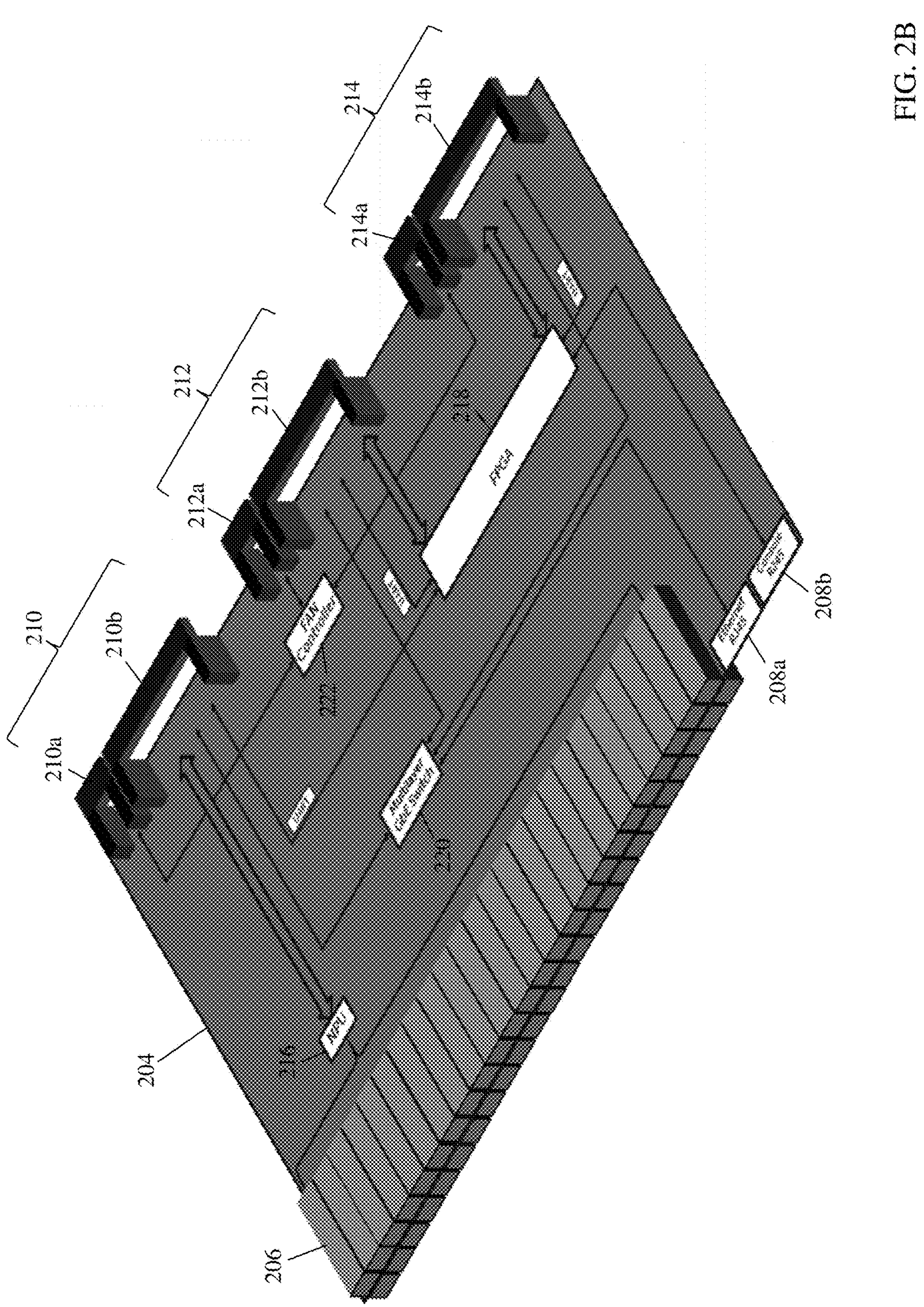
FIG. 2B is a perspective view illustrating an embodiment of the networking device of FIG. 2A.

Referring now to FIGS. 2A and 2B, an embodiment of a networking device 200 is illustrated that may provide the modular COFTA-based networking device system of the present disclosure. In an embodiment, the networking device 200 may be provided by the IHS 100 discussed above with reference to FIG. 1, and/or may include some or all of the components of the IHS 100, and in the specific examples provided below is provided by a switch device. However, while illustrated and discussed as being provided by a switch device, one of skill in the art in possession of the present disclosure will recognize that the modular COFTA-based networking device system of the present disclosure may be provided by a variety of networking devices while remaining within the scope of the present disclosure.

In the illustrated embodiment, the networking device 200 includes a networking device chassis 202 that houses the components of the networking device 200, only some of which are illustrated and described below. In the examples illustrated and described below, the networking device chassis 202 houses a circuit board 204 that may be provided by a networking device motherboard and/or other networking device circuit boards that would be apparent to one of skill in the art in possession of the present disclosure. A plurality of networking ports 206 are included on the circuit board 204, and one of skill in the art in possession of the present disclosure will appreciate how the networking ports 206 may be accessible on an outer surface of the networking device chassis 202. In a specific example, the networking device ports 206 may be provided by transceiver systems that one of skill in the art in possession of the present disclosure will appreciate may include transceiver cages that are mounted to the circuit board 204 and that are configured to couple transceiver devices (e.g., Quad Small Form-factor Pluggable (QSFP) transceiver devices) to the circuit board 204, although other networking device ports 206 will fall within the scope of the present disclosure as well.

A pair of management ports 208*a* and 208*b* are included on the circuit board 204, and one of skill in the art in possession of the present disclosure will appreciate how the management ports 208*a* and 208*b* may be accessible on an outer surface of the networking device chassis 202. In a specific example, the management port 208*a* may be provided by an Ethernet RJ45 port that one of skill in the art in possession of the present disclosure will appreciate may be utilized to perform remote management of the networking device 200 (e.g., via a networking cable coupled to the Ethernet RJ45 port and a network), and the management port 208*b* may be provided by a console RJ45 port that one of skill in the art in possession of the present disclosure will appreciate may be utilized to perform "in-person" management of the networking device 200 (e.g., via a networking cable coupled to the console RJ45 port and a laptop/notebook computing device located adjacent the networking device 200), although other management ports 208*a* and 208*b* will fall within the scope of the present disclosure as well.

The circuit board 204 also includes a networking device management connector system that is provided by a plurality of COFTA system connectors, embodiments of which were described by the inventors of the present disclosure in U.S. patent application Ser. No. 18/600,978, filed Mar. 11, 2024, the disclosure of which is incorporated by reference herein in its entirety. In the embodiments illustrated and described below, the networking device management connector system on the circuit board 204 includes three COFTA system connectors: a COFTA system connector 210 provided on the circuit board 204 by a COFTA fan subsystem connector 210*a* and a COFTA compute subsystem connector 210*b*, with the COFTA compute subsystem connector 210*b* operating as a "networking processing system management" connector in the examples described below; a COFTA system connector 212 provided on the circuit board 204 by a COFTA fan subsystem connector 212*a* and a COFTA compute subsystem connector 212*b*, with the COFTA compute subsystem connector 212*b* operating as a "networking software management" connector in the examples described below; and a COFTA system connector 214 provided on the circuit board 204 by a COFTA fan subsystem connector 214*a* and a COFTA compute subsystem connector 214*b*, with the COFTA compute subsystem connector 214*b* operating as a "non-networking component management" connector in the examples described below.

A networking processing system is included on the circuit board 204 and is illustrated and described below as including an Network Processing Unit (NPU) device 216, but one of skill in the art in possession of the present disclosure will appreciate how the networking processing system may include a switch Application-Specific Integrated Circuit (ASIC) and/or other networking processors known in the art, as well as forwarding tables, telemetry hardware, and/or other networking hardware, firmware, and/or other networking processing system components known in the art. As can be seen in FIGS. 2A and 2B, the NPU device 216 is coupled to the plurality of networking ports 206, as well as to the COFTA compute subsystem connector 210*b* on the COFTA system connector 210 that operates as a "networking processing system management" connector in the examples described below.

A Field Programmable Gate Array (FPGA) device 218 is included on the circuit board 204, but one of skill in the art in possession of the present disclosure will appreciate how the FPGA device 218 may be replaced by a Complex Programmable Logic Device (CPLD) and/or other processing devices that operate similarly to the FPGA device 218 described below. The FPGA device 218 includes a single connection to the COFTA compute subsystem connector 210*b* on the COFTA system connector 210 that operates as a "networking processing system management" connector in the examples described below, and as illustrated in FIG. 2B that connection may be provided by a Universal Asynchronous Receiver-Transmitter (UART) connection and/or other similar connection known in the art.

The FPGA device 218 also includes a pair of connections to the COFTA compute subsystem connector 212*b* on the COFTA system connector 212 that operates as a "networking software management" connector in the examples described below, and as illustrated in FIG. 2B one of those connections may be provided by a UART connection and/or other similar connection known in the art. The FPGA device 218 also includes a pair of connections to the COFTA compute subsystem connector 214*b* on the COFTA system connector 214 that operates as a "non-networking component management" connector in the examples described below, and as illustrated in FIG. 2B one of those connections may be provided by a UART connection and/or other similar connection known in the art. The FPGA device 218 also includes a connection to the management port 208*b* that one of skill in the art in possession of the present disclosure will appreciate may be used for the "in-person" management of the networking device 200 described above and in further detail below.

An internal switch device 220 is included on the circuit board 204 and is illustrated in FIG. 2B as being provided by a multilayer Gigabit Ethernet (GbE) switch, but one of skill in the art in possession of the present disclosure will appreciate how the internal switch device 220 may be provided by other switch devices or switching components that operate similarly to the internal switch device 220 described below. The internal switch device 220 includes a connection to the COFTA compute subsystem connector 210*b* on the COFTA system connector 210 that operates as a "networking processing system management" connector in the examples described below, a connection to the COFTA compute subsystem connector 212*b* on the COFTA system connector 212 that operates as a "networking software management" connector in the examples described below, and a connection to the COFTA compute subsystem connector 214*b* on the COFTA system connector 214 that operates as a "non-networking component management" connector in the examples described below. The FPGA device 218 also includes a connection to the management port 208*a* that one of skill in the art in possession of the present disclosure will appreciate may be used for the remote management of the networking device 200 described above and in further detail below.

A fan controller 222 is included on the circuit board 204 and includes a connection to the COFTA fan subsystem connector 210*a* on the COFTA system connector 210, a connection to the COFTA fan subsystem connector 212*a* on the COFTA system connector 212, and a connection to the COFTA fan subsystem connector 214*a* on the COFTA system connector 214. The fan controller 222 also includes a connection to the FPGA device 218. A plurality of components 224 are also illustrated as being included on the circuit board 204 and including connections to the FPGA device 218, but one of skill in the art in possession of the present disclosure will appreciate how the components may be coupled to the circuit board 204 via connectors, cables, and/or other couplings while remaining within the scope of the present disclosure as well. In specific examples, the components 224 may include power systems (e.g., power adapter components, power supply components, and/or other power system components known in the art), Light Emitting Device (LED) indicator system (e.g., LED components such as port LEDs for the ports 206, LED control components, and/or other LED indicator system components known in the art), thermal control systems (e.g., thermal sensor components used with the fan controller 222), networking software components that interact with networking software used by the networking device 200 (e.g., firmware that interacts with the Networking Operating System (NOS) and/or that is otherwise included in a networking software management system, a Trusted Platform Module (TPM), a Power over Ethernet (POE) manager or controller, a cryptographic accelerator, a console buffer, etc.), and/or any other components that would be apparent to one of skill in the art in possession of the present disclosure.

As described below, the embodiment of the portion of the modular COFTA-based networking device system provided by the networking device 200 illustrated and described below includes the "networking processing system management" connector provided by the COFTA compute subsystem connector 210*b* in the COFTA system connector 210 that has exclusive access the NPU device 216 that is coupled to the ports 206 (as well as other networking processing system components) in order to enable management of the networking processing system in the networking device 200.

the embodiment of the portion of the modular COFTA-based networking device system provided by the networking device 200 illustrated and described below also includes the "networking software management" connector provided by the COFTA compute subsystem connector 212*b* in the COFTA system connector 212 that has access to the FPGA device 218 that is connected to a subset of the components 224 that may interact with networking software provided by the Network Operating System (NOS) used with the networking device 200 as described below (e.g., firmware that interacts with the NOS and/or that is otherwise included in a networking software management system, a TPM, a PoE manager or controller, a cryptographic accelerator, a console buffer, etc.) in order to enable management of the networking software used with the networking device 200.

The embodiment of the portion of the modular COFTA-based networking device system provided by the networking device 200 illustrated and described below also includes the "non-networking component management" connector provided by the COFTA compute subsystem connector 214*b* in the COFTA system connector 214 that has access to the FPGA device 218 that is connected to the fan controller 222 and the subset of the components 224 that provide "non-networking" hardware and other components (e.g., the power system, the LED indicator system, and other non-networking components described above) in the networking device 200 as described below in order to enable management of the non-networking components in the networking device 200.

Furthermore, the coupling of the FPGA device 218 to the management port 208*b* also allows a user to access the COFTA systems that may be connected to the COFTA compute subsystem connectors 210*b*, 212*b*, and 214*b* discussed below via, for example, the UART connections between the FPGA device 218 and those COFTA compute subsystem connectors 210*b*, 212*b*, and 214*b*. The coupling of the internal switch device 220 the COFTA compute subsystem connectors 210*b*, 212*b*, and 214*b* also allows respective operating systems provided by COFTA systems (which may be connected to those COFTA compute subsystem connectors 210*b*, 212*b*, and 214*b* as discussed below) to communicate with each other, while the coupling of the internal switch device 220 to the management port 208*a* also allows a user to access the COFTA systems that may be connected to the COFTA compute subsystem connectors 210*b*, 212*b*, and 214*b* discussed below.

The coupling of the fan controller 222 to the FPGA device 218 and the COFTA fan subsystem connectors 210*a*, 212*a*, and 214*a*, respectively, allows for the use of the fan controller 222 (e.g., by a COFTA system connected to one of those COFTA fan subsystem connectors 210*a*, 212*a*, or 214*a* as described below) to control fan subsystems on the COFTA systems that may be connected to the COFTA fan subsystem connectors 210*a*, 212*a*, and 214*a* discussed below. However, while a specific networking device 200 has been illustrated and described, one of skill in the art in possession of the present disclosure will recognize that networking devices (or other devices operating according to the teachings of the present disclosure in a manner similar to that described below for the networking device 200) may include a variety of components and/or component configurations for providing conventional networking device functionality, as well as the modular COFTA-based networking device functionality discussed below, while remaining within the scope of the present disclosure as well.

Figure 3B:
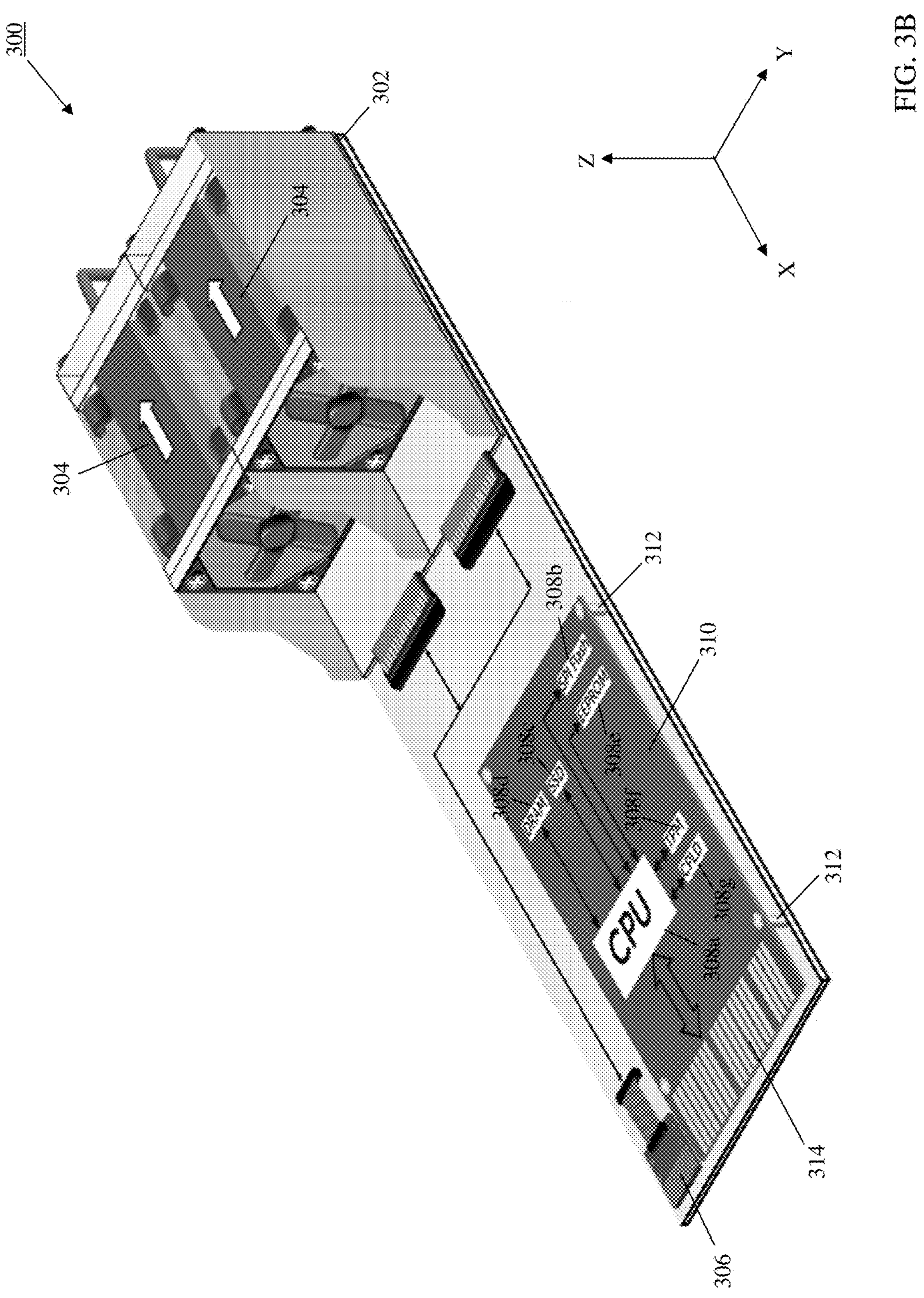
FIG. 3B is a perspective view illustrating an embodiment of the COFTA system of FIG. 3A.

Referring now to FIGS. 3A and 3B, an embodiment of a COFTA system 300 is illustrated that may provide the modular COFTA-based networking device system of the present disclosure. Embodiments of COFTA systems were described by the inventors of the present disclosure in U.S. patent application Ser. No. 18/600,978, filed Mar. 11, 2024, the disclosure of which is incorporated by reference herein in its entirety. The COFTA system 300 includes a fan chassis 302 that supports the components of the COFTA system 300. As will be appreciated by one of skill in the art in possession of the present disclosure, the fan chassis 302 of the COFTA system 300 may be considered a "fan tray assembly" that is configured support one or more fan modules, as well as configured to be positioned in the networking device 200 to couple those fan module(s) to the networking device 200 in order to allow those fan modules to be used to provide cooling for the networking device 200. As such, the fan chassis 302 may include any of a variety of device coupling features that one of skill in the art in possession of the present disclosure would appreciate allow the coupling of the fan chassis 302 to the networking device 200 as described below.

In the illustrated embodiment, the fan chassis 302 is configured to support two fan modules 304 that may be provided by fan modules like those described by the inventors of the present disclosure in U.S. patent application Ser. No. 18/479,235, filed Oct. 2, 2023, the disclosure of which is incorporated by reference herein in its entirety, as well as any other fan modules that would be apparent to one of skill in the art in possession of the present disclosure. As described in U.S. patent application Ser. No. 18/600,978, filed Mar. 11, 2024, the fan chassis 302 may include a fan coupling subsystem that includes respective fan slots that are located adjacent a rear edge of the fan chassis 302 and that may include any of a variety of fan module coupling features that are configured to couple the fan modules 304 to the fan chassis 302 as illustrated in FIGS. 3A and 3B below, respective fan module connectors for each fan module 304 (illustrated in FIG. 3B) it is configured to support, and/or any other fan module couplings that would be apparent to one of skill in the art in possession of the present disclosure. The fan chassis 302 is also provided with a fan controller connector 306 that is coupled to each of the fan modules 304 (e.g., via the fan module connectors illustrated in FIG. 3B), and that may be configured to aggregate signals received from fan modules 304 (i.e., via the fan module connectors), split signals received for fan modules 304 (i.e., via the fan module connectors), and/or perform any other signal transmission operations that would be apparent to one of skill in the art in possession of the present disclosure.

As illustrated, a compute subsystem 308 may be mounted to the fan chassis 302. For example, the compute subsystem 308 may include a circuit board 310 that, as can be seen in FIG. 3B, may be mounted to the fan chassis 302 via a plurality of stand-offs 312 (i.e., with the two stand-offs 312 visible in FIG. 3B engaging the circuit board 310 adjacent its corners along a common edge, as well as two stand-offs that are not visible in FIG. 3B but that may engage the circuit board 310 opposite the circuit board 310 from the visible stand-offs 312 and adjacent its corners along a common opposing edge) in order to provide the circuit board 310 in a spaced-apart orientation along a Z-axis from the adjacent surface of the fan chassis 302 in order to, for example, provide additional thermal cooling for the compute subsystem 308 by allowing airflow from fan modules 304 to move past opposing surfaces (e.g., the top and bottom surfaces in FIG. 3B) of the circuit board 310.

As will be appreciated by one of skill in the art in possession of the present disclosure, the compute subsystem 308 may include any of a variety of compute components. For example, in the embodiment illustrated in FIG. 3B and discussed below, the compute subsystem 308 includes a primary processing system provided by a Central Processing Unit (CPU) 308*a* that is coupled to storage devices provided by a Serial Peripheral Interface (SPI) flash storage device 308*b* and a Solid State Drive (SSD) storage device 308*c*, memory devices provided by Dynamic Random Access Memory (DRAM) device(s) 308*d* and an Electronically Erasable Programmable Read-Only Memory (EEPROM) device 308*e*, a security device provided by a Trusted Platform Module (TPM) device 308*f*, and a secondary processing device provided by a Complex Programmable Logic Device (CPLD) 308*g*.

However, while specific processing devices, storage devices, memory devices, and security devices are illustrated and described herein, one of skill in the art in possession of the present disclosure will appreciate how the compute subsystem 308 may include any of a variety of processing devices, storage devices, memory devices, security devices, and/or other devices based on the compute functionality required from the compute subsystem 308 for any particular COFTA application. As described below, the compute subsystem 308 may be configured to provide either a networking processing system management operating system or a non-networking component management operating system when used in different embodiments of the modular COFTA-based networking device system of the present disclosure.

As can be seen in FIGS. 3A and 3B, the compute subsystem 308 includes a networking device connector 314 that, in the illustrated example, is coupled to the CPU 308*a*. As described in U.S. patent application Ser. No. 18/600,978, filed Mar. 11, 2024, the compute subsystem 308 may be an adaptation of a Compute-On-Module (COM) Express device that includes a modified connector, and thus may be provided with a COM Express form-factor with the exception of that modified connector. For example, the networking device connector 314 may be configured similarly to a COM Express device connector, with the exception that the networking device connector 314 is oriented, and configured to connect along, an X-axis (i.e., the axis parallel to the circuit board 310 and the fan chassis 302) rather than an Z-axis (i.e., the axis perpendicular to the circuit board 310 and the fan chassis 302) that conventional COM Express device connectors are oriented and configured to connect along. However, while a specific compute subsystem and networking device connector are illustrated and described, one of skill in the art in possession of the present disclosure will appreciate how other compute subsystems and networking device connectors will fall within the scope of the present disclosure as well.

Figure 4B:
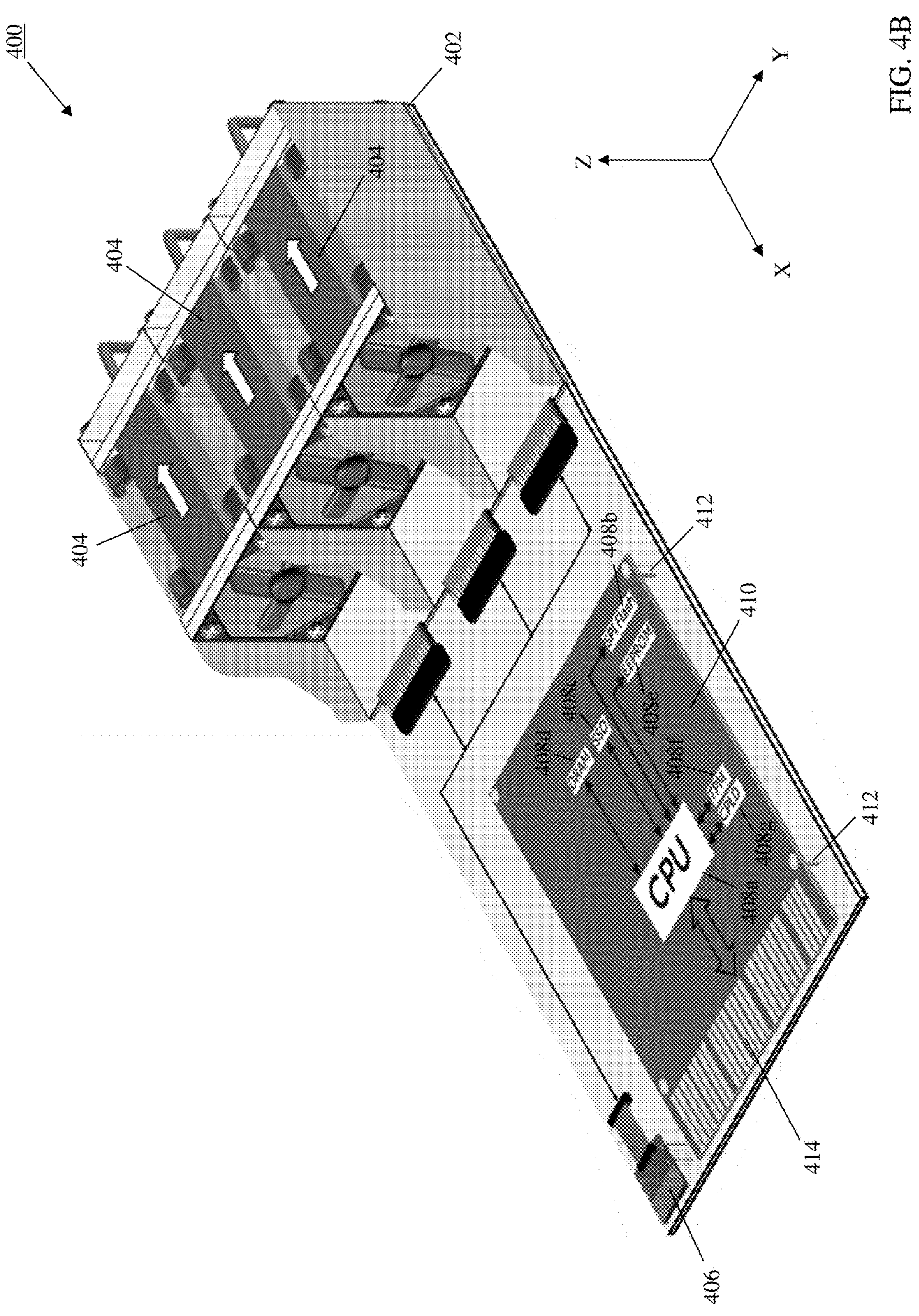
FIG. 4B is a perspective view illustrating an embodiment of the COFTA system of FIG. 4A.

Referring now to FIGS. 4A and 4B, an embodiment of a COFTA system 400 is illustrated that may provide the modular COFTA-based networking device system of the present disclosure. As discussed above, embodiments of COFTA systems were described by the inventors of the present disclosure in U.S. patent application Ser. No. 18/600,978, filed Mar. 11, 2024, the disclosure of which is incorporated by reference herein in its entirety. The COFTA system 400 includes a fan chassis 402 that supports the components of the COFTA system 400. As will be appreciated by one of skill in the art in possession of the present disclosure, the fan chassis 402 of the COFTA system 400 may be considered a "fan tray assembly" that is configured support one or more fan modules, as well as configured to be positioned in the networking device 200 to couple those fan module(s) to the networking device 200 in order to allow those fan modules to be used to provide cooling for the networking device 200. As such, the fan chassis 302 may include any of a variety of device coupling features that one of skill in the art in possession of the present disclosure would appreciate allow the coupling of the fan chassis 302 to the networking device 200 as described below.

In the illustrated embodiment, the fan chassis 402 is configured to support three fan modules 404 that may be provided by fan modules like those described by the inventors of the present disclosure in U.S. patent application Ser. No. 18/479,235, filed Oct. 2, 2023, the disclosure of which is incorporated by reference herein in its entirety, as well as any other fan modules that would be apparent to one of skill in the art in possession of the present disclosure. As described in U.S. patent application Ser. No. 18/600,978, filed Mar. 11, 2024, the fan chassis 402 may include a fan coupling subsystem that includes respective fan slots that are located adjacent a rear edge of the fan chassis 402 and that may include any of a variety of fan module coupling features that are configured to couple the fan modules 404 to the fan chassis 402 as illustrated in FIGS. 4A and 4B below, respective fan module connectors for each fan module 404 (illustrated in FIG. 4B) it is configured to support, and/or any other fan module couplings that would be apparent to one of skill in the art in possession of the present disclosure. The fan chassis 402 is also provided with a fan controller connector 406 that is coupled to each of the fan modules 404 (e.g., via the fan module connectors illustrated in FIG. 4B), and that may be configured to aggregate signals received from fan modules 404 (i.e., via the fan module connectors), split signals received for fan modules 404 (i.e., via the fan module connectors), and/or perform any other signal transmission operations that would be apparent to one of skill in the art in possession of the present disclosure.

As illustrated, a compute subsystem 408 may be mounted to the fan chassis 402. For example, the compute subsystem 408 may include a circuit board 410 that, as can be seen in FIG. 4B, may be mounted to the fan chassis 402 via a plurality of stand-offs 412 (i.e., with the two stand-offs 412 visible in FIG. 4B engaging the circuit board 410 adjacent its corners along a common edge, as well as two stand-offs that are not visible in FIG. 4B but that may engage the circuit board 410 opposite the circuit board 410 from the visible stand-offs 412 and adjacent its corners along a common opposing edge) in order to provide the circuit board 410 in a spaced-apart orientation along a Z-axis from the adjacent surface of the fan chassis 402 in order to, for example, provide additional thermal cooling for the compute subsystem 408 by allowing airflow from fan modules 404 to move past opposing surfaces (e.g., the top and bottom surfaces in FIG. 4B) of the circuit board 410.

As will be appreciated by one of skill in the art in possession of the present disclosure, the compute subsystem 408 may include any of a variety of compute components. For example, in the embodiment illustrated in FIG. 4B and discussed below, the compute subsystem 408 includes a primary processing system provided by a Central Processing Unit (CPU) 408*a* that is coupled to storage devices provided by a Serial Peripheral Interface (SPI) flash storage device 408*b* and a Solid State Drive (SSD) storage device 408*c*, memory devices provided by Dynamic Random Access Memory (DRAM) device(s) 408*d* and an Electronically Erasable Programmable Read-Only Memory (EEPROM) device 408*e*, a security device provided by a Trusted Platform Module (TPM) device 408*f*, and a secondary processing device provided by a Complex Programmable Logic Device (CPLD) 408*g*.

However, while specific processing devices, storage devices, memory devices, and security devices are illustrated and described herein, one of skill in the art in possession of the present disclosure will appreciate how the compute subsystem 408 may include any of a variety of processing devices, storage devices, memory devices, security devices, and/or other devices based on the compute functionality required from the compute subsystem 408 for any particular COFTA application. As described below, the compute subsystem 408 may be configured to provide a networking software management operating system when used in an embodiment of the modular COFTA-based networking device system of the present disclosure.

As can be seen in FIGS. 4A and 4B, the compute subsystem 408 includes a networking device connector 414 that, in the illustrated example, is coupled to the CPU 408*a*. As described in U.S. patent application Ser. No. 18/600,978, filed Mar. 11, 2024, the compute subsystem 408 may be an adaptation of a Compute-On-Module (COM) Express device that includes a modified connector, and thus may be provided with a COM Express form-factor with the exception of that modified connector. For example, the networking device connector 414 may be configured similarly to a COM Express device connector, with the exception that the networking device connector 414 is oriented, and configured to connect along, an X-axis (i.e., the axis parallel to the circuit board 410 and the fan chassis 402) rather than an Z-axis (i.e., the axis perpendicular to the circuit board 410 and the fan chassis 402) that conventional COM Express device connectors are oriented and configured to connect along. However, while a specific compute subsystem and networking device connector are illustrated and described, one of skill in the art in possession of the present disclosure will appreciate how other compute subsystems and networking device connectors will fall within the scope of the present disclosure as well.

Figure 5B:
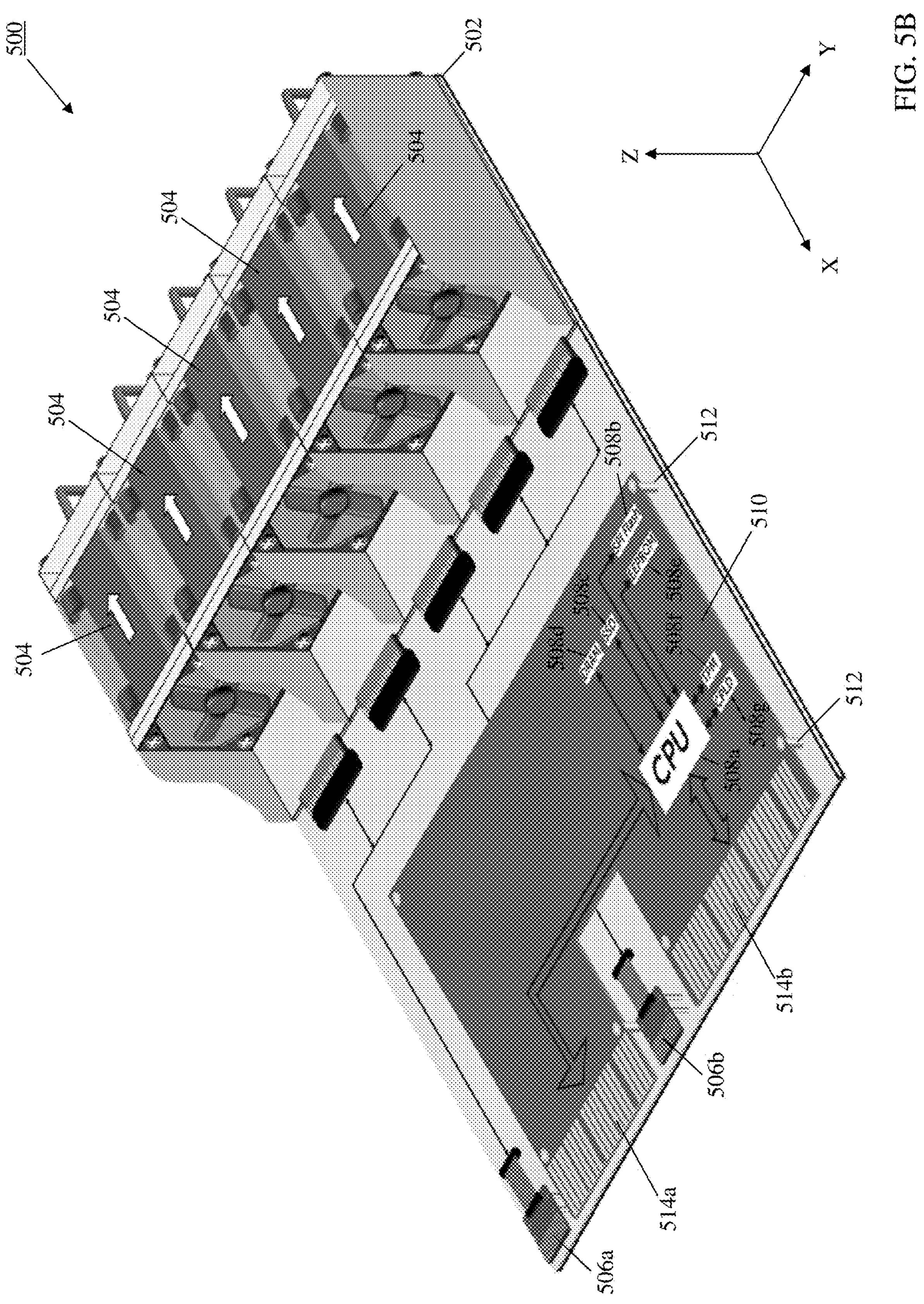
FIG. 5B is a perspective view illustrating an embodiment of the COFTA system of FIG. 5A.

Referring now to FIGS. 5A and 5B, an embodiment of a COFTA system 500 is illustrated that may provide the modular COFTA-based networking device system of the present disclosure. As discussed above, embodiments of COFTA systems were described by the inventors of the present disclosure in U.S. patent application Ser. No. 18/600,978, filed Mar. 11, 2024, the disclosure of which is incorporated by reference herein in its entirety. The COFTA system 500 includes a fan chassis 502 that supports the components of the COFTA system 500. As will be appreciated by one of skill in the art in possession of the present disclosure, the fan chassis 402 of the COFTA system 4500 may be considered a "fan tray assembly" that is configured support one or more fan modules, as well as configured to be positioned in the networking device 200 to couple those fan module(s) to the networking device 200 in order to allow those fan modules to be used to provide cooling for the networking device 200. As such, the fan chassis 502 may include any of a variety of device coupling features that one of skill in the art in possession of the present disclosure would appreciate allow the coupling of the fan chassis 502 to the networking device 200 as described below.

In the illustrated embodiment, the fan chassis 502 is configured to support five fan modules 504 that may be provided by fan modules like those described by the inventors of the present disclosure in U.S. patent application Ser. No. 18/479,235, filed Oct. 2, 2023, the disclosure of which is incorporated by reference herein in its entirety, as well as any other fan modules that would be apparent to one of skill in the art in possession of the present disclosure. As described in U.S. patent application Ser. No. 18/600,978, filed Mar. 11, 2024, the fan chassis 502 may include a fan coupling subsystem that includes respective fan slots that are located adjacent a rear edge of the fan chassis 502 and that may include any of a variety of fan module coupling features that are configured to couple the fan modules 504 to the fan chassis 502 as illustrated in FIGS. 5A and 5B below, respective fan module connectors for each fan module 504 (illustrated in FIG. 5B) it is configured to support, and/or any other fan module couplings that would be apparent to one of skill in the art in possession of the present disclosure. The fan chassis 502 is also provided with fan controller connectors 506*a* and 506*b* that are each coupled to a subset of the fan modules 504 (e.g., with the fan controller connector 506*a* coupled to two of the fan modules 504 and the fan controller connector 506*b* coupled to three of the fan modules 504 via the fan module connectors illustrated in FIG. 5B), and that may each be configured to aggregate signals received from fan modules 504 (i.e., via the fan module connectors), split signals received for fan modules 504 (i.e., via the fan module connectors), and/or perform any other signal transmission operations that would be apparent to one of skill in the art in possession of the present disclosure.

As illustrated, a compute subsystem 508 may be mounted to the fan chassis 502. For example, the compute subsystem 508 may include a circuit board 510 that, as can be seen in FIG. 5B, may be mounted to the fan chassis 502 via a plurality of stand-offs 512 (i.e., with the two stand-offs 512 visible in FIG. 5B engaging the circuit board 510 adjacent its corners along a common edge, as well as two stand-offs that are not visible in FIG. 5B but that may engage the circuit board 510 opposite the circuit board 510 from the visible stand-offs 512 and adjacent its corners along a common opposing edge) in order to provide the circuit board 510 in a spaced-apart orientation along a Z-axis from the adjacent surface of the fan chassis 502 in order to, for example, provide additional thermal cooling for the compute subsystem 508 by allowing airflow from fan modules 504 to move past opposing surfaces (e.g., the top and bottom surfaces in FIG. 5B) of the circuit board 510.

As will be appreciated by one of skill in the art in possession of the present disclosure, the compute subsystem 508 may include any of a variety of compute components. For example, in the embodiment illustrated in FIG. 5B and discussed below, the compute subsystem 508 includes a primary processing system provided by a Central Processing Unit (CPU) 508*a* that is coupled to storage devices provided by a Serial Peripheral Interface (SPI) flash storage device 508*b* and a Solid State Drive (SSD) storage device 508*c*, memory devices provided by Dynamic Random Access Memory (DRAM) device(s) 508*d* and an Electronically Erasable Programmable Read-Only Memory (EEPROM) device 508*e*, a security device provided by a Trusted Platform Module (TPM) device 508*f*, and a secondary processing device provided by a Complex Programmable Logic Device (CPLD) 508*g*.

However, while specific processing devices, storage devices, memory devices, and security devices are illustrated and described herein, one of skill in the art in possession of the present disclosure will appreciate how the compute subsystem 508 may include any of a variety of processing devices, storage devices, memory devices, security devices, and/or other devices based on the compute functionality required from the compute subsystem 508 for any particular COFTA application. As described below, the compute subsystem 508 may be configured to provide either a networking processing system/networking software management operating system or a networking software/non-networking component management operating system when used in different embodiments of the modular COFTA-based networking device system of the present disclosure.

As can be seen in FIGS. 5A and 5B, the compute subsystem 508 includes networking device connectors 514*a* and 514*b* that, in the illustrated example, are coupled to the CPU 508*a*. As described in U.S. patent application Ser. No. 18/600,978, filed Mar. 11, 2024, the compute subsystem 508 may be an adaptation of a Compute-On-Module (COM) Express device that includes a modified connector, and thus may be provided with a COM Express form-factor with the exception of that modified connector. For example, each of the networking device connectors 514*a* and 514*b* may be configured similarly to a COM Express device connector, with the exception that the networking device connectors 514*a* and 514*b* are oriented, and configured to connect along, an X-axis (i.e., the axis parallel to the circuit board 510 and the fan chassis 502) rather than an Z-axis (i.e., the axis perpendicular to the circuit board 510 and the fan chassis 502) that conventional COM Express device connectors are oriented and configured to connect along. However, while a specific compute subsystem and networking device connector are illustrated and described, one of skill in the art in possession of the present disclosure will appreciate how other compute subsystems and networking device connectors will fall within the scope of the present disclosure as well.

Figure 6B:
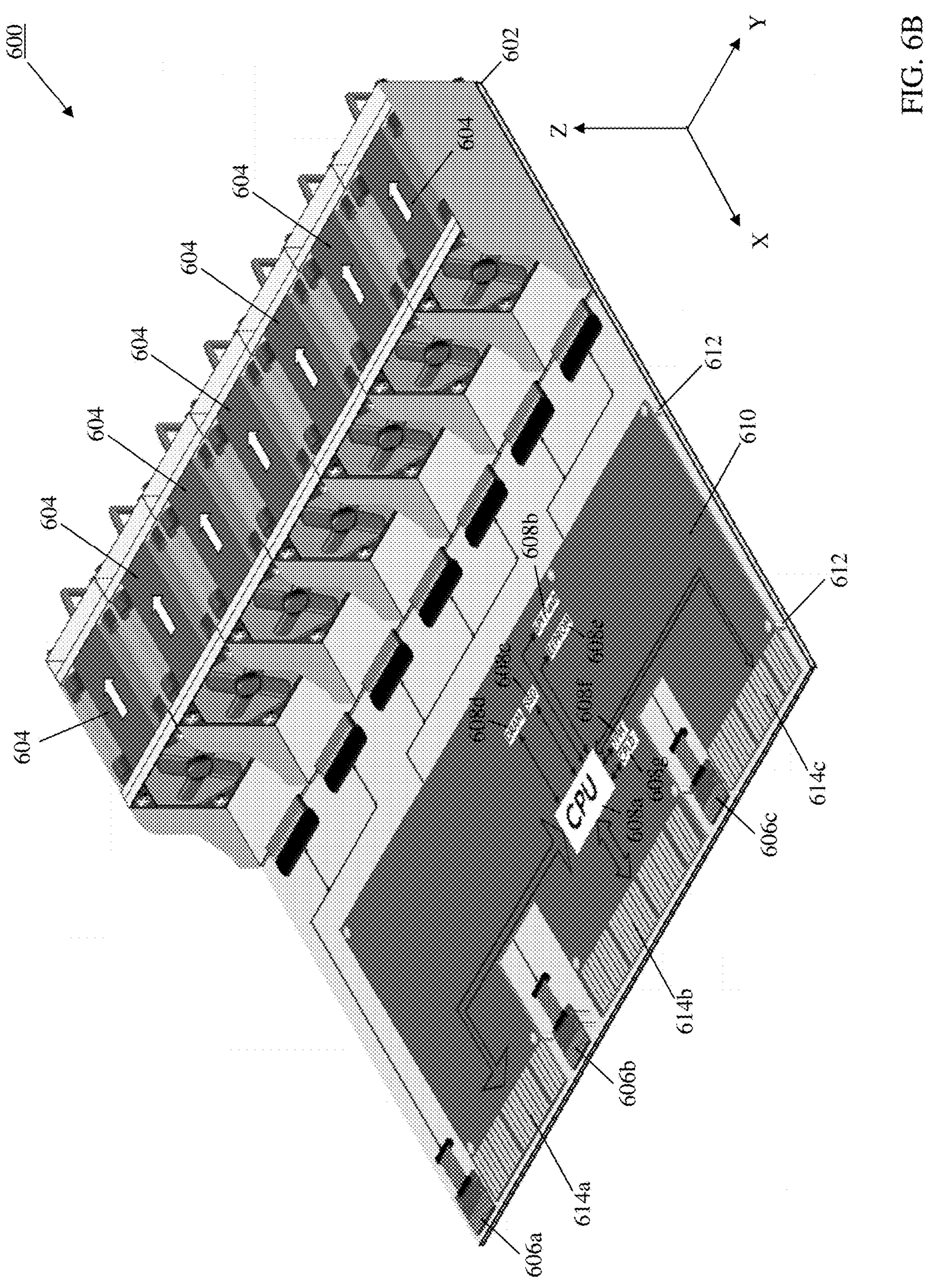
FIG. 6B is a perspective view illustrating an embodiment of the COFTA system of FIG. 6A.

Referring now to FIGS. 6A and 6B, an embodiment of a COFTA system 600 is illustrated that may be used with the networking device 200. As discussed above, embodiments of COFTA systems were described by the inventors of the present disclosure in U.S. patent application Ser. No. 18/600,978, filed Mar. 11, 2024, the disclosure of which is incorporated by reference herein in its entirety. The COFTA system 600 includes a fan chassis 602 that supports the components of the COFTA system 600. As will be appreciated by one of skill in the art in possession of the present disclosure, the fan chassis 602 of the COFTA system 4500 may be considered a "fan tray assembly" that is configured support one or more fan modules, as well as configured to be positioned in the networking device 200 to couple those fan module(s) to the networking device 200 in order to allow those fan modules to be used to provide cooling for the networking device 200. As such, the fan chassis 602 may include any of a variety of device coupling features that one of skill in the art in possession of the present disclosure would appreciate allow the coupling of the fan chassis 602 to the networking device 200 as described below.

In the illustrated embodiment, the fan chassis 602 is configured to support seven fan modules 604 that may be provided by fan modules like those described by the inventors of the present disclosure in U.S. patent application Ser. No. 18/479,235, filed Oct. 2, 2023, the disclosure of which is incorporated by reference herein in its entirety, as well as any other fan modules that would be apparent to one of skill in the art in possession of the present disclosure. As described in U.S. patent application Ser. No. 18/600,978, filed Mar. 11, 2024, the fan chassis 602 may include a fan coupling subsystem that includes respective fan slots that are located adjacent a rear edge of the fan chassis 602 and that may include any of a variety of fan module coupling features that are configured to couple the fan modules 604 to the fan chassis 602 as illustrated in FIGS. 6A and 6B below, respective fan module connectors for each fan module 604 (illustrated in FIG. 6B) it is configured to support, and/or any other fan module couplings that would be apparent to one of skill in the art in possession of the present disclosure. The fan chassis 602 is also provided with fan controller connectors 606*a*, 606*b*, and 606*c* that are each coupled to a subset of the fan modules 604 (e.g., with the fan controller connector 606*a* coupled to two of the fan modules 604, the fan controller connector 606*b* coupled to three of the fan modules 604, and the fan controller connector 606*c* coupled to two of the fan modules 604 via the fan module connectors illustrated in FIG. 6B), and that may each be configured to aggregate signals received from fan modules 604 (i.e., via the fan module connectors), split signals received for fan modules 604 (i.e., via the fan module connectors), and/or perform any other signal transmission operations that would be apparent to one of skill in the art in possession of the present disclosure.

As illustrated, a compute subsystem 608 may be mounted to the fan chassis 602. For example, the compute subsystem 608 may include a circuit board 610 that, as can be seen in FIG. 6B, may be mounted to the fan chassis 602 via a plurality of stand-offs 612 (i.e., with the two stand-offs 612 visible in FIG. 6B engaging the circuit board 610 adjacent its corners along a common edge, as well as two stand-offs that are not visible in FIG. 6B but that may engage the circuit board 610 opposite the circuit board 610 from the visible stand-offs 612 and adjacent its corners along a common opposing edge) in order to provide the circuit board 610 in a spaced-apart orientation along a Z-axis from the adjacent surface of the fan chassis 602 in order to, for example, provide additional thermal cooling for the compute subsystem 608 by allowing airflow from fan modules 604 to move past opposing surfaces (e.g., the top and bottom surfaces in FIG. 6B) of the circuit board 610.

As will be appreciated by one of skill in the art in possession of the present disclosure, the compute subsystem 608 may include any of a variety of compute components. For example, in the embodiment illustrated in FIG. 6B and discussed below, the compute subsystem 608 includes a primary processing system provided by a Central Processing Unit (CPU) 608*a* that is coupled to storage devices provided by a Serial Peripheral Interface (SPI) flash storage device 608*b* and a Solid State Drive (SSD) storage device 608*c*, memory devices provided by Dynamic Random Access Memory (DRAM) device(s) 608*d* and an Electronically Erasable Programmable Read-Only Memory (EEPROM) device 608*e*, a security device provided by a Trusted Platform Module (TPM) device 608*f*, and a secondary processing device provided by a Complex Programmable Logic Device (CPLD) 608*g*.

However, while specific processing devices, storage devices, memory devices, and security devices are illustrated and described herein, one of skill in the art in possession of the present disclosure will appreciate how the compute subsystem 608 may include any of a variety of processing devices, storage devices, memory devices, security devices, and/or other devices based on the compute functionality required from the compute subsystem 508 for any particular COFTA application. As described below, the compute subsystem 608 may be configured to provide the networking processing system/networking software/non-networking component management operating system when used in an embodiment of the modular COFTA-based networking device system of the present disclosure.

As can be seen in FIGS. 6A and 6B, the compute subsystem 608 includes networking device connectors 614*a*, 614*b*, and 614*c* that, in the illustrated example, are coupled to the CPU 608*a*. As described in U.S. patent application Ser. No. 18/600,978, filed Mar. 11, 2024, the compute subsystem 608 may be an adaptation of a Compute-On-Module (COM) Express device that includes a modified connector, and thus may be provided with a COM Express form-factor with the exception of that modified connector. For example, each of the networking device connectors 614*a*, 614*b*, and 614*c* may be configured similarly to a COM Express device connector, with the exception that the networking device connectors 614*a*. 614*b*. and 614*c* are oriented, and configured to connect along, an X-axis (i.e., the axis parallel to the circuit board 610 and the fan chassis 602) rather than an Z-axis (i.e., the axis perpendicular to the circuit board 610 and the fan chassis 602) that conventional COM Express device connectors are oriented and configured to connect along. However, while a specific compute subsystem and networking device connector are illustrated and described, one of skill in the art in possession of the present disclosure will appreciate how other compute subsystems and networking device connectors will fall within the scope of the present disclosure as well.

As described below, the COFTA systems 300, 400, and 500 discussed above may be utilized with the networking device 200 in different combinations to configure the modular COFTA-based networking device of the present disclosure with different management operating systems, while the COFTA system 600 may be utilized with the networking device 200 when a single management operating system is desired. However, while specific COFTA systems are illustrated and described herein as being used with a specific networking device, one of skill in the art in possession of the present disclosure will appreciate how the teachings of the present disclosure may be applied to other networking device configurations using other COFTA system configurations while remaining within the scope of the present disclosure as well.

Referring now to FIG. 7, an embodiment of a method 700 for providing a modular Computer-On-Fan-Tray-Assembly (COFTA)-based networking device is illustrated. As discussed below, the systems and methods of the present disclosure utilize COFTA systems as modular components in a networking device that are each configured to provide a respective operating system to manage different subsets of a networking processing system in the networking device, non-networking components in the networking device, and networking software used by the networking device. For example, the modular COFTA networking device system of the present disclosure may include a networking device chassis housing a circuit board coupled to a plurality of non-networking components and including: a networking processing system coupled to networking ports that are accessible on the networking device chassis, a networking processing system management connector coupled to the networking processing system, a non-networking component management connector coupled to the non-networking components, and a networking software management connector. At least two COFTA systems are each connected to a different subset of the networking processing system management connector, the non-networking component management connector, and the networking software management connector. Each COFTA system provides a respective operating system that manages a different subset of the networking processing system via the networking processing system management connector, the plurality of non-networking components via the non-networking component management connector, and networking software via the networking software management connector. As such, different networking device management functionality for the networking device may be performed by dedicated operating systems, reducing or eliminating the issues with managing conventional networking devices discussed above.

The method 700 begins at block 702 where COFTA systems are connected to different subsets of COFTA system connectors in a networking device management connector system on a networking device. In a first embodiment of the method 700, at block 702, a first of the COFTA system 300 discussed above with reference to FIGS. 3A and 3B provides a networking processing system management COFTA system, the COFTA system 400 discussed above with reference to FIGS. 4A and 4B provides a networking software management COFTA system, and a second of the COFTA system 300 discussed above with reference to FIGS. 3A and 3B provides a non-networking component management COFTA system, each of which are coupled to the networking device management connector system on the circuit board 204 of the networking device 200. While not illustrated or described in detail, one of skill in the art in possession of the present disclosure will appreciate how the COFTA systems 300 and 400 and the networking device management connector system on the circuit board 204 of the networking device 200 may be keyed to only allow the first COFTA system 300 to be connected to the COFTA system connector 210, to only allow the COFTA system 400 to be connected to the COFTA system connector 212, and to only all the second COFTA system 300 to be connected to the COFTA system connector 214.

Figure 8A:
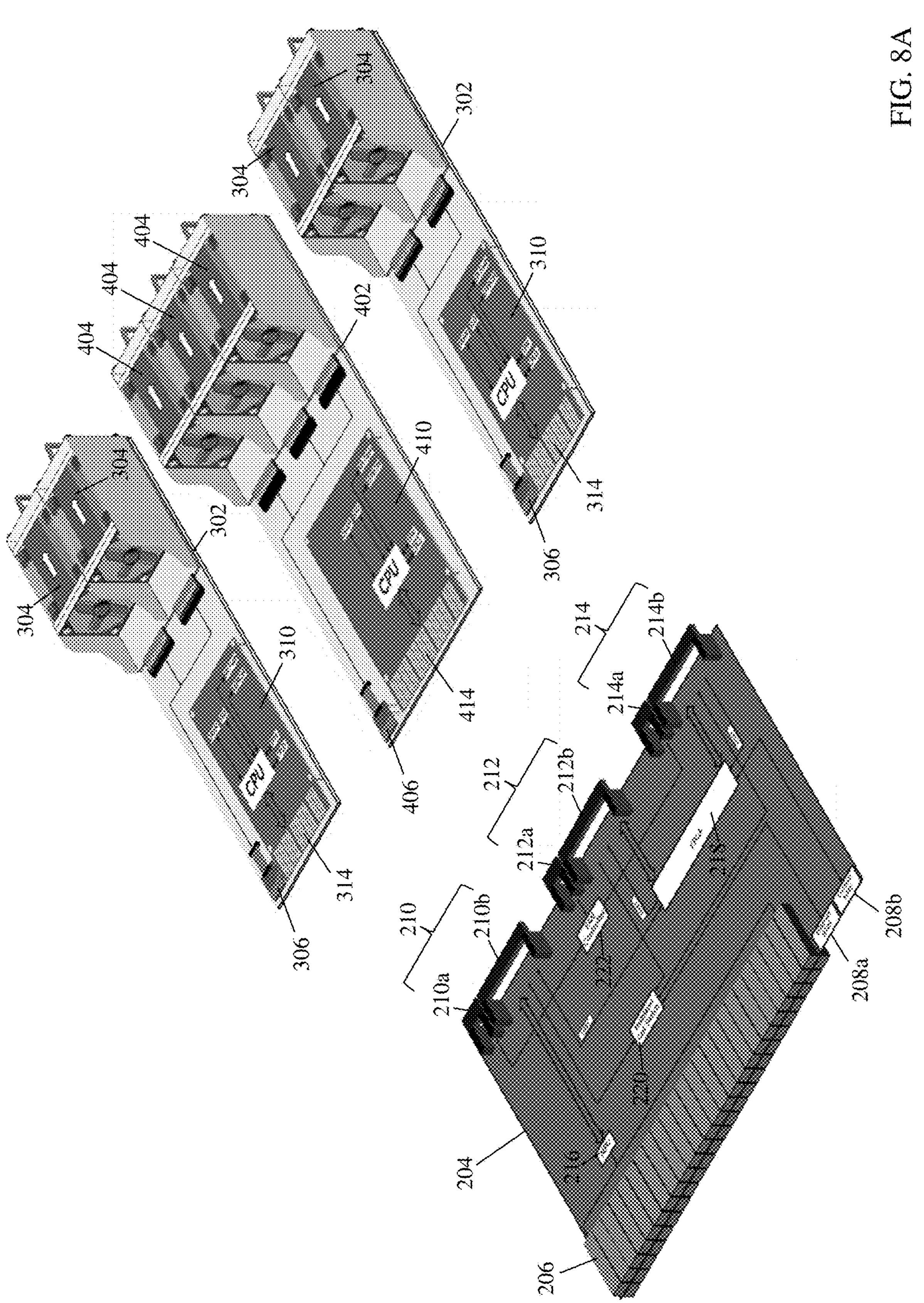
FIG. 8A is a perspective view illustrating an embodiment of a pair of the COFTA systems of FIGS. 3A and 3B, and the COFTA system of FIGS. 4A and 4B, being coupled to the networking device of FIGS. 2A and 2B during the method of FIG. 7.
Figure 8B:
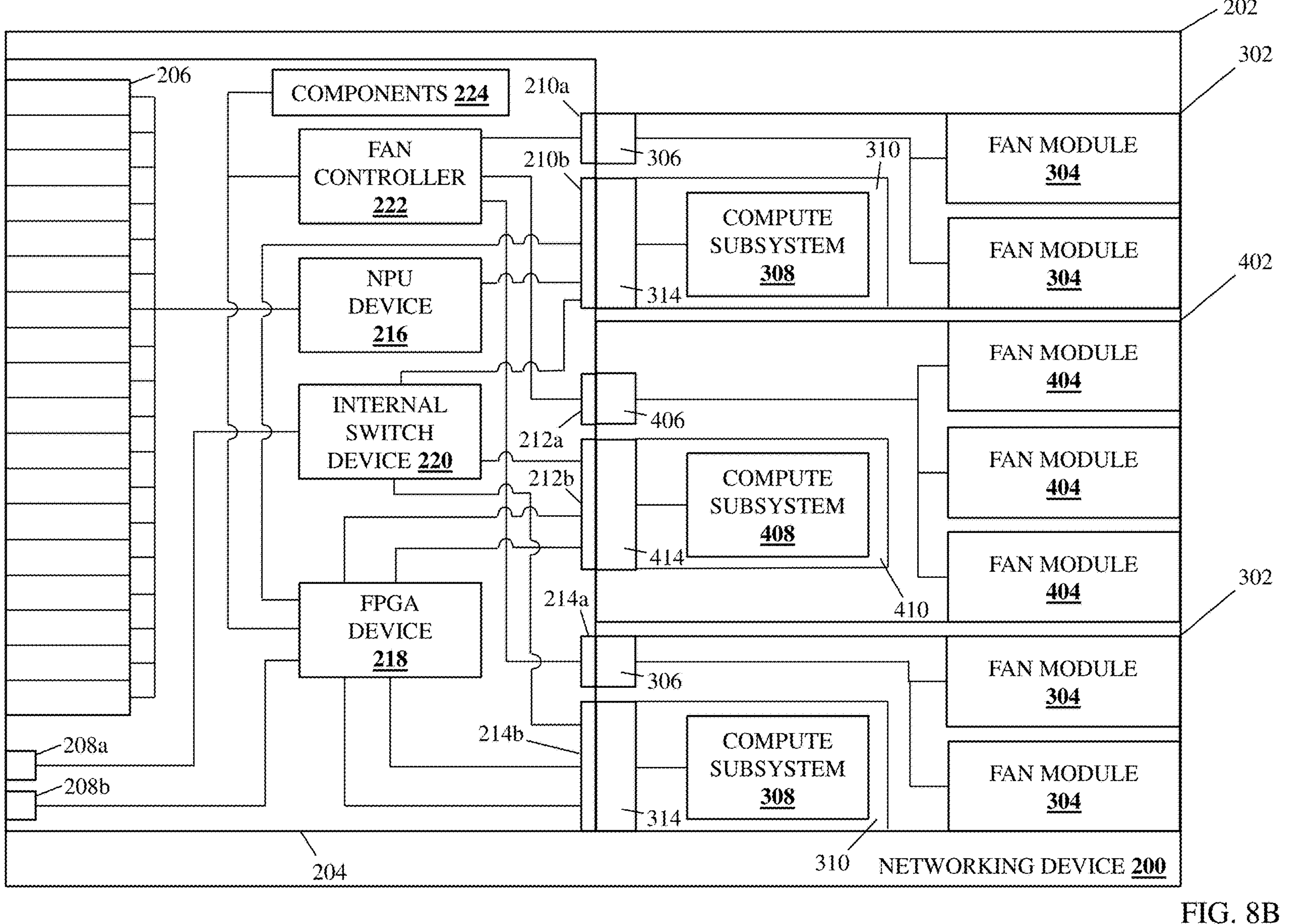
FIG. 8B is a schematic view illustrating an embodiment of the pair of the COFTA systems of FIGS. 3A and 3B, and the COFTA system of FIGS. 4A and 4B, coupled to the networking device of FIGS. 2A and 2B to provide a modular COFTA-based networking device system during the method of FIG. 7.

As illustrated in FIGS. 8A and 8B, the first COFTA system 300 may be positioned adjacent the COFTA system connector 210 on the circuit board 204 of the networking device 200 (e.g., by positioned the first COFTA system 300 in a COFTA system housing defined by the networking device chassis 200 adjacent the COFTA system connector 210), and the first COFTA system 300 may then be moved towards the circuit board 204 such that the fan controller connector 306 on the first COFTA system 300 engages the COFTA fan subsystem connector 210*a* on the COFTA system connector 210, and the networking device connector 314 on the first COFTA system 300 engages the COFTA compute subsystem connector 210*b* on the COFTA system connector 210.

As also illustrated in FIGS. 8A and 8B, the COFTA system 400 may be positioned adjacent the COFTA system connector 212 on the circuit board 204 of the networking device 200 (e.g., by positioned the first COFTA system 400 in a COFTA system housing defined by the networking device chassis 200 adjacent the COFTA system connector 212), and the COFTA system 400 may then be moved towards the circuit board 204 such that the fan controller connector 406 on the COFTA system 400 engages the COFTA fan subsystem connector 212*a* on the COFTA system connector 212, and the networking device connector 414 on the COFTA system 400 engages the COFTA compute subsystem connector 212*b* on the COFTA system connector 212.

As also illustrated in FIGS. 8A and 8B, the second COFTA system 300 may be positioned adjacent the COFTA system connector 214 on the circuit board 204 of the networking device 200 (e.g., by positioned the second COFTA system 300 in a COFTA system housing defined by the networking device chassis 200 adjacent the COFTA system connector 214), and the second COFTA system 300 may then be moved towards the circuit board 204 such that the fan controller connector 306 on the second COFTA system 300 engages the COFTA fan subsystem connector 214*a* on the COFTA system connector 214, and the networking device connector 314 on the second COFTA system 300 engages the COFTA compute subsystem connector 214*b* on the COFTA system connector 214.

In a second embodiment of the method 700, at block 702 the COFTA system 500 discussed above with reference to FIGS. 5A and 5B provides a networking processing system/networking software management COFTA system, and the COFTA system 300 discussed above with reference to FIGS. 3A and 3B provides a non-networking component management COFTA system, each of which are coupled to the networking device management connector system on the circuit board 204 of the networking device 200. While not illustrated or described in detail, one of skill in the art in possession of the present disclosure will appreciate how the COFTA systems 500 and 300 and the networking device management connector system on the circuit board 204 of the networking device 200 may be keyed to only allow the COFTA system 500 to be connected to the COFTA system connectors 210 and 212, and to only allow the COFTA system 300 to be connected to the COFTA system connector 214.

Figure 9A:
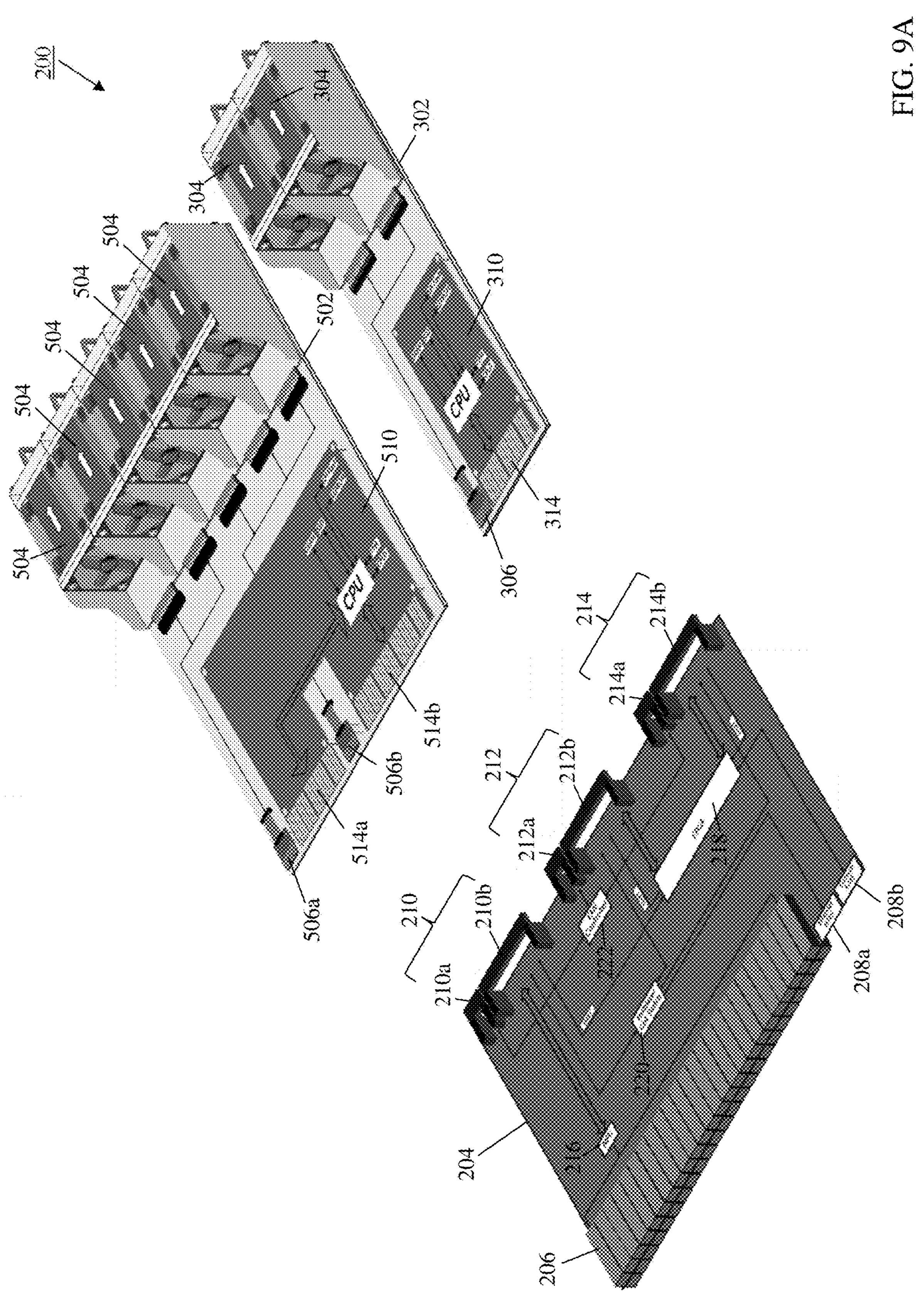
FIG. 9A is a perspective view illustrating an embodiment of the COFTA systems of FIGS. 5A and 5B, and the COFTA system of FIGS. A and 4B, 3 being coupled to the networking device of FIGS. 2A and 2B during the method of FIG. 7.
Figure 9B:
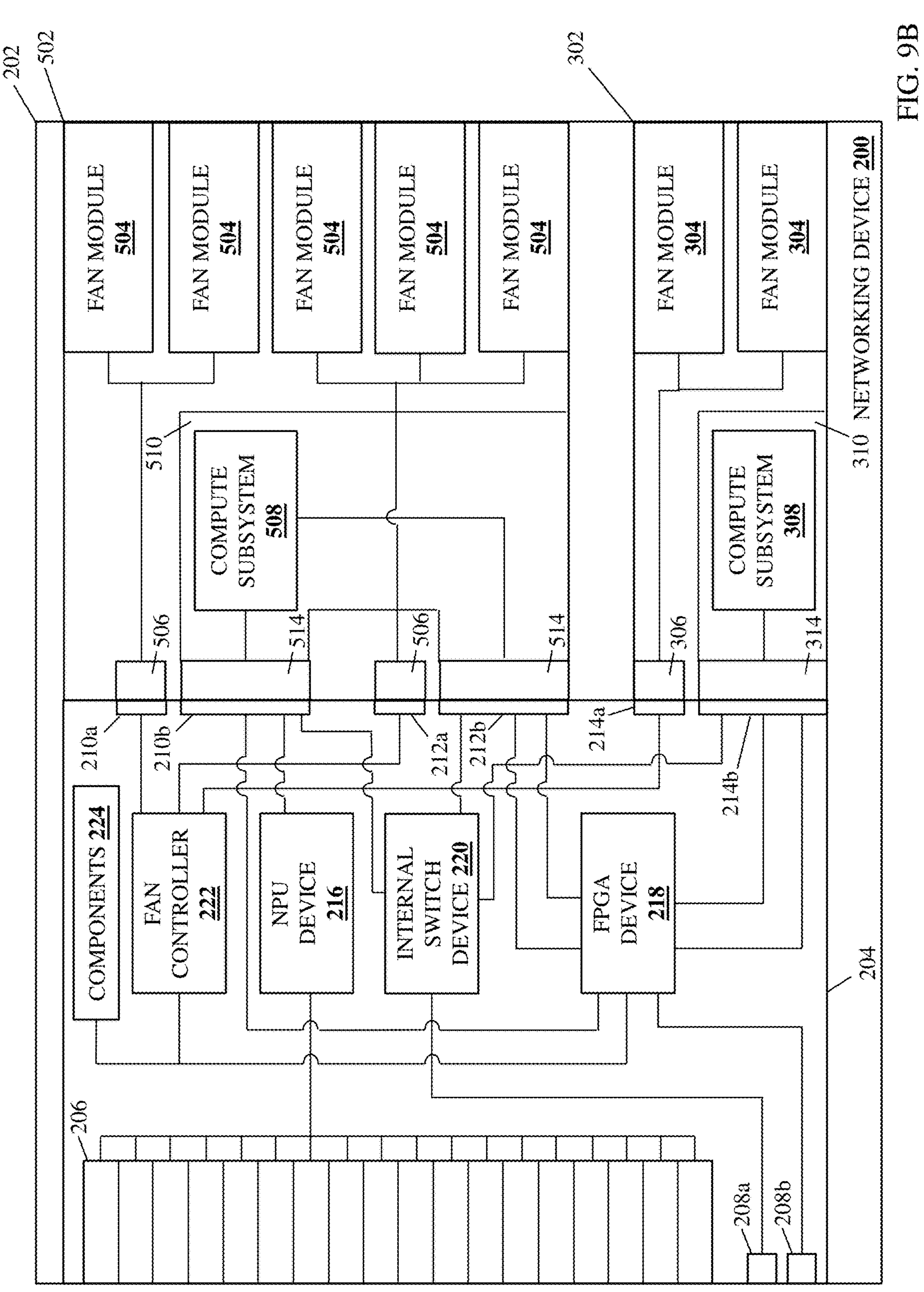
FIG. 9B is a schematic view illustrating an embodiment of the COFTA systems of FIGS. 5A and 5B, and the COFTA system of FIGS. 3A and 3B, coupled to the networking device of FIGS. 2A and 2B to provide a modular COFTA-based networking device system during the method of FIG. 7.

As illustrated in FIGS. 9A and 9B, the COFTA system 500 may be positioned adjacent the COFTA system connectors 210 and 212 on the circuit board 204 of the networking device 200 (e.g., by positioned the COFTA system 500 in a COFTA system housing defined by the networking device chassis 200 adjacent the COFTA system connectors 210 and 212), and the COFTA system 500 may then be moved towards the circuit board 204 such that the fan controller connectors 506*a* and 506*b* on the COFTA system 500 engage the COFTA fan subsystem connectors 210*a* and 212*a*, respectively, on the COFTA system connectors 210 and 212, respectively, and the networking device connectors 514*a* and 514*b* on the COFTA system 500 engage the COFTA compute subsystem connectors 210*b* and 212*b*, respectively, on the COFTA system connectors 210 and 212, respectively.

As also illustrated in FIGS. 9A and 9B, the COFTA system 300 may be positioned adjacent the COFTA system connector 214 on the circuit board 204 of the networking device 200 (e.g., by positioning the COFTA system 300 in a COFTA system housing defined by the networking device chassis 200 adjacent the COFTA system connector 214), and the COFTA system 300 may then be moved towards the circuit board 204 such that the fan controller connector 306 on the COFTA system 300 engages the COFTA fan subsystem connector 214*a* on the COFTA system connector 214, and the networking device connector 314 on the COFTA system 300 engages the COFTA compute subsystem connector 214*b* on the COFTA system connector 214.

In a third embodiment of the method 700, at block 702 the COFTA system 300 discussed above with reference to FIGS. 3A and 3B provides a networking processing system management COFTA system, and the COFTA system 500 discussed above with reference to FIGS. 5A and 5B provides a networking software/non-networking component management COFTA system, each of which are coupled to the networking device management connector system on the circuit board 204 of the networking device 200. While not illustrated or described in detail, one of skill in the art in possession of the present disclosure will appreciate how the COFTA systems 300 and 500 and the networking device management connector system on the circuit board 204 of the networking device 200 may be keyed to only allow the COFTA system 300 to be connected to the COFTA system connector 210, and to only allow the COFTA system 500 to be connected to the COFTA system connectors 212 and 214.

Figure 10A:
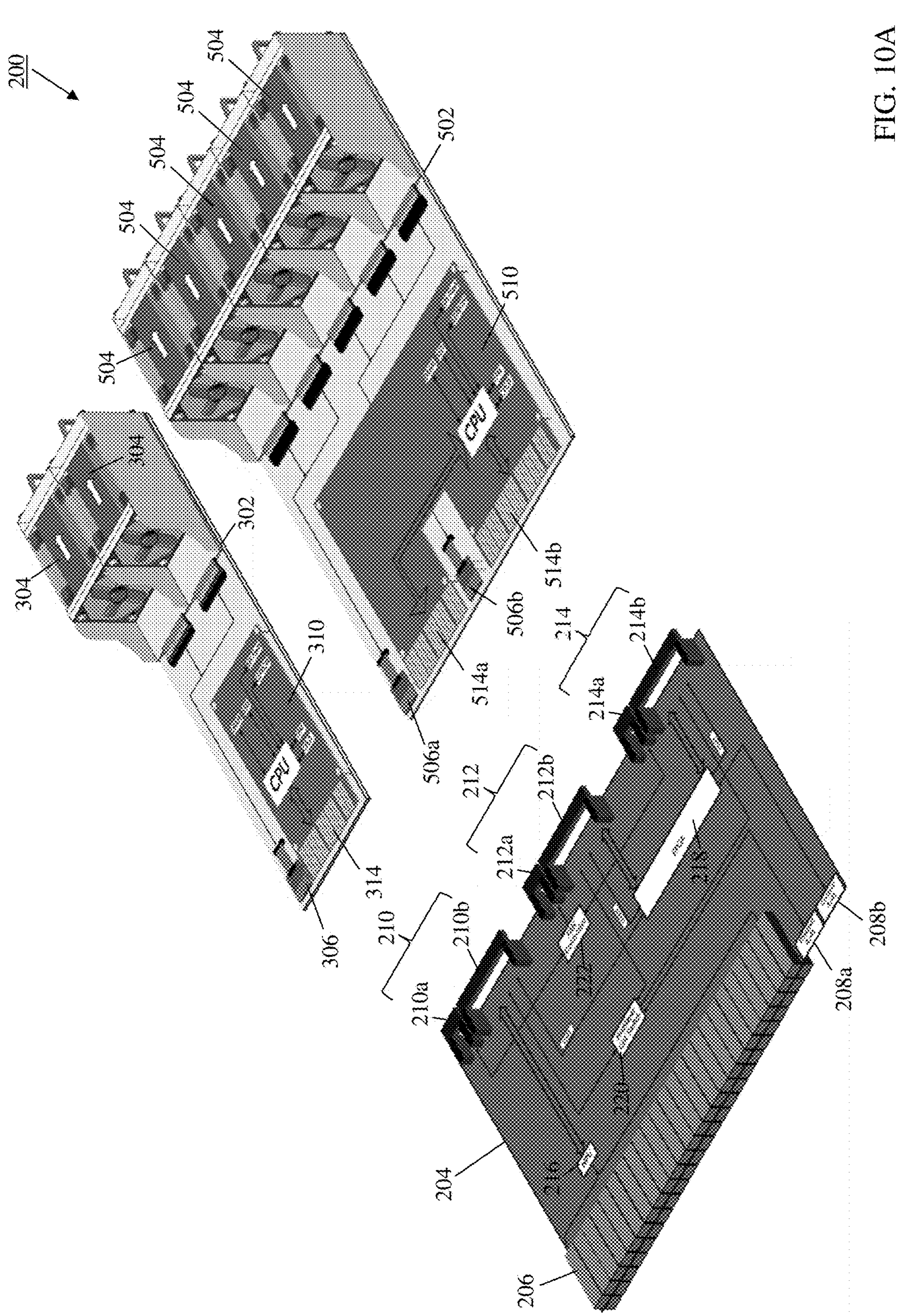
FIG. 10A is a perspective view illustrating an embodiment of the COFTA system of FIGS. 3A and 3B, and the COFTA system of FIGS. 5A and 5B, being coupled to the networking device of FIGS. 2A and 2B during the method of FIG. 7.
Figure 10B:
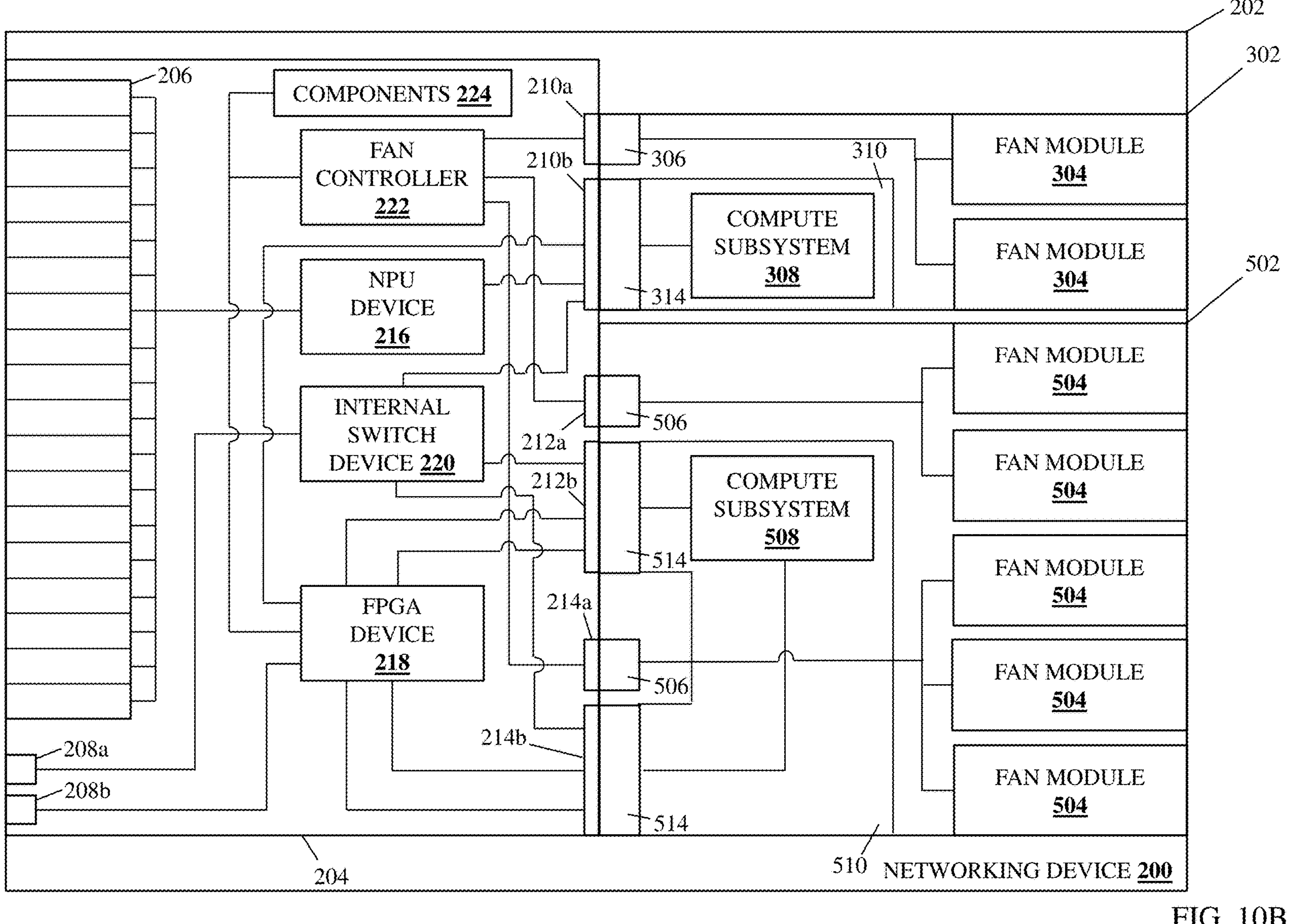
FIG. 10B is a schematic view illustrating an embodiment of the COFTA system of FIGS. 3A and 3B, and the COFTA system of FIGS. 5A and 5B, coupled to the networking device of FIGS. 2A and 2B during the method of FIG. 7.

As illustrated in FIGS. 10A and 10B, the COFTA system 300 may be positioned adjacent the COFTA system connector 210 on the circuit board 204 of the networking device 200 (e.g., by positioning the COFTA system 300 in a COFTA system housing defined by the networking device chassis 200 adjacent the COFTA system connector 210), and the COFTA system 300 may then be moved towards the circuit board 204 such that the fan controller connector 306 on the COFTA system 300 engages the COFTA fan subsystem connector 210*a* on the COFTA system connector 210, and the networking device connector 314 on the COFTA system 300 engages the COFTA compute subsystem connector 210*b* on the COFTA system connector 210.

As also illustrated in FIGS. 10A and 10B, the COFTA system 500 may be positioned adjacent the COFTA system connectors 212 and 214 on the circuit board 204 of the networking device 200 (e.g., by positioned the COFTA system 500 in a COFTA system housing defined by the networking device chassis 200 adjacent the COFTA system connectors 212 and 214), and the COFTA system 500 may then be moved towards the circuit board 204 such that the fan controller connectors 506*a* and 506*b* on the COFTA system 500 engage the COFTA fan subsystem connectors 212*a* and 214*a*, respectively, on the COFTA system connectors 212 and 214, respectively, and the networking device connectors 514*a* and 514*b* on the COFTA system 500 engage the COFTA compute subsystem connectors 212*b* and 214*b*, respectively, on the COFTA system connectors 212 and 214, respectively.

The method 700 then proceeds to block 704 where the COFTA systems provide respective operating systems. Continuing with the first embodiment of the method 700 introduced with reference to FIGS. 8A and 8B above, at block 704 the first of the COFTA system 300 discussed above with reference to FIGS. 3A and 3B that provides the networking processing system management COFTA system in this embodiment may operate to provide a networking processing system management operating system, the COFTA system 400 discussed above with reference to FIGS. 4A and 4B that provides the networking software management COFTA system in this embodiment may operate to provide a networking software management operating system, and the second of the COFTA system 300 discussed above with reference to FIGS. 3A and 3B that provides the non-networking component management COFTA system in this embodiment may operate to provide a non-networking component management operating system.

For example, the compute subsystem 308 in the first COFTA system 300 that is connected to the COFTA system connector 210 may have previously been configured to provide the networking processing system management operating system, and one of skill in the art in possession of the present disclosure will appreciate how that compute subsystem 308 may power on, boot, reset, reboot, and or otherwise initialize in order to enter a runtime state in which it provides the networking processing system management operating system. Similarly, the compute subsystem 408 in the COFTA system 400 that is connected to the COFTA system connector 212 may have previously been configured to provide the networking software management operating system, and one of skill in the art in possession of the present disclosure will appreciate how that compute subsystem 408 may power on, boot, reset, reboot, and or otherwise initialize in order to enter a runtime state in which it provides the networking software management operating system. Similarly as well, the compute subsystem 308 in the second COFTA system 300 that is connected to the COFTA system connector 214 may have previously been configured to provide the non-networking component management operating system, and one of skill in the art in possession of the present disclosure will appreciate how that compute subsystem 308 may power on, boot, reset, reboot, and or otherwise initialize in order to enter a runtime state in which it provides the non-networking component management operating system.

Continuing with the second embodiment of the method 700 introduced with reference to FIGS. 9A and 9B above, at block 704 the COFTA system 500 discussed above with reference to FIGS. 5A and 5B that provides the networking processing system/networking software management COFTA system in this embodiment may operate to provide a networking processing system/networking software management operating system, and the COFTA system 300 discussed above with reference to FIGS. 3A and 3B that provides the non-networking component management COFTA system in this embodiment may operate to provide a non-networking component management operating system.

For example, the compute subsystem 508 in the COFTA system 500 that is connected to the COFTA system connectors 210 and 212 may have previously been configured to provide the networking processing system/networking software management operating system, and one of skill in the art in possession of the present disclosure will appreciate how that compute subsystem 508 may power on, boot, reset, reboot, and or otherwise initialize in order to enter a runtime state in which it provides the networking processing system/networking software management operating system. Similarly, the compute subsystem 308 in the COFTA system 300 that is connected to the COFTA system connector 214 may have previously been configured to provide the non-networking component management operating system, and one of skill in the art in possession of the present disclosure will appreciate how that compute subsystem 308 may power on, boot, reset, reboot, and or otherwise initialize in order to enter a runtime state in which it provides the non-networking component management operating system.

Continuing with the third embodiment of the method 700 introduced with reference to FIGS. 10A and 10B above, at block 704 the COFTA system 300 discussed above with reference to FIGS. 3A and 3B that provides the networking processing system management COFTA system in this embodiment may operate to provide a networking processing system management operating system, and the COFTA system 500 discussed above with reference to FIGS. 5A and 5B that provides the networking software/non-networking component management COFTA system in this embodiment may operate to provide a networking software/non-networking component management operating system.

For example, the compute subsystem 308 in the COFTA system 300 that is connected to the COFTA system connector 210 may have previously been configured to provide the networking processing system management operating system, and one of skill in the art in possession of the present disclosure will appreciate how that compute subsystem 308 may power on, boot, reset, reboot, and or otherwise initialize in order to enter a runtime state in which it provides the networking processing system management operating system. Similarly, the compute subsystem 508 in the COFTA system 500 that is connected to the COFTA system connectors 212 and 214 may have previously been configured to provide the networking software/non-networking component management operating system, and one of skill in the art in possession of the present disclosure will appreciate how that compute subsystem 508 may power on, boot, reset, reboot, and or otherwise initialize in order to enter a runtime state in which it provides the networking software/non-networking component management operating system.

The method 700 then proceeds to block 706 where the respective operating systems provided by the COFTA systems manage different subsets of a networking processing system in the networking device, non-networking components in the networking device, and networking software used by the networking device. Continuing with the first embodiment of the method 700 discussed above with reference to FIGS. 8A and 8B, at block 706, the networking processing system management operating system provided by the networking processing system management COFTA system (i.e., the first of the COFTA system 300 discussed above with reference to FIGS. 3A and 3B that is connected to the COFTA system connector 210) may operate to manage the networking processing system (e.g., the NPU device 216 and related component) in the networking device 200, the networking software management operating system provided by the networking software management COFTA system (i.e., the COFTA system 400 discussed above with reference to FIGS. 4A and 4B that is connected to the COFTA system connector 212) may operate to manage the networking software used by the networking device 200 (as well as a subset of the components 224 that interact with that networking software such as, for example, firmware that interacts with the NOS and/or that is otherwise included in a networking software management system, a TPM, a PoE manager or controller, a cryptographic accelerator, a console buffer, etc.)), and the non-networking component management operating system provided by the non-networking component management COFTA system (i.e., the second of the COFTA system 300 discussed above with reference to FIGS. 3A and 3B that is connected to the COFTA system connector 214) may operate to manage the fan controller 222, a subset of the components 224, and/or other non-networking components in the networking device 200.

Figure 8C:
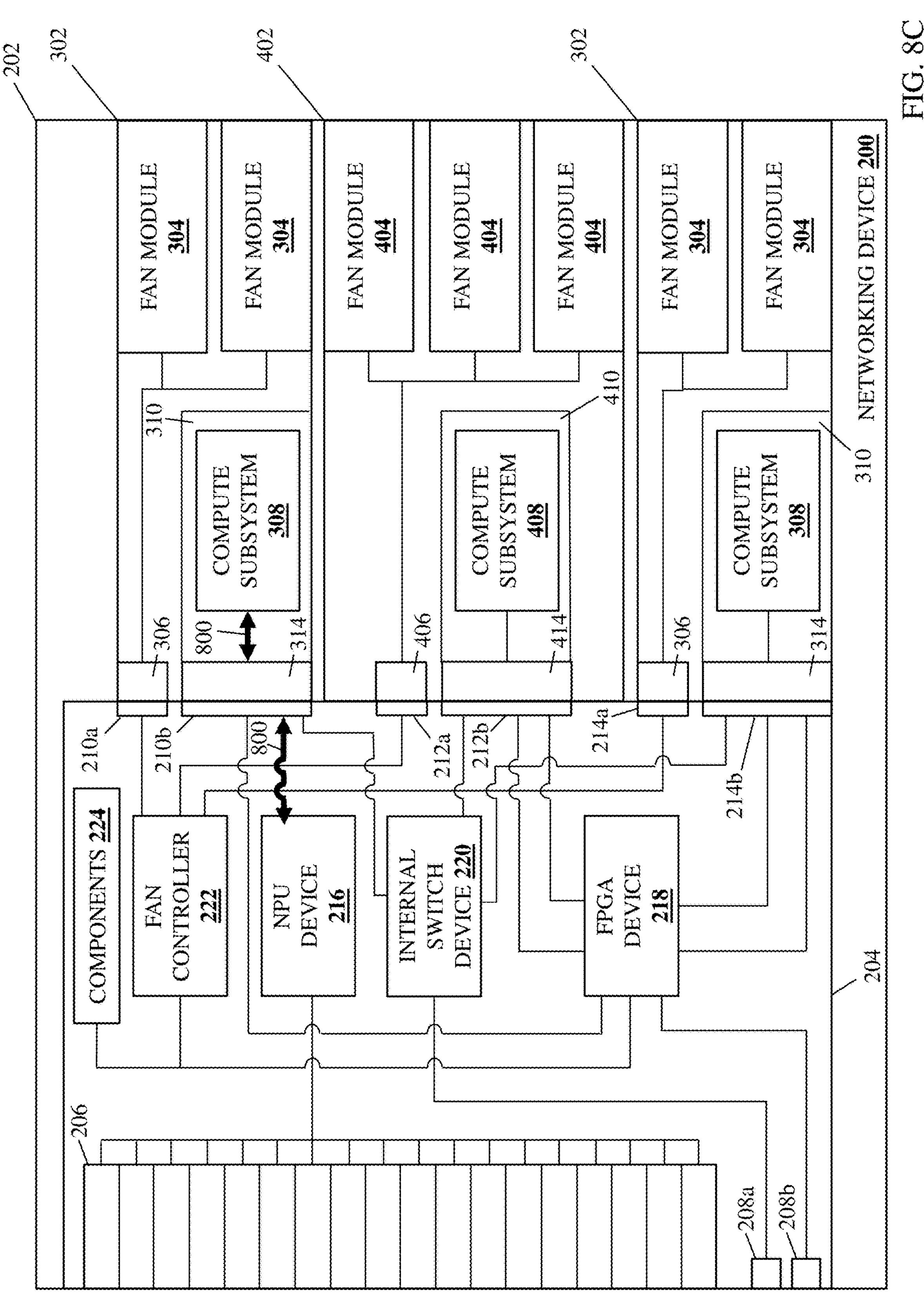
FIG. 8C is a schematic view illustrating an embodiment of the modular COFTA-based networking device system of FIG. 8B operating during the method of FIG. 7.

For example, with reference to FIG. 8C, the networking processing system management operating system provided by the compute subsystem 308 in the first COFTA system 300 discussed above may perform networking processing system management operations 800 that include managing the NPU device 216 (and related components) via the networking device connector 314 and the COFTA compute subsystem connector 210*b*. As will be appreciated by one of skill in the art in possession of the present disclosure, the networking processing system management operations 800 may include any of a variety of management operations related to the NPU device 216 (or switch ASIC), related networking hardware, forwarding tables, telemetry hardware (e.g., NPU device/silicon telemetry hardware), NPU-specific drivers, a Software Development Kit (SDK) accessed via a Switch Abstraction Interface (SAI), firmware and/or other functionality that is relatively tightly coupled to the NPU device 216 (e.g., Precision Time Protocol (PTP) functionality, Synchronous Ethernet (SyncE) functionality, etc.), and/or other networking processing system components that would be apparent to one of skill in the art in possession of the present disclosure.

Figure 8D:
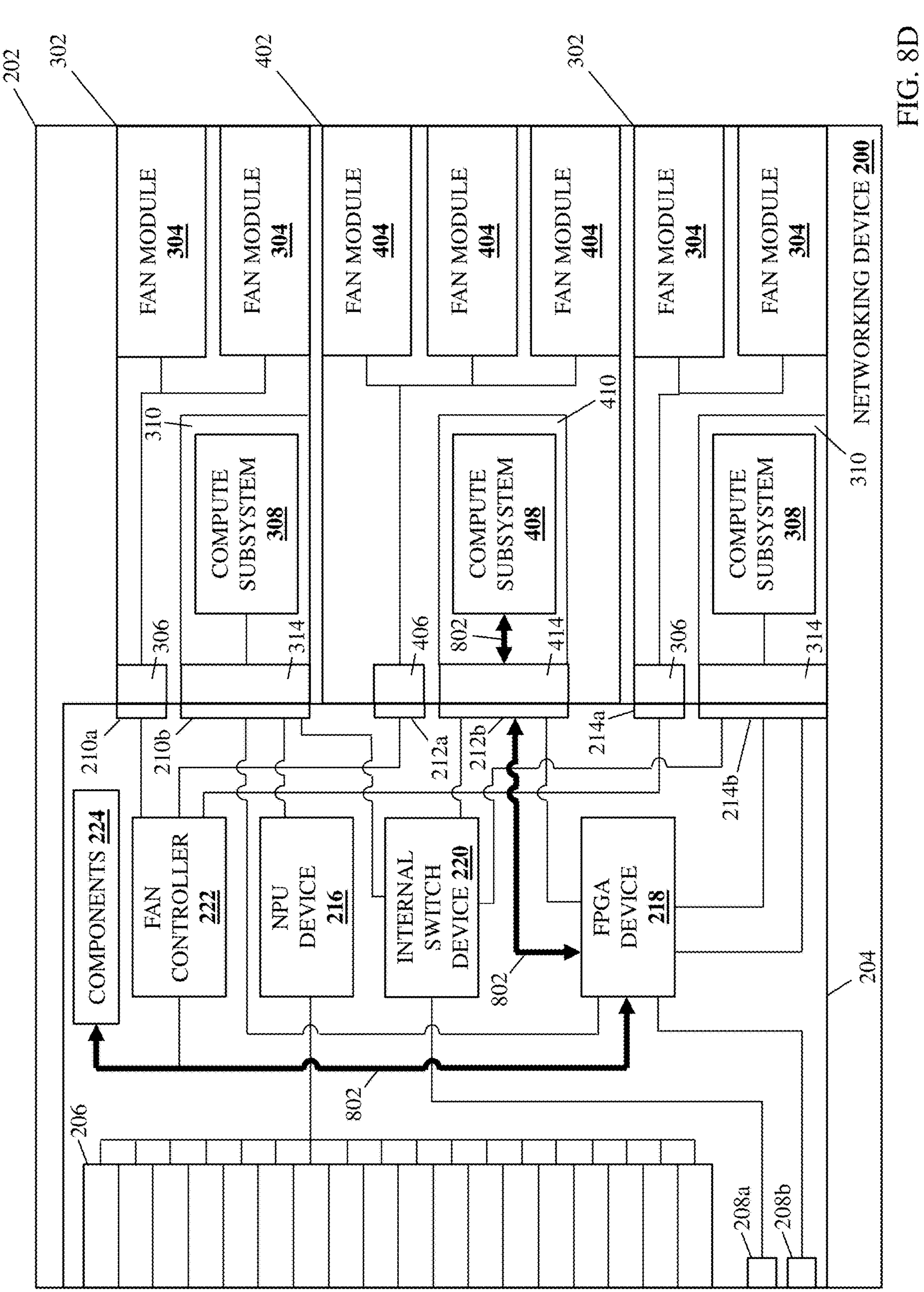
FIG. 8D is a schematic view illustrating an embodiment of the modular COFTA-based networking device system of FIG. 8B operating during the method of FIG. 7

In another example, with reference to FIG. 8D, the networking software management operating system provided by the compute subsystem 408 in the COFTA system 400 discussed above may perform networking software management operations 802 that include managing the networking software used by the networking device 200, which in some examples may include managing the subset of the components 224 that interact with that networking software (e.g., firmware that interacts with the NOS and/or that is otherwise included in a networking software management system, a TPM, a PoE manager or controller, a cryptographic accelerator, a console buffer, etc.) via the networking device connector 414, the COFTA compute subsystem connector 212*b*, and the FPGA device 218. As will be appreciated by one of skill in the art in possession of the present disclosure, the networking software management operations 802 may include any of a variety of management operations related to a Network Operating System (NOS) provided by the compute subsystem 408 for use by the networking device 200, a management framework provided for a user of the networking device 200 (e.g., a Command Line Interface (CLI), programmatic NorthBound Interface (NBI), REpresentational State Transfer (REST), Google Remote Procedure Call (gRPC) Network Management Interface (GNMI), gRPC Network Operations Interface (GNOI), etc.), Layer 2 (L2)/Layer 3 (L3) protocols, operating system images, Zero-Touch Provisioning (ZTP), Authentication Authorization and Accounting (AAA), Network Time Protocol (NTP), Domain Name Service (DNS), Role-Based Access Control (RBAC), Simple Network Management Protocol (SNMP), Dynamic Host Configuration Protocol (DHCP), and/or other networking software components that would be apparent to one of skill in the art in possession of the present disclosure.

Figure 8E:
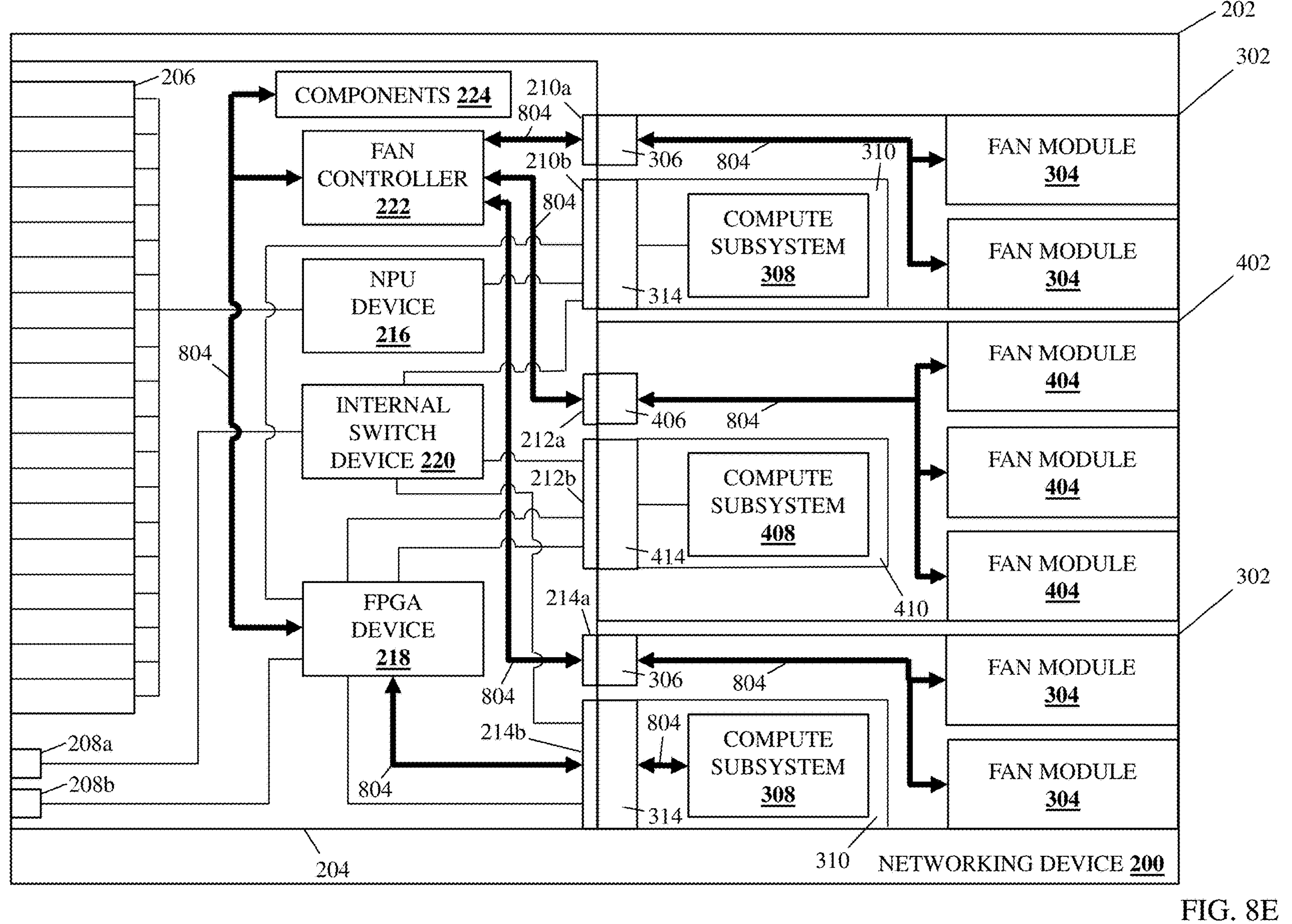
FIG. 8E is a schematic view illustrating an embodiment of the modular COFTA-based networking device system of FIG. 8B operating during the method of FIG. 7

In another example, with reference to FIG. 8E, the non-networking component management operating system provided by the compute subsystem 308 in the second COFTA system 300 discussed above may perform non-networking component management operations 804 that include managing the fan controller 222, the subset of the components 224, and/or other non-networking components in the networking device 200 via the networking device connector 314, the COFTA compute subsystem connector 214*b*, and the FPGA device 218. As will be appreciated by one of skill in the art in possession of the present disclosure, the non-networking component management operations 804 may include any of a variety of management operations related to power monitoring, control/reset mechanisms, sensor monitoring (e.g., thermal sensor monitoring, voltage sensor monitoring, etc.), power supply system status monitoring and control, fan status monitoring and control, LED control, firmware updates, and/or other non-networking components that would be apparent to one of skill in the art in possession of the present disclosure.

As will be appreciated by one of skill in the art in possession of the present disclosure, the non-networking component management operations 804 described above are often conventionally performed by a Baseboard Management Controller (BMC) device, Platform Management Controller (PMC) device, and/or other management controller known in the art, and thus the second COFTA system 300 may operate as a dedicated management controller (with a dedicated management operating system) in the embodiment illustrated in FIGS. 8A-8E. Furthermore, FIG. 8E illustrates a specific example in which the non-networking component management operations 804 include using the fan controller 222 to control any of the fan modules 304 on the first COFTA system 300, the fan modules 404 on the COFTA system 400, and the fan modules 304 on the second COFTA system 300.

Figure 8F:
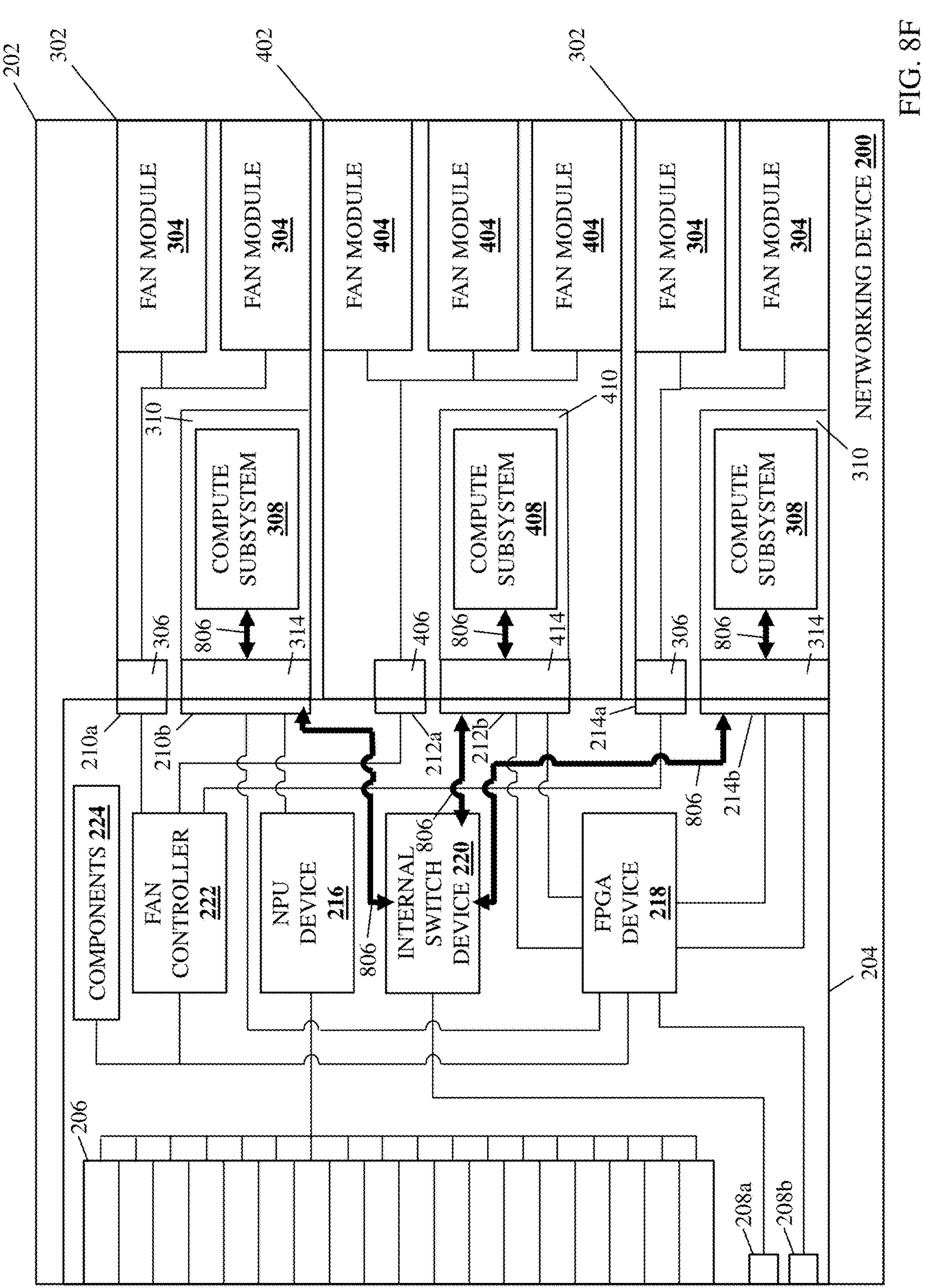
FIG. 8F is a schematic view illustrating an embodiment of the modular COFTA-based networking device system of FIG. 8B operating during the method of FIG. 7

With reference to FIG. 8F, any of the management operations discussed above may include any of the networking processing system management operating system provided by the compute subsystem 308 in the first COFTA system 300, the networking software management operating system provided by the compute subsystem 408 in the COFTA system 400, and the non-networking component management operating system provided by the compute subsystem 308 in the second COFTA system 300 performing operating system communication operations 806 via the networking device connector 314/COFTA compute subsystem connector 210*b* connection, the networking device connector 314/COFTA compute subsystem connector 212*b* connection, and the networking device connector 314/COFTA compute subsystem connector 214*b* connection, respectively, and using the internal switch device 220.

While not illustrated or described in detail, as discussed above, a user may access any of the compute subsystem 308 in the first of the COFTA system 300, the compute subsystem 408 in the COFTA system 400, and the compute subsystem 308 in the second of the COFTA system 300 (i.e., via the networking device connector 314/COFTA compute subsystem connector 210*b* connection, the networking device connector 314/COFTA compute subsystem connector 212*b* connection, and the networking device connector 314/COFTA compute subsystem connector 214*b* connection, respectively) using the management port 208*a* and the internal switch device 220, or using the management port 208*a* and the FPGA device 218 (via its UART connections discussed above).

Continuing with the second embodiment of the method 700 discussed above with reference to FIGS. 9A and 9B, at block 706, the networking processing system/networking software management operating system provided by the networking processing system/networking software management COFTA system (i.e., the COFTA system 500 discussed above with reference to FIGS. 5A and 5B that is connected to the COFTA system connectors 210 and 212) may operate to manage the networking processing system (e.g., the NPU device 216 and related component) and the networking software used by the networking device 200 (as well as a subset of the components 224 that interact with that networking software (such as, for example, firmware that interacts with the NOS and/or that is otherwise included in a networking software management system, a TPM, a PoE manager or controller, a cryptographic accelerator, a console buffer, etc.)), and the non-networking component management operating system provided by the non-networking component management COFTA system (i.e., the COFTA system 300 discussed above with reference to FIGS. 3A and 3B that is connected to the COFTA system connector 214) may operate to manage the fan controller, a subset of the components 224, and/or other non-networking components in the networking device 200.

Figure 9C:
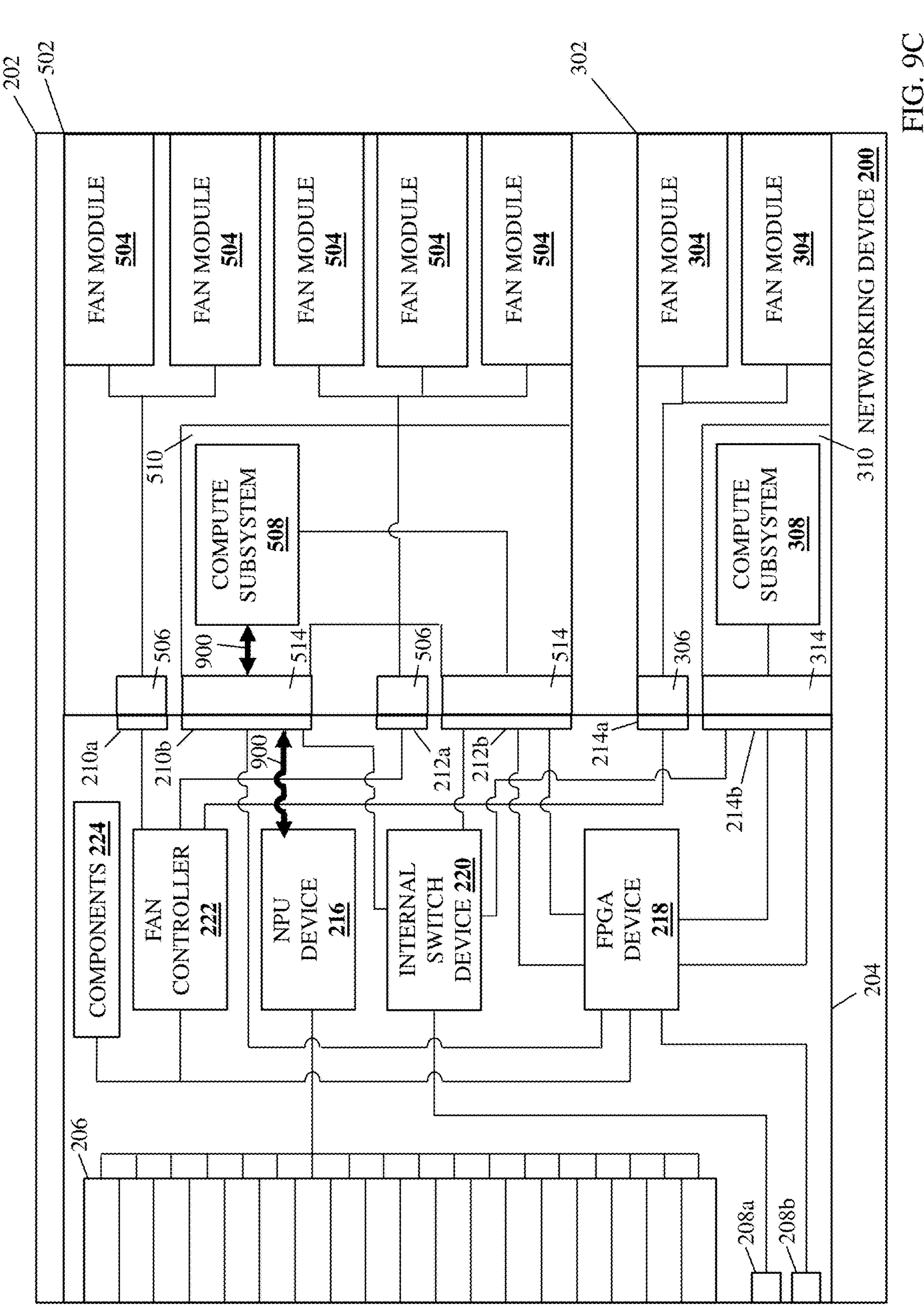
FIG. 9C is a schematic view illustrating an embodiment of the modular COFTA-based networking device system of FIG. 9B operating during the method of FIG. 7.

For example, with reference to FIG. 9C, the networking processing system/networking software management operating system provided by the compute subsystem 508 in the COFTA system 500 discussed above may perform networking processing system management operations 900 that include managing the NPU device 216 (and related components) via the networking device connector 314 and the COFTA compute subsystem connector 210*b*. Similarly as discussed above, the networking processing system management operations 900 may include any of a variety of management operations related to the NPU device 216 (or switch ASIC), related networking hardware, forwarding tables, telemetry hardware (e.g., NPU device/silicon telemetry hardware), NPU-specific drivers, a Software Development Kit (SDK) accessed via a Switch Abstraction Interface (SAI), firmware and/or other functionality that is relatively tightly coupled to the NPU device 216 (e.g., Precision Time Protocol (PTP) functionality, Synchronous Ethernet (SyncE) functionality, etc.), and/or other networking processing system components that would be apparent to one of skill in the art in possession of the present disclosure.

Figure 9D:
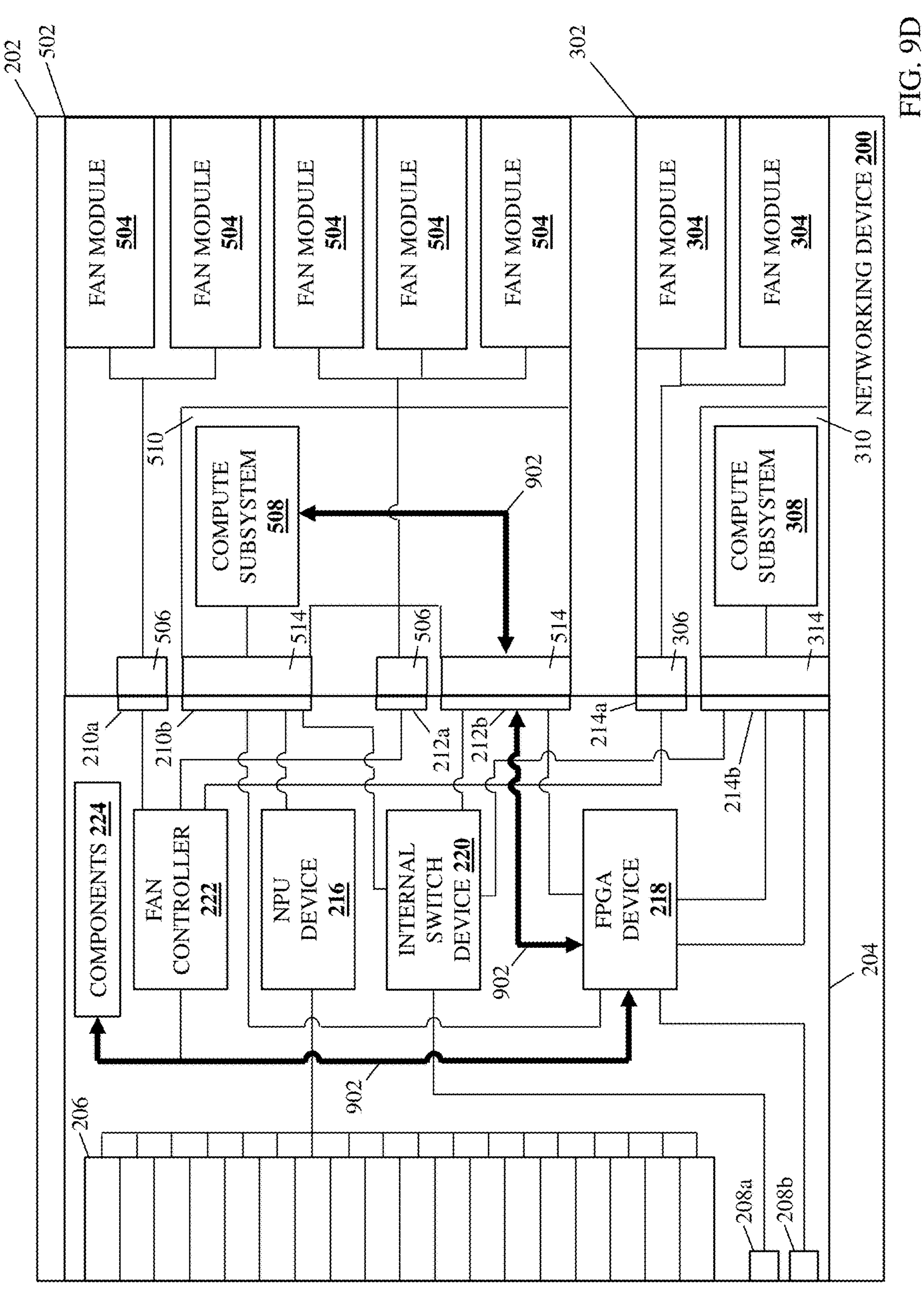
FIG. 9D is a schematic view illustrating an embodiment of the modular COFTA-based networking device system of FIG. 9B operating during the method of FIG. 7.

In another example, with reference to FIG. 9D, the networking processing system/networking software management operating system provided by the compute subsystem 508 in the COFTA system 500 discussed above may perform networking software management operations 902 that include managing the networking software used by the networking device 200, which in some examples may include managing the subset of the components 224 that interact with that networking software (e.g., firmware that interacts with the NOS and/or that is otherwise included in a networking software management system, a TPM, a PoE manager or controller, a cryptographic accelerator, a console buffer, etc.) via the networking device connector 414, the COFTA compute subsystem connector 212*b*, and the FPGA device 218. Similarly as discussed above, the networking software management operations 902 may include any of a variety of management operations related to a Network Operating System (NOS) provided by the compute subsystem 508 for use by the networking device 200, a management framework provided for a user of the networking device 200 (e.g., a Command Line Interface (CLI), programmatic NorthBound Interface (NBI), REpresentational State Transfer (REST), Google Remote Procedure Call (gRPC) Network Management Interface (GNMI), gRPC Network Operations Interface (GNOI), etc.), Layer 2 (L2)/Layer 3 (L3) protocols, operating system images, Zero-Touch Provisioning (ZTP), Authentication Authorization and Accounting (AAA), Network Time Protocol (NTP), Domain Name Service (DNS), Role-Based Access Control (RBAC), Simple Network Management Protocol (SNMP), Dynamic Host Configuration Protocol (DHCP), and/or other networking software components that would be apparent to one of skill in the art in possession of the present disclosure.

Figure 9E:
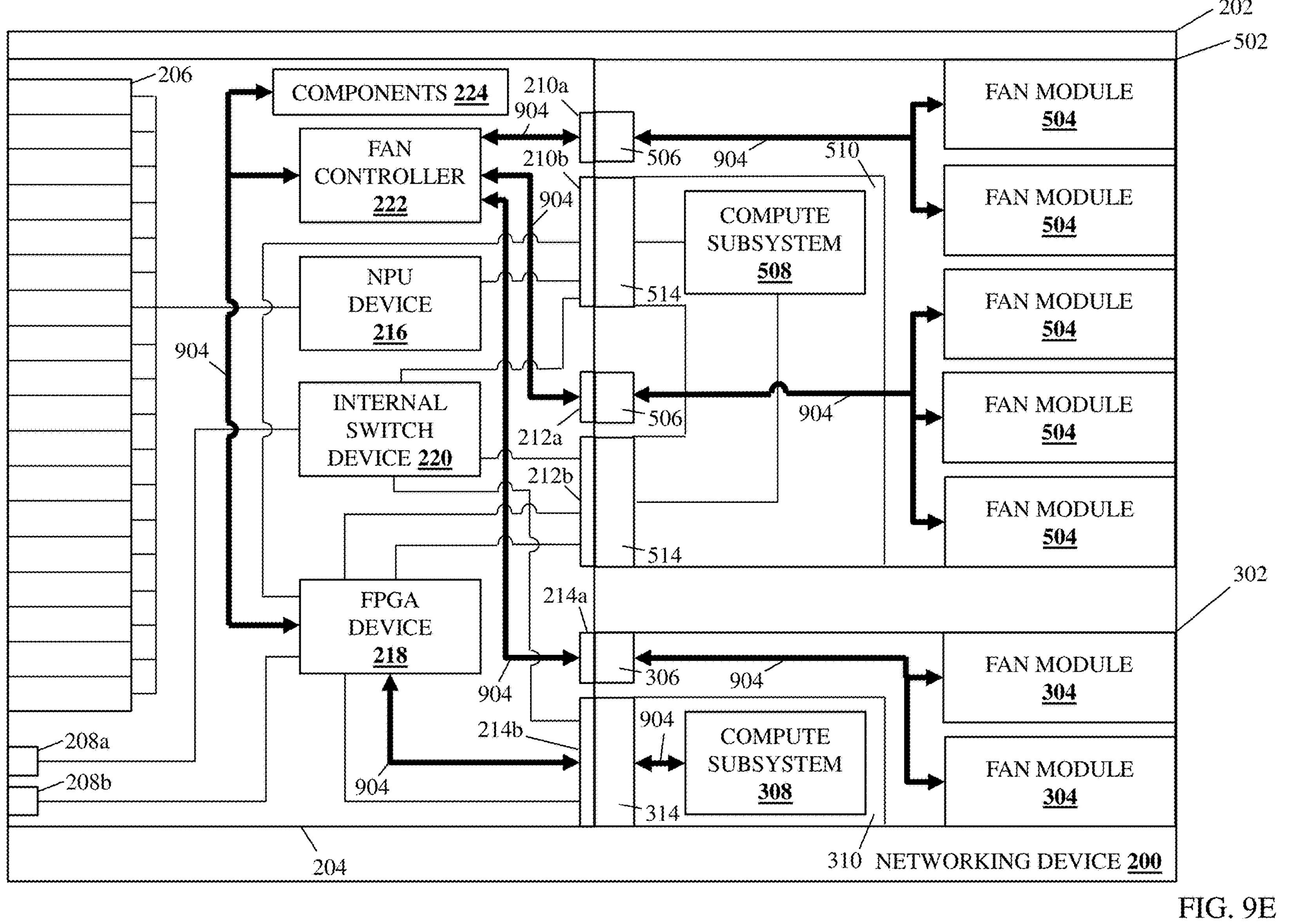
FIG. 9E is a schematic view illustrating an embodiment of the modular COFTA-based networking device system of FIG. 9B operating during the method of FIG. 7.

In another example, with reference to FIG. 9E, the non-networking component management operating system provided by the compute subsystem 308 in the COFTA system 300 discussed above may perform non-networking component management operations 904 that include managing the fan controller 222, the subset of the components 224, and/or other non-networking components in the networking device 200 via the networking device connector 314, the COFTA compute subsystem connector 214*b*, and the FPGA device 218. As will be appreciated by one of skill in the art in possession of the present disclosure, the non-networking component management operations 904 may include any of a variety of management operations related to power monitoring, control/reset mechanisms, sensor monitoring (e.g., thermal sensor monitoring, voltage sensor monitoring, etc.), power supply system status monitoring and control, fan status monitoring and control, LED control, firmware updates, and/or other non-networking components that would be apparent to one of skill in the art in possession of the present disclosure.

As will be appreciated by one of skill in the art in possession of the present disclosure, the non-networking component management operations 904 described above are often conventionally performed by a Baseboard Management Controller (BMC) device, Platform Management Controller (PMC) device, and/or other management controller known in the art, and thus the COFTA system 300 may operate as a dedicated management controller (with a dedicated management operating system) in the embodiment illustrated in FIGS. 9A-9E. Furthermore, FIG. 9E illustrates a specific example in which the non-networking component management operations 904 include using the fan controller 222 to control any of the fan modules 504 on the COFTA system 500, and the fan modules 304 on the COFTA system 300.

Figure 9F:
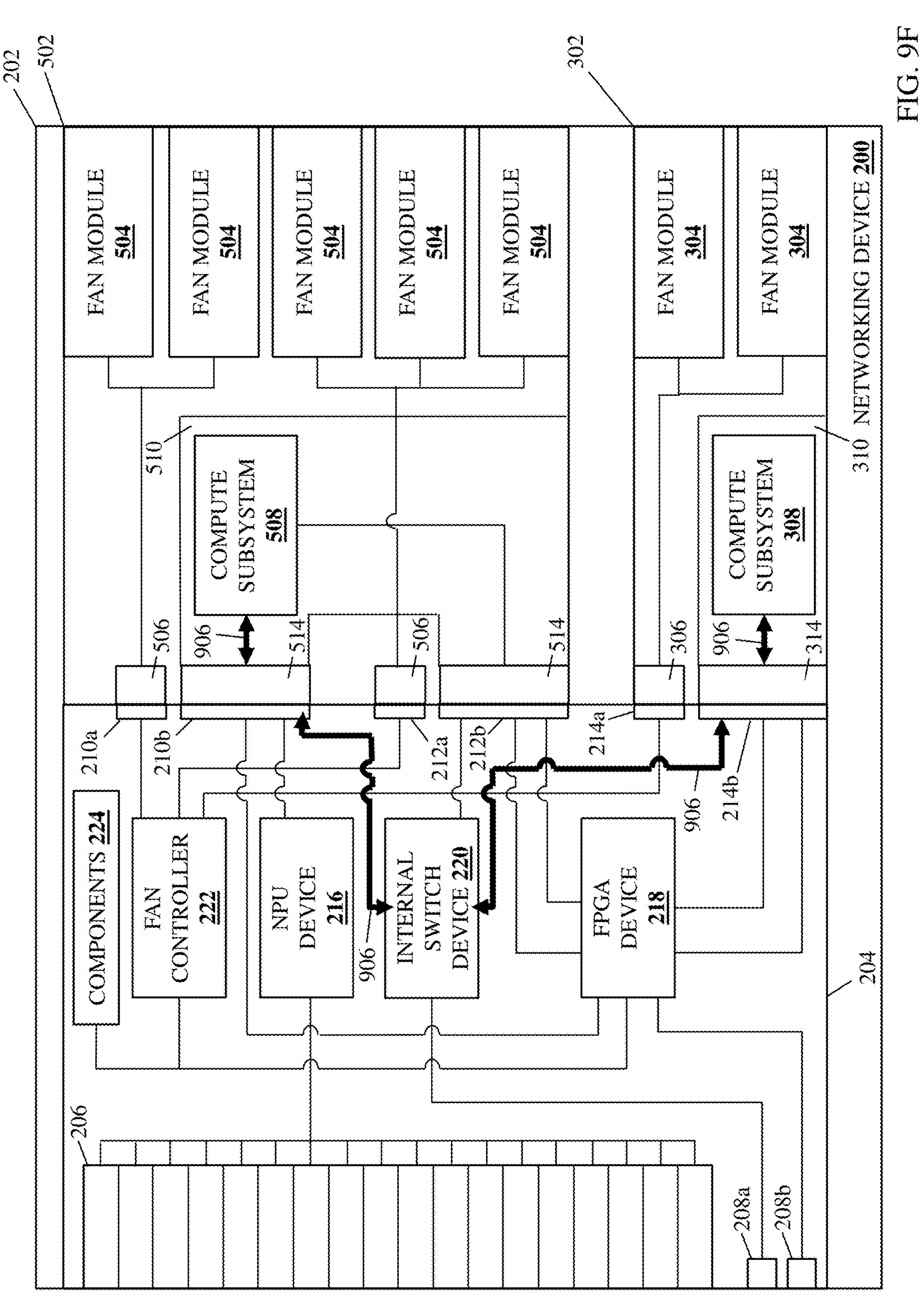
FIG. 9F is a schematic view illustrating an embodiment of the modular COFTA-based networking device system of FIG. 9B operating during the method of FIG. 7.

With reference to FIG. 9F, any of the management operations discussed above may include the networking processing system/networking software management operating system provided by the compute subsystem 508 in the COFTA system 500 and the non-networking component management operating system provided by the compute subsystem 308 in the COFTA system 300 performing operating system communication operations 906 via the networking device connector 314/COFTA compute subsystem connector 210*b* connection and the networking device connector 314/COFTA compute subsystem connector 214*b* connection, respectively, and using the internal switch device 220.

While not illustrated or described in detail, as discussed above, a user may access either of the compute subsystem 508 in the COFTA system 500 and the compute subsystem 308 in the COFTA system 300 (i.e., via the networking device connector 314/COFTA compute subsystem connector 210*b* connection or the networking device connector 314/COFTA compute subsystem connector 212*b* connection, and the networking device connector 314/COFTA compute subsystem connector 214*b* connection, respectively) using the management port 208*a* and the internal switch device 220, or using the management port 208*a* and the FPGA device 218 (via its UART connections discussed above).

Continuing with the third embodiment of the method 700 discussed above with reference to FIGS. 10A and 10B, at block 706, the networking processing system management operating system provided by the networking processing system management COFTA system (i.e., the COFTA system 300 discussed above with reference to FIGS. 3A and 3B that is connected to the COFTA system connector 210) may operate to manage the networking processing system (e.g., the NPU device 216 and related component), and the networking software/non-networking component management operating system provided by the networking software/non-networking component management COFTA system (i.e., the COFTA system 500 discussed above with reference to FIGS. 5A and 5B that is connected to the COFTA system connectors 212 and 214) may operate to manage networking software used by the networking device 200, as well as the fan controller, a subset of the components 224, and/or other non-networking components in the networking device 200.

Figure 10C:
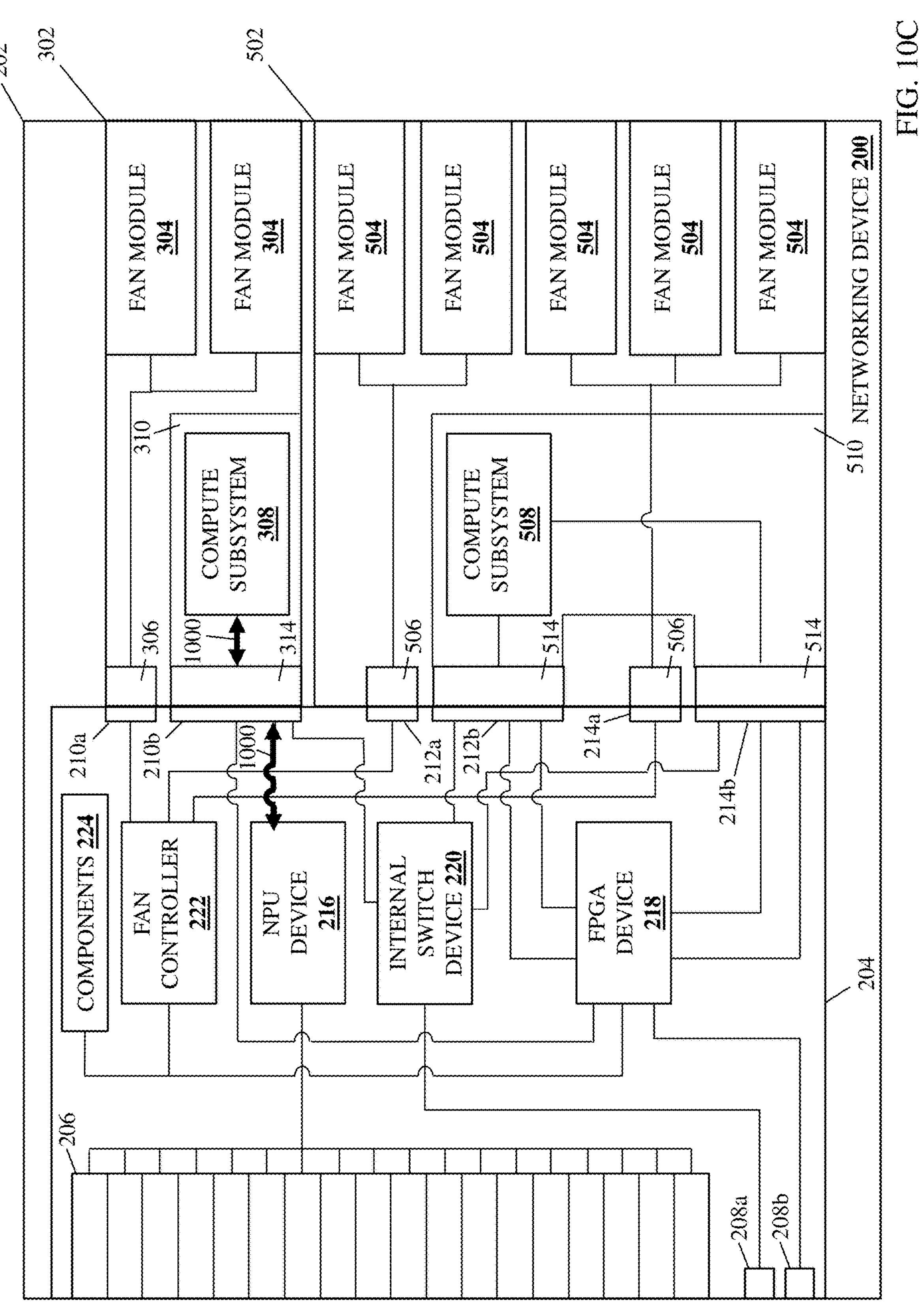
FIG. 10C is a schematic view illustrating an embodiment of the modular COFTA-based networking device system of FIG. 10B operating during the method of FIG. 7.

For example, with reference to FIG. 10C, the networking processing system management operating system provided by the compute subsystem 308 in the COFTA system 300 discussed above may perform networking processing system management operations 1000 that include managing the NPU device 216 (and related components) via the networking device connector 314 and the COFTA compute subsystem connector 210*b*. Similarly as discussed above, the networking processing system management operations 1000 may include any of a variety of management operations related to the NPU device 216 (or switch ASIC), related networking hardware, forwarding tables, telemetry hardware (e.g., NPU device/silicon telemetry hardware), NPU-specific drivers, a Software Development Kit (SDK) accessed via a Switch Abstraction Interface (SAI), firmware and/or other functionality that is relatively tightly coupled to the NPU device 216 (e.g., Precision Time Protocol (PTP) functionality, Synchronous Ethernet (SyncE) functionality, etc.), and/or other networking processing system components that would be apparent to one of skill in the art in possession of the present disclosure.

Figure 10D:
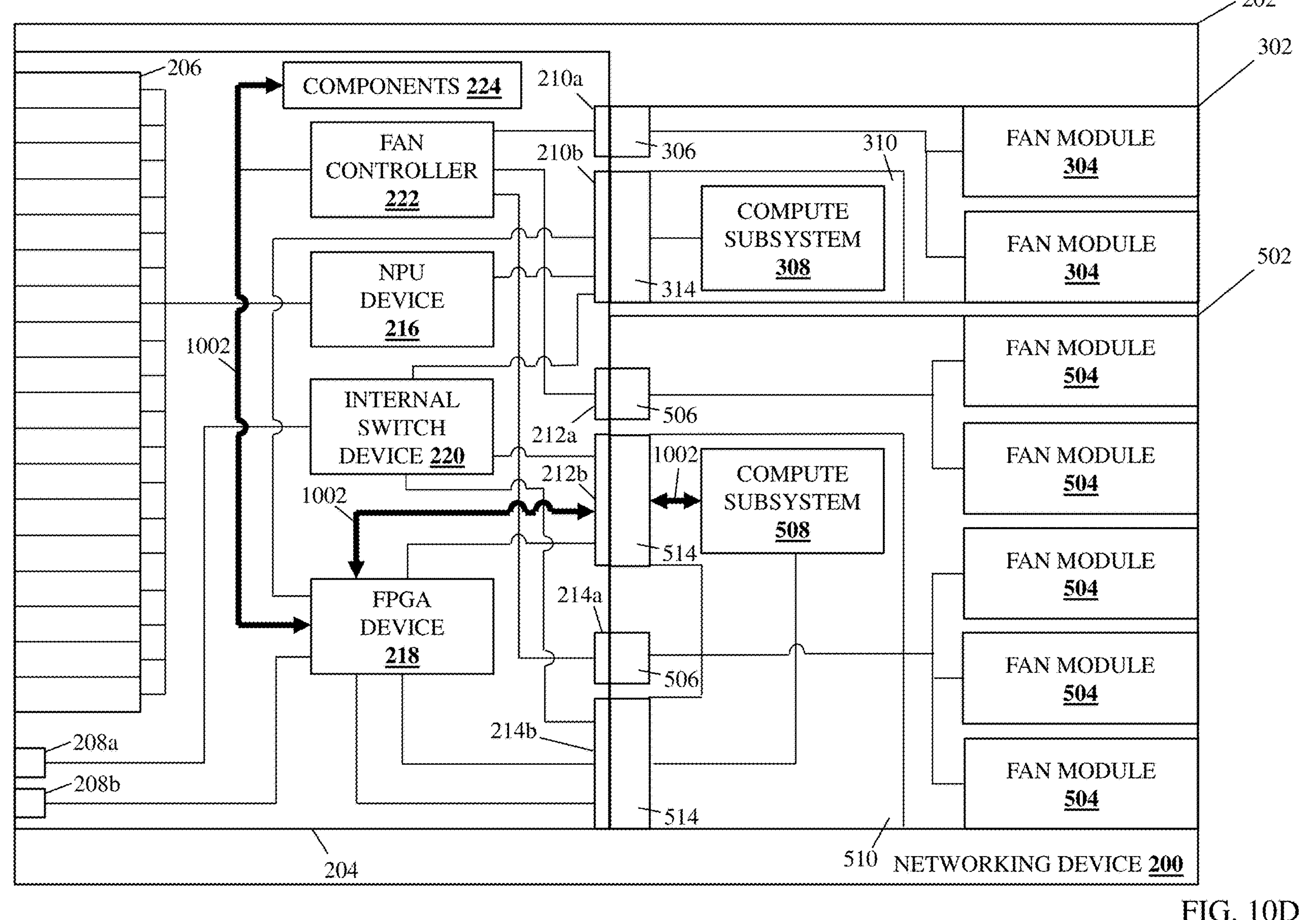
FIG. 10D is a schematic view illustrating an embodiment of the modular COFTA-based networking device system of FIG. 10B operating during the method of FIG. 7.

In another example, with reference to FIG. 10D, the networking software/non-networking component management operating system provided by the compute subsystem 508 in the COFTA system 500 discussed above may perform networking software management operations 1002 that include managing the networking software used by the networking device 200, which in some examples may include managing the subset of the components 224 that interact with that networking software (e.g., firmware that interacts with the NOS and/or that is otherwise included in a networking software management system, a TPM, a PoE manager or controller, a cryptographic accelerator, a console buffer, etc.) via the networking device connector 414, the COFTA compute subsystem connector 212*b*, and the FPGA device 218. Similarly as discussed above, the networking software management operations 1002 may include any of a variety of management operations related to a Network Operating System (NOS) provided by the compute subsystem 508 for use by the networking device 200, a management framework provided for a user of the networking device 200 (e.g., a Command Line Interface (CLI), programmatic NorthBound Interface (NBI), REpresentational State Transfer (REST), Google Remote Procedure Call (gRPC) Network Management Interface (GNMI), gRPC Network Operations Interface (GNOI), etc.), Layer 2 (L2)/Layer 3 (L3) protocols, operating system images, Zero-Touch Provisioning (ZTP), Authentication Authorization and Accounting (AAA), Network Time Protocol (NTP), Domain Name Service (DNS), Role-Based Access Control (RBAC), Simple Network Management Protocol (SNMP), Dynamic Host Configuration Protocol (DHCP), and/or other networking software components that would be apparent to one of skill in the art in possession of the present disclosure.

Figure 10E:
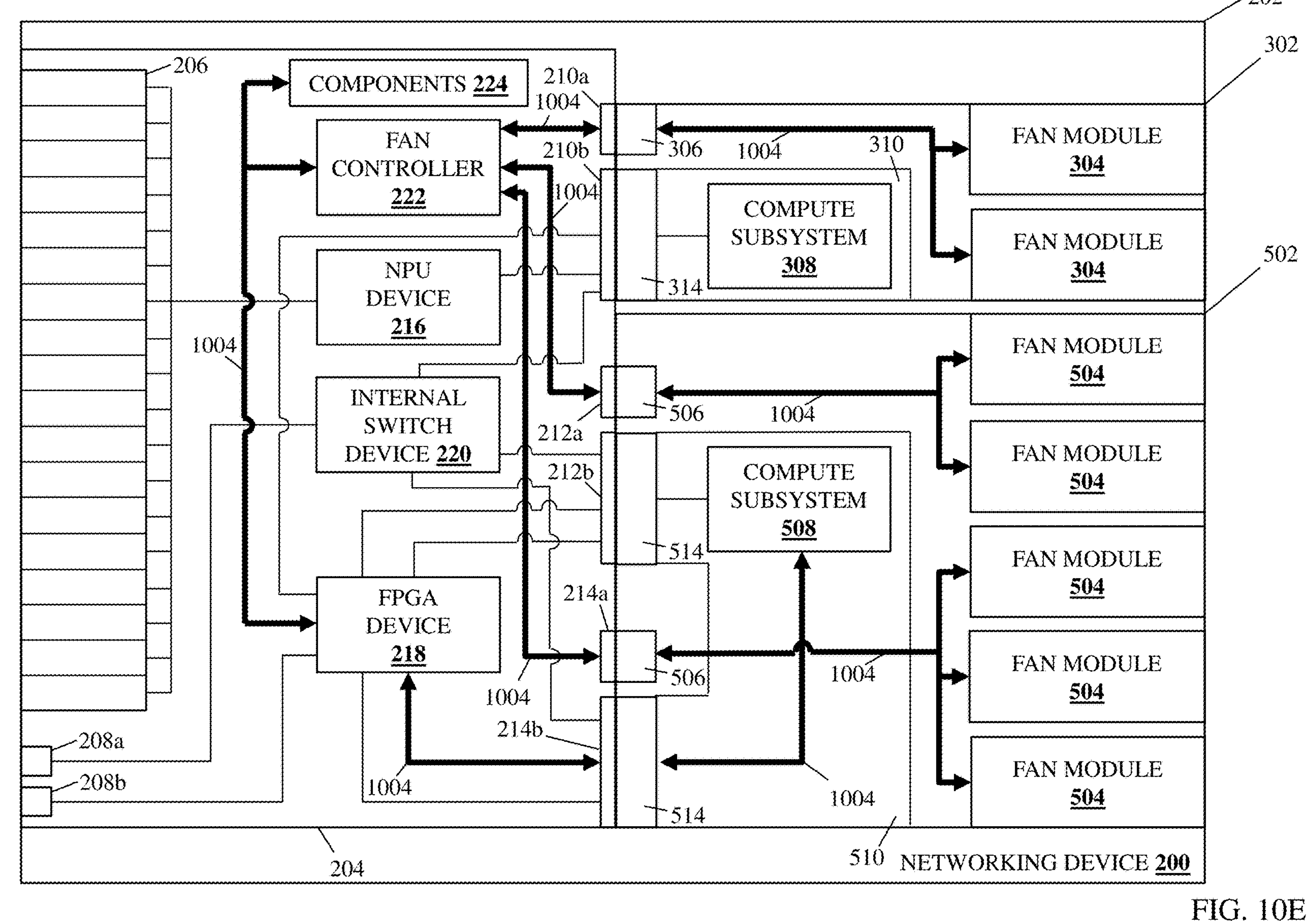
FIG. 10E is a schematic view illustrating an embodiment of the modular COFTA-based networking device system of FIG. 10B operating during the method of FIG. 7.

In another example, with reference to FIG. 10E, the networking software/non-networking component management operating system provided by the compute subsystem 508 in the COFTA system 500 discussed above may perform non-networking component management operations 1004 that include managing the fan controller 222, the subset of the components 224, and/or other non-networking components in the networking device 200 via the networking device connector 314, the COFTA compute subsystem connector 214*b*, and the FPGA device 218. As will be appreciated by one of skill in the art in possession of the present disclosure, the non-networking component management operations 1004 may include any of a variety of management operations related to power monitoring, control/reset mechanisms, sensor monitoring (e.g., thermal sensor monitoring, voltage sensor monitoring, etc.), power supply system status monitoring and control, fan status monitoring and control, LED control, firmware updates, and/or other non-networking components that would be apparent to one of skill in the art in possession of the present disclosure.

As will be appreciated by one of skill in the art in possession of the present disclosure, the non-networking component management operations 1004 described above are often conventionally performed by a Baseboard Management Controller (BMC) device, Platform Management Controller (PMC) device, and/or other management controller known in the art, and thus the COFTA system 500 may operate as a management controller (i.e., in addition to managing the networking software as described above) in the embodiment illustrated in FIGS. 10A-10E. Furthermore, FIG. 10E illustrates a specific example in which the non-networking component management operations 1004 include using the fan controller 222 to control any of the fan modules 304 on the COFTA system 300, and the fan modules 504 on the COFTA system 500.

Figure 10F:
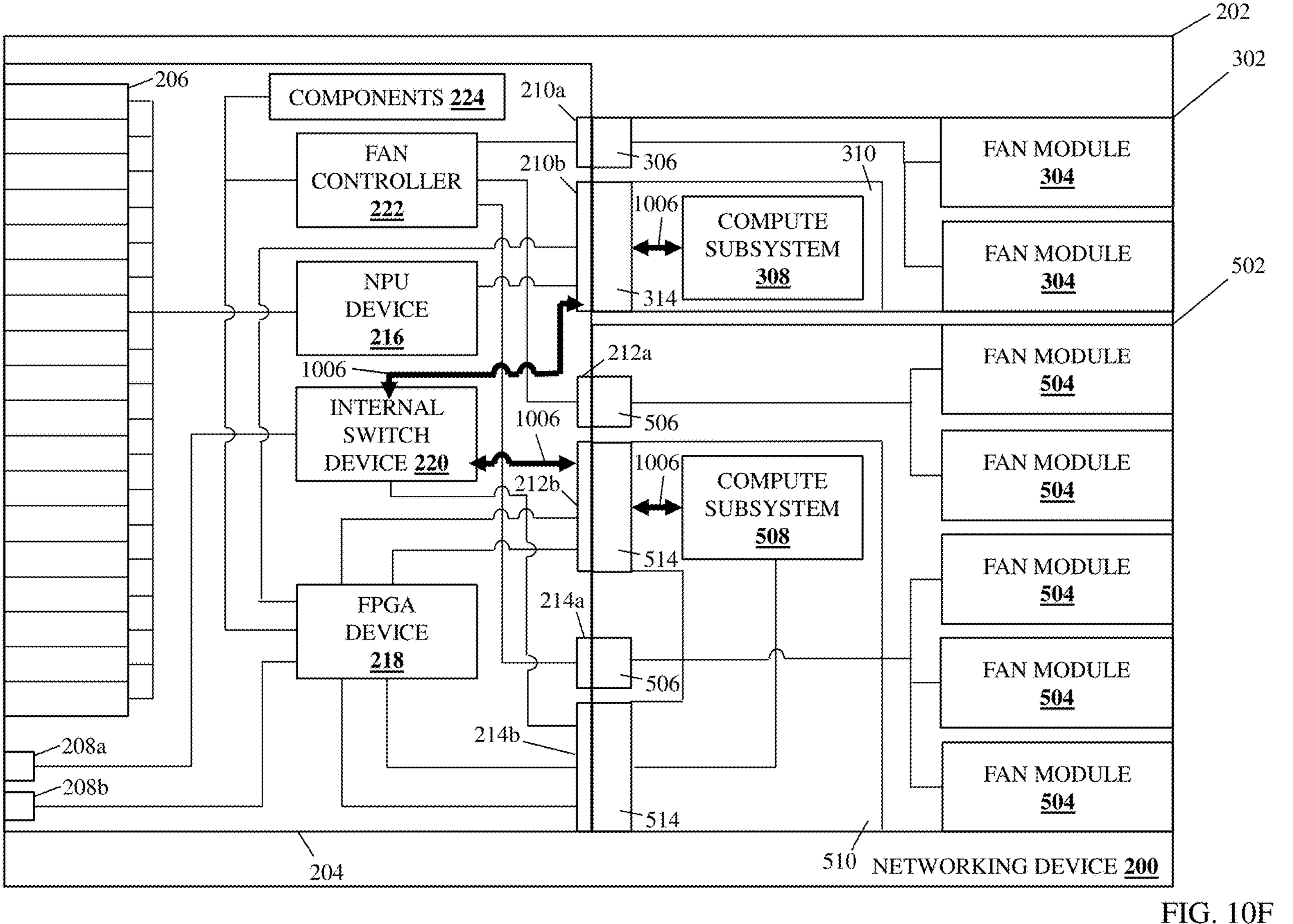
FIG. 10F is a schematic view illustrating an embodiment of the modular COFTA-based networking device system of FIG. 10B operating during the method of FIG. 7.

With reference to FIG. 10F, any of the management operations discussed above may include the networking processing system management operating system provided by the compute subsystem 308 in the COFTA system 300 and the networking software/non-networking component management operating system provided by the compute subsystem 508 in the COFTA system 500 performing operating system communication operations 1006 via the networking device connector 314/COFTA compute subsystem connector 210*b* connection and the networking device connector 314/COFTA compute subsystem connector 212*b* connection, respectively, and using the internal switch device 220.

While not illustrated or described in detail, as discussed above, a user may access either of the compute subsystem 308 in the COFTA system 300 and the compute subsystem 508 in the COFTA system 500 (i.e., via the networking device connector 314/COFTA compute subsystem connector 210*b* connection, and the networking device connector 314/COFTA compute subsystem connector 212*b* connection or the networking device connector 314/COFTA compute subsystem connector 214*b* connection, respectively) using the management port 208*a* and the internal switch device 220, or using the management port 208*a* and the FPGA device 218 (via its UART connections discussed above).

Thus, the networking device 200 discussed above with reference to FIGS. 2A and 2B may be used with different combinations of the COFTA system 300 of FIGS. 3A and 3B, the COFTA system 400 of FIGS. 4A and 4B, and the COFTA system 500 of FIGS. 5A and 5B to provide different modular networking configurations that may be selected depending on how the networking device 200 will be used. For example, providing a dedicated networking processing system management operating system to perform networking processing system management (e.g., as illustrated and described above with reference to the COFTA system 300 in FIGS. 8A-8F and 10A-10F) allows a single vendor to control the networking processing system management operating system provided by the networking processing system management COFTA system to perform that networking processing system management, as well as associated drivers, applications, and other networking processing system management components, and allows a user to select the networking processing system management operating system that is best suited for their use of the networking device 200.

Furthermore, such solutions that provide a dedicated networking processing system management operating system to perform networking processing system management allow the networking software management and non-networking component management for the networking device 200 to be provided by differentiated management solutions that may evolve independently of the networking processing system management. For example, a networking processing system management COFTA system provided according to the teachings of the present disclosure may provide an operating system kernel that is optimally configured (or provides the best available configuration) to run NPU drivers, firmware functionality, and/or other networking processing subsystems in terms of security, stability, and/or other characteristics of a networking processing system management operating system that would be apparent to one of skill in the art in possession of the present disclosure. As such, networking processing issues with the networking device 200 (e.g., "field" issues) to be triaged independently of the networking software management and/or non-networking component management, providing the ability to resolve such issues relatively quicker than conventional networking devices due to the management functionality demarcation provided by the teachings of the present disclosure.

Furthermore, while particular benefits associated with providing a dedicated networking processing system management operating system to perform networking processing system management are described above, one of skill in the art in possession of the present disclosure will appreciate how similar benefits may be realized by providing a dedicated networking software management operating system to perform networking software management (e.g., as illustrated and described above with reference to the COFTA system 400 in FIGS. 8A-8F), and/or providing a dedicated non-networking component management operating system to perform non-networking component management (e.g., as illustrated and described above with reference to the COFTA system 300 in FIGS. 8A-8F and 9A-9F).

Furthermore, one of skill in the art in possession of the present disclosure will recognize a variety of networking device use cases may call for the embodiment illustrated in FIGS. 9A-9F in which the networking processing system management and networking software management are performed by the COFTA system 500 while the non-networking component management is performed by the COFTA system 300, as well as a variety of networking device use cases may call for the embodiment illustrated in FIGS. 10A-10F in which the networking processing system management is performed by the COFTA system 300 and the networking software management and non-networking component management is performed by the COFTA system 500. As such, one of skill in the art in possession of the present disclosure will appreciate how the modularity provided by the networking device 200 and different combinations of the COFTA systems 300, 400, and 500 allow a user to configure (and provide different levels of management functionality disaggregation for the device networking 200 based on desired features/functionalities/capabilities of the networking device 200, workloads that will be performed using the networking device 200, security requirements of the networking device 200, and/or other characteristics of the networking device 200.

Figure 11A:
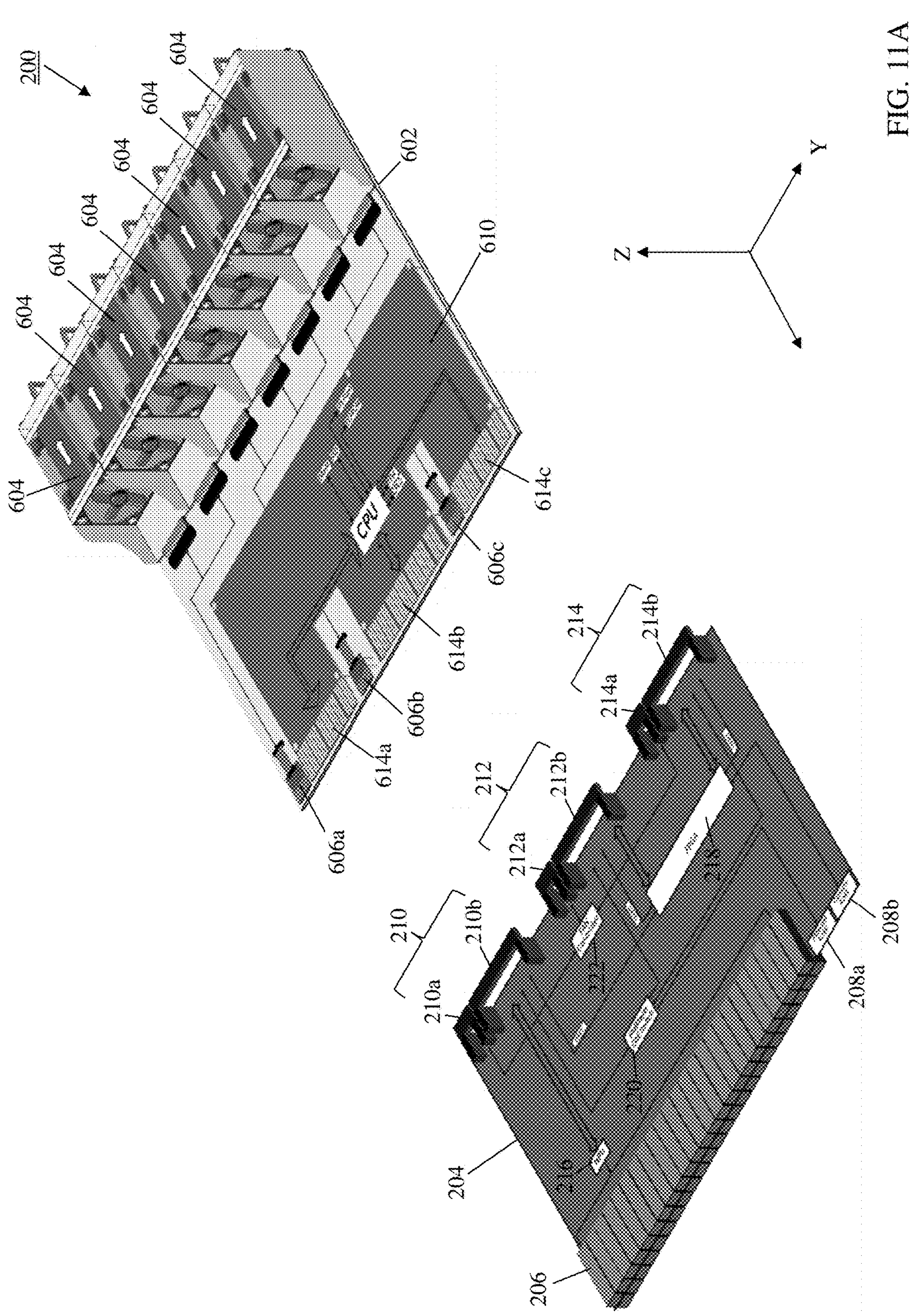
FIG. 11A is a perspective view illustrating an embodiment of the COFTA system of FIGS. 6A and 6B being coupled to the networking device of FIGS. 2A and 2B.
Figure 11B:
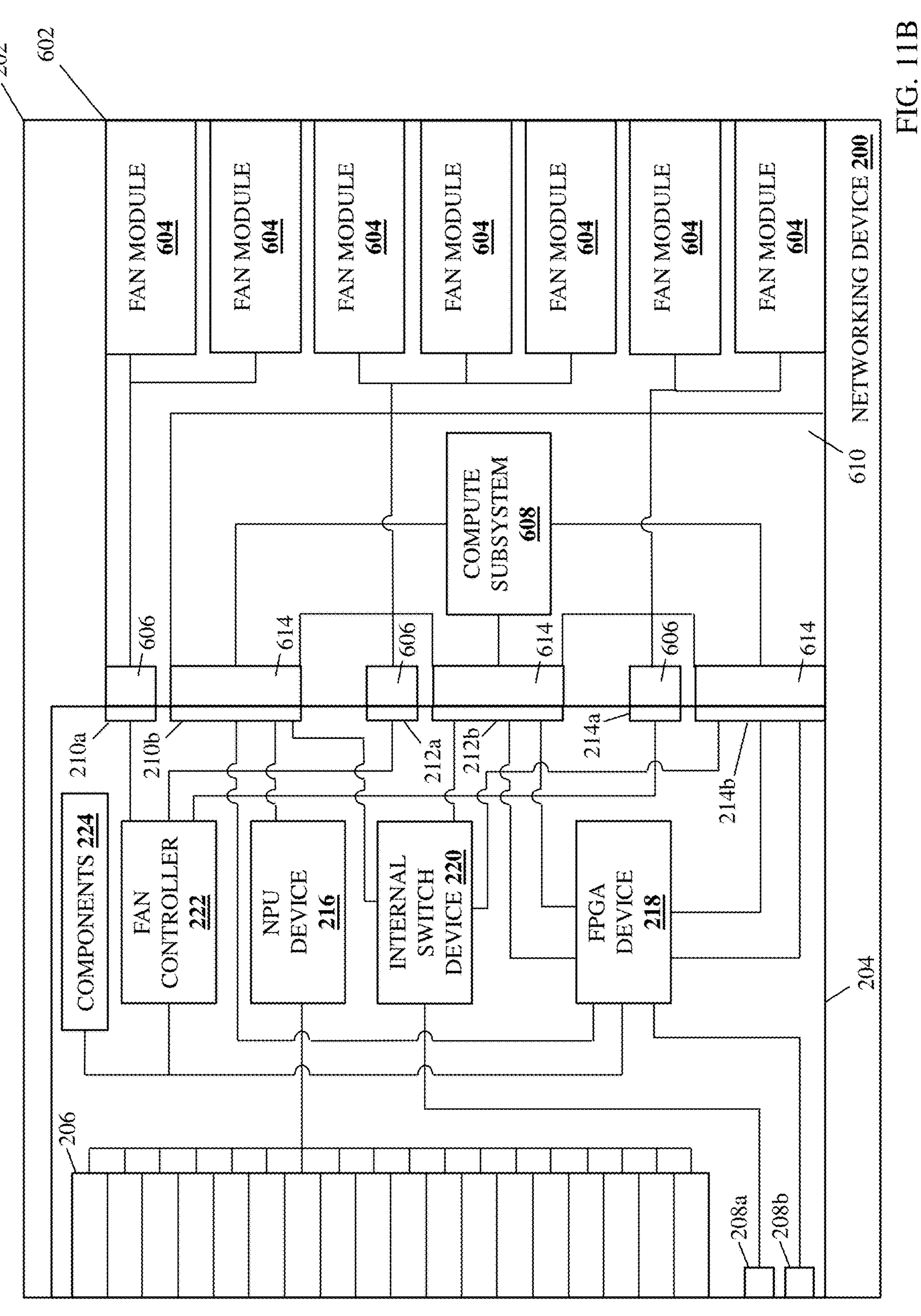
FIG. 11B is a schematic view illustrating an embodiment of the COFTA system of FIGS. 6A and 6B coupled to the networking device of FIGS. 2A and 2B.

As will be appreciated by one of skill in the art in possession of the present disclosure, the networking device 200 is also capable of being configured without the management functionality disaggregation described above in order to support users that desire the conventional integrated management functionality discussed above, and/or networking device use cases that may benefit from such integrated management functionality. For example, the COFTA system 600 discussed above with reference to FIGS. 6A and 6B may provide a networking processing system/networking software/non-networking component management COFTA system, and may be coupled to the networking device management connector system on the circuit board 204 of the networking device 200. As illustrated in FIGS. 11A and 11B, the COFTA system 600 may be positioned adjacent the COFTA system connectors 210, 212, and 214 on the circuit board 204 of the networking device 200 (e.g., by positioning the COFTA system 600 in a COFTA system housing defined by the networking device chassis 200 adjacent the COFTA system connectors 210, 212, and 214), and the COFTA system 600 may then be moved towards the circuit board 204 such that the fan controller connectors 606*a*, 606*b*, and 606*c* on the COFTA system 600 engage the COFTA fan subsystem connectors 210*a*, 212*a*, and 214*a*, respectively, on the COFTA system connectors 210, 212, and 214, respectively, and the networking device connectors 614*a*, 614*b*, and 614*c* on the COFTA system 600 engage the COFTA compute subsystem connectors 210*b*, 212*b*, and 214*b*, respectively, on the COFTA system connectors 210, 212, and 214.

The COFTA system 600 that provides the networking processing system/networking software/non-networking component management COFTA system may operate to provide a networking processing system/networking software/non-networking component management operating system. With reference back to FIGS. 11A and 11B, the compute subsystem 608 in the COFTA system 600 that is connected to the COFTA system connectors 210, 212, and 214 may have previously been configured to provide the networking processing system/networking software/non-networking component management operating system, and one of skill in the art in possession of the present disclosure will appreciate how that compute subsystem 608 may power on, boot, reset, reboot, and or otherwise initialize in order to enter a runtime state in which it provides the networking processing system/networking software/non-networking component management operating system.

The networking processing system/networking software/non-networking component management operating system provided by the networking processing system/networking software/non-networking component COFTA system (i.e., the COFTA system 600 discussed above with reference to FIGS. 6A and 6B that is connected to the COFTA system connectors 210, 212, and 214) may operate to manage the networking processing system (e.g., the NPU device 216 and related component), the networking software used by the networking device 200 (as well as a subset of the components 224 that interact with that networking software such as, for example, firmware that interacts with the NOS and/or that is otherwise included in a networking software management system, a TPM, a PoE manager or controller, a cryptographic accelerator, a console buffer, etc.), and the fan controller, a subset of the components 224, and/or other non-networking components in the networking device 200.

Figure 11C:
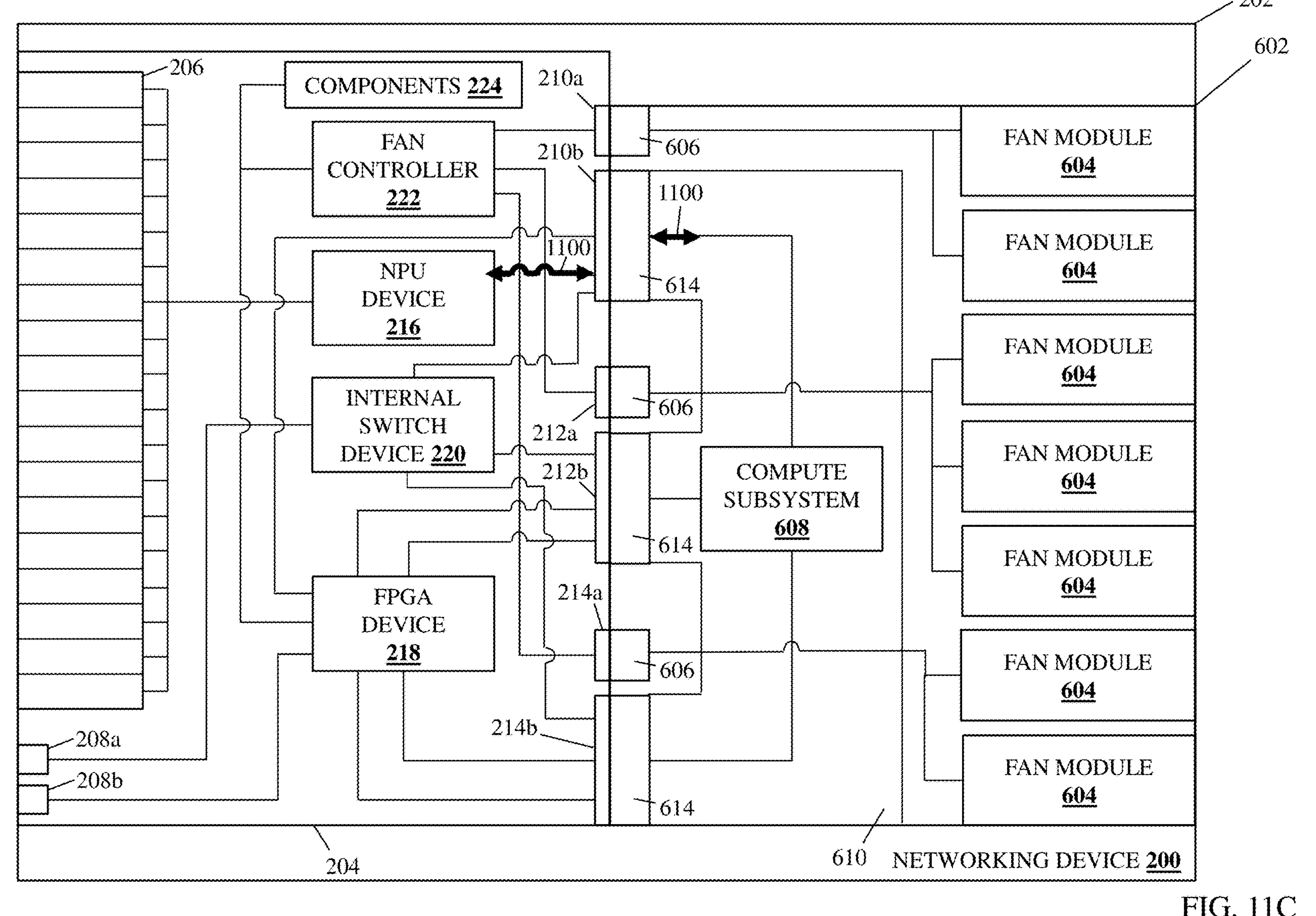
FIG. 11C is a schematic view illustrating the operation of the COFTA system of FIGS. 6A and 6B coupled to the networking device of FIGS. 2A and 2B.

For example, with reference to FIG. 11C, the networking processing system/networking software/non-networking component management operating system provided by the compute subsystem 608 in the COFTA system 600 discussed above may perform networking processing system management operations 1100 that include managing the NPU device 216 (and related components) via the networking device connector 314 and the COFTA compute subsystem connector 210*b*. Similarly as discussed above, the networking processing system management operations 1100 may include any of a variety of management operations related to the NPU device 216 (or switch ASIC), related networking hardware, forwarding tables, telemetry hardware (e.g., NPU device/silicon telemetry hardware), NPU-specific drivers, a Software Development Kit (SDK) accessed via a Switch Abstraction Interface (SAI), firmware and/or other functionality that is relatively tightly coupled to the NPU device 216 (e.g., Precision Time Protocol (PTP) functionality, Synchronous Ethernet (SyncE) functionality, etc.), and/or other networking processing system components that would be apparent to one of skill in the art in possession of the present disclosure.

Figure 11D:
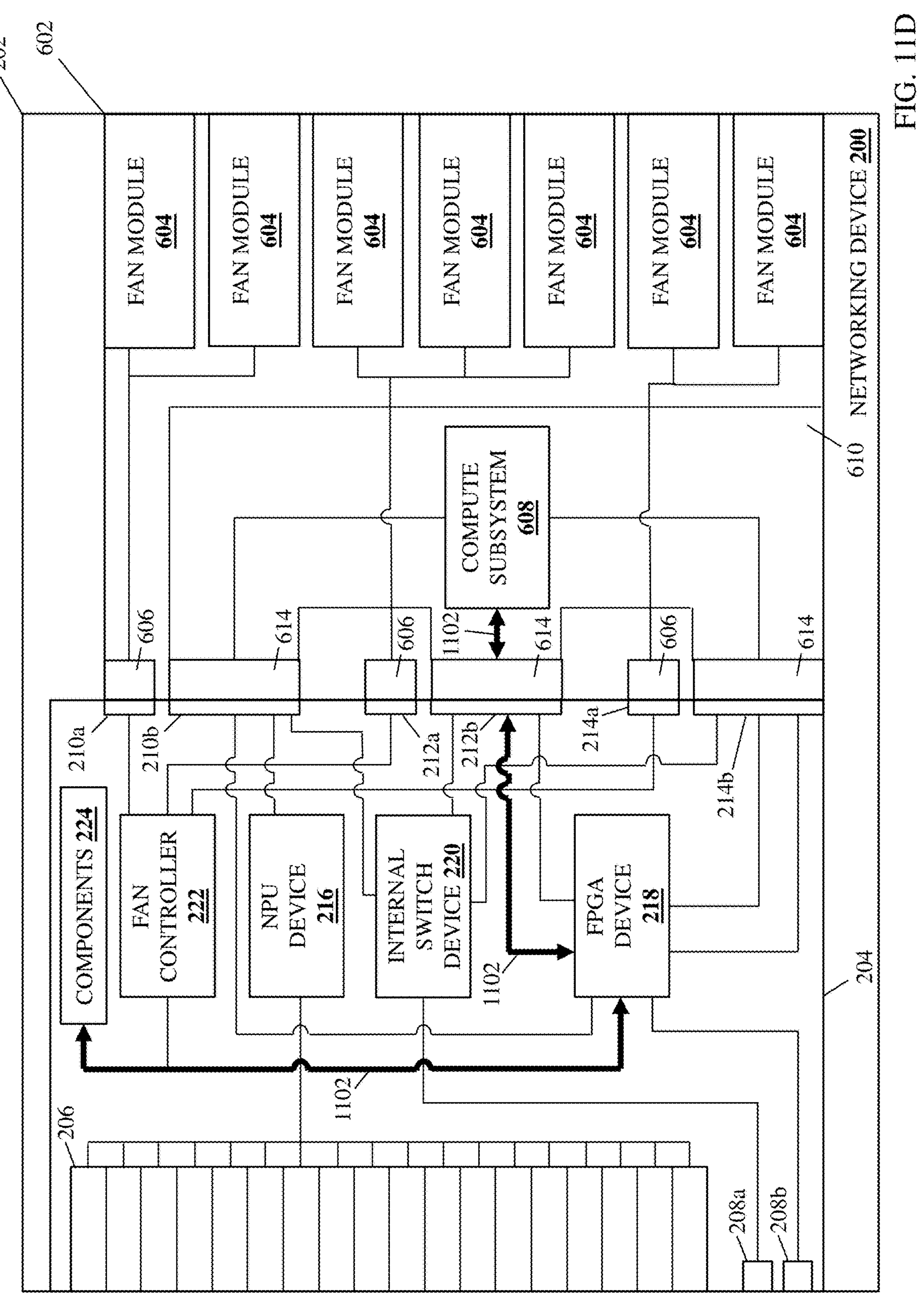
FIG. 11D is a schematic view illustrating the operation of the COFTA system of FIGS. 6A and 6B coupled to the networking device of FIGS. 2A and 2B.

In another example, with reference to FIG. 11D, the networking processing system/networking software/non-networking component management operating system provided by the compute subsystem 608 in the COFTA system 600 discussed above may perform networking software management operations 1102 that include managing the networking software used by the networking device 200, which in some examples may include managing the subset of the components 224 that interact with that networking software (e.g., firmware that interacts with the NOS and/or that is otherwise included in a networking software management system, a TPM, a PoE manager or controller, a cryptographic accelerator, a console buffer, etc.) via the networking device connector 414, the COFTA compute subsystem connector 212*b*, and the FPGA device 218. Similarly as discussed above, the networking software management operations 1102 may include any of a variety of management operations related to a Network Operating System (NOS) provided by the compute subsystem 508 for use by the networking device 200, a management framework provided for a user of the networking device 200 (e.g., a Command Line Interface (CLI), programmatic North-Bound Interface (NBI), REpresentational State Transfer (REST), Google Remote Procedure Call (gRPC) Network Management Interface (GNMI), gRPC Network Operations Interface (GNOI), etc.), Layer 2 (L2)/Layer 3 (L3) protocols, operating system images, Zero-Touch Provisioning (ZTP), Authentication Authorization and Accounting (AAA), Network Time Protocol (NTP), Domain Name Service (DNS), Role-Based Access Control (RBAC), Simple Network Management Protocol (SNMP), Dynamic Host Configuration Protocol (DHCP), and/or other networking software components that would be apparent to one of skill in the art in possession of the present disclosure.

Figure 11E:
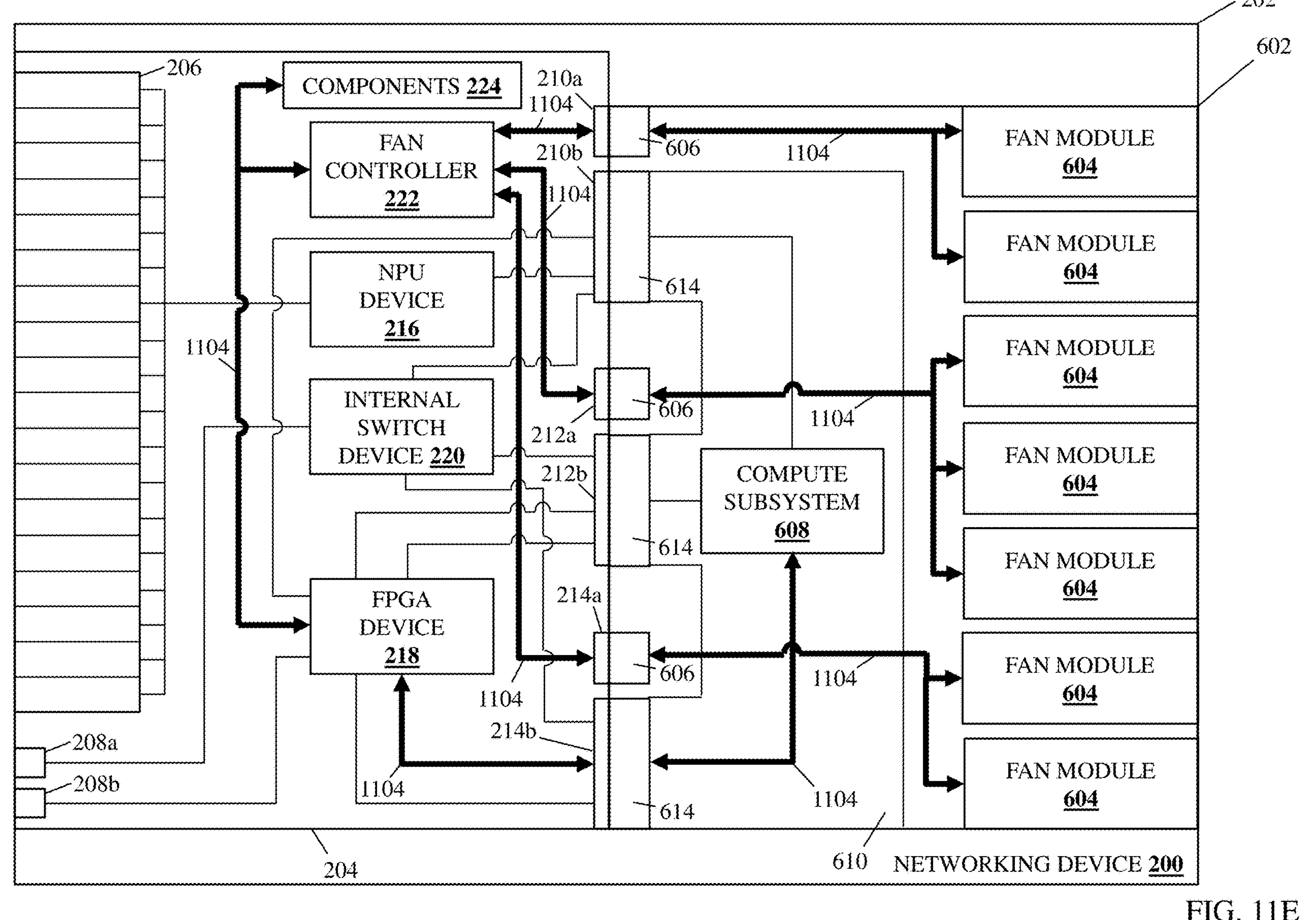
FIG. 11E is a schematic view illustrating the operation of the COFTA system of FIGS. 6A and 6B coupled to the networking device of FIGS. 2A and 2B.

In another example, with reference to FIG. 11E, the networking processing system/networking software/non-networking component management operating system provided by the compute subsystem 608 in the COFTA system 600 discussed above may perform non-networking component management operations 1104 that include managing the fan controller 222, the subset of the components 224, and/or other non-networking components in the networking device 200 via the networking device connector 314, the COFTA compute subsystem connector 214*b*, and the FPGA device 218. As will be appreciated by one of skill in the art in possession of the present disclosure, the non-networking component management operations 1104 may include any of a variety of management operations related to power monitoring, control/reset mechanisms, sensor monitoring (e.g., thermal sensor monitoring, voltage sensor monitoring, etc.), power supply system status monitoring and control, fan status monitoring and control, LED control, firmware updates, and/or other non-networking components that would be apparent to one of skill in the art in possession of the present disclosure.

As will be appreciated by one of skill in the art in possession of the present disclosure, the non-networking component management operations 1104 described above are often conventionally performed by a Baseboard Management Controller (BMC) device, Platform Management Controller (PMC) device, and/or other management controller known in the art, and thus the COFTA system 600 may operate as a management controller (i.e., in addition to managing the networking processing system and the networking software as described above) in the embodiment illustrated in FIGS. 11A-11E. Furthermore, FIG. 11E illustrates a specific example in which the non-networking component management operations 1104 include using the fan controller 222 to control any of the fan modules 604 on the COFTA system 600.

While not illustrated or described in detail, as discussed above, a user may access either of the compute subsystem 608 in the COFTA system 600 (i.e., via the networking device connector 314/COFTA compute subsystem connector 210*b* connection, the networking device connector 314/COFTA compute subsystem connector 212*b* connection, or the networking device connector 314/COFTA compute subsystem connector 214*b* connection, respectively) using the management port 208*a* and the internal switch device 220, or using the management port 208*a* and the FPGA device 218 (via its UART connections discussed above).

As such, the networking device 200 may be configured without the management functionality disaggregation described above in order to provide conventional integrated management functionality that, while being subject to the issues discussed above, may be desired for some networking device use cases. As will be appreciated by one of skill in the art in possession of the present disclosure, each of the COFTA systems 300, 400, 500, and 600 may be associated with a respective Stock Keeping Unit (SKU), and any potential networking device user may configure a networking device with desired management functionality by selecting different combinations of those SKUs. Furthermore, one of skill in the art in possession of the present disclosure will appreciate how the COFTA systems 300, 400, 500, and 600 are field replaceable, allowing the management functionality provided for the networking device 200 to be changed when desired.

Thus, systems and methods have been described that utilize COFTA systems as modular components in a networking device that are each configured to provide a respective operating system to manage different subsets of a networking processing system in the networking device, non-networking components in the networking device, and networking software used by the networking device. For example, the modular COFTA networking device system of the present disclosure may include a networking device chassis housing a circuit board coupled to a plurality of non-networking components and including: a networking processing system coupled to networking ports that are accessible on the networking device chassis, a networking processing system management connector coupled to the networking processing system, a non-networking component management connector coupled to the non-networking components, and a networking software management connector. At least two COFTA systems are each connected to a different subset of the networking processing system management connector, the non-networking component management connector, and the networking software management connector. Each COFTA system provides a respective operating system that manages a different subset of the networking processing system via the networking processing system management connector, the plurality of non-networking components via the non-networking component management connector, and networking software via the networking software management connector. As such, different switch management functionality for the networking device may be performed by dedicated operating systems, reducing or eliminating the issues with managing conventional networking devices discussed above.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A modular Computer-On-Fan-Tray-Assembly (COFTA) networking device system, comprising:
- a networking device chassis;
- a circuit board that is housed in the networking device chassis;
- a plurality of networking ports that are included on the circuit board and that are accessible on the networking device chassis;
- a networking processing system that is included on the circuit board and that is coupled to the plurality of ports;
- a plurality of non-networking components that are couped to the circuit board;
- a networking processing system management connector that is included on the circuit board and that is coupled to the networking processing system;
- a non-networking component management connector that is included on the circuit board and that is coupled to the non-networking components;
- a networking software management connector that is included on the circuit board; and
- at least two Computer-On-Fan-Tray-Assembly (COFTA) systems that are each connected to a different subset of the networking processing system management connector, the non-networking component management connector, and the networking software management connector, wherein each COFTA system is configured to provide a respective operating system that is configured to manage a different subset of the networking processing system via the networking processing system management connector, the plurality of non-networking components via the non-networking component management connector, and networking software via the networking software management connector.

2. The system of claim 1, further comprising:
- an internal switch device that is included on the circuit board, that is coupled to each of the networking processing system management connector, the non-networking component management connector, and the networking software management connector, and that is configured to transmit communications between the respective operating systems provided by the at least two COFTA systems.

3. The system of claim 1, further comprising:
- a respective fan connector that is included on the circuit board and located adjacent each of the networking processing system management connector, the non-networking component management connector, and the networking software management connector, wherein each respective fan connector is configured to connect to one of the at least two COFTA systems to couple to a fan subsystem on that COFTA system when that COFTA system is connected to the networking processing system management connector, the non-networking component management connector, or the networking software management connector that is located adjacent that fan connector.

4. The system of claim 3, wherein the plurality of non-networking components include a fan controller that is coupled to each of the respective fan connectors and that is configured for use in controlling the fan subsystem coupled to that respective fan connector.

5. The system of claim 1, wherein the at least two COFTA systems include:

a networking processing system management COFTA system that is connected to the networking processing system management connector and that is configured to provide a networking processing system management operating system that is configured to manage the networking processing system via the networking processing system management connector;

a non-networking component management COFTA system that is connected to the non-networking component management connector and that is configured to provide a non-networking component management operating system that is configured to manage the plurality of non-networking components via the non-networking component management connector; and a networking software management COFTA system that is connected to the networking software management connector and that is configured to provide a networking software management operating system that is configured to manage the networking software via the networking software management connector.

6. The system of claim 1, wherein the at least two COFTA systems include:

a networking processing system/networking software management COFTA system that is connected to the networking processing system management connector and the networking software management connector, and that is configured to provide a networking processing system/networking software management operating system that is configured to manage the networking processing system via the networking processing system management connector, and manage the networking software via the networking software management connector; and a non-networking component management COFTA system that is connected to the non-networking component management connector and that is configured to provide a non-networking component management operating system that is configured to manage the plurality of non-networking components via the non-networking component management connector.

7. The system of claim 1, wherein the at least two COFTA systems include:

a networking processing system management COFTA system that is connected to the networking processing system management connector and that is configured to provide a networking processing system management operating system that is configured to manage the networking processing system via the networking processing system management connector; and a networking software/non-networking component management COFTA system that is connected to the networking software management connector and the non-networking component management connector, and that is configured to provide a networking software/non-networking component management operating system that is configured to manage the networking software via the networking software management connector, and manage the plurality of non-networking components via the non-networking component management connector.

8. A networking device, comprising:

a networking device chassis;

a circuit board that is housed in the networking device chassis;

a plurality of networking ports that are included on the circuit board and that are accessible on the networking device chassis;

a networking processing system that is included on the circuit board and that is coupled to the plurality of ports;

a plurality of non-networking components that are couped to the circuit board; and a networking device management connector system that is included on the circuit board and that includes:

a networking processing system management connector that is coupled to the networking processing system;

a non-networking component management connector that is coupled to the non-networking components; and a networking software management connector, wherein the networking device management connector system is configured to connect to at least two Computer-On-Fan-Tray-Assembly (COFTA) systems that are each configured to provide a respective operating system that is configured to manage a different subset of the networking processing system via networking processing system management connector, the non-networking components via the non-networking component management connector, and networking software via networking software management connector.

9. The networking device of claim 8, further comprising:

an internal switch device that is included on the circuit board, that is coupled to each of the networking processing system management connector, the non-networking component management connector, and the networking software management connector, and that is configured to transmit communications between the respective operating systems provided by the at least two COFTA systems when the at least two COFTA systems are connected to networking device management connector system.

10. The networking device of claim 8, further comprising:

a respective fan connector that is included on the circuit board and located adjacent each of the networking processing system management connector, the non-networking component management connector, and the networking software management connector, wherein each respective fan connector is configured to connect to one of the at least two COFTA systems, when the at least two COFTA systems are connected to the networking device management connector system, to couple to a fan subsystem on that COFTA system when that COFTA system is connected to the networking processing system management connector, the non-networking component management connector, or the networking software management connector that is located adjacent that fan connector.

11. The networking device of claim 10, wherein the plurality of non-networking components include a fan controller that is coupled to each of the respective fan connectors and that is configured for use in controlling the fan subsystem coupled to that respective fan connector when the at least two COFTA systems are connected to the networking device management connector system.

12. The networking device of claim 8, wherein the plurality of non-networking components include a power system.

13. The networking device of claim 8, wherein the plurality of non-networking components include a Light-Emitting Device (LED) indicator system.

14. A method for providing a modular Computer-On-Fan-Tray-Assembly (COFTA)-based networking device, comprising:

connecting, by each of at least two Computer-On-Fan-Tray-Assembly (COFTA) systems, to a different subset of:

a networking processing system management connector in a networking device management connector system that is included on a circuit board housed in a networking device chassis;

a non-networking component management connector in the networking device management connector system; and a networking software management connector in the networking device management connector system;

providing, by each of the least two COFTA systems, a respective operating system; and managing, by each of the respective operating systems provided by the at least two COFTA systems, a different subset of:

a networking processing system via the networking processing system management connector, wherein the networking processing system is included on the circuit board and coupled to a plurality of networking ports that are included on the circuit board and that are accessible via the networking device chassis;

a plurality of non-networking components via the non-networking component management connector, wherein the plurality of non-networking components are coupled to the circuit board; and networking software via the networking software management connector.

15. The method of claim 14, further comprising:

transmitting, by an internal switch device that is included on the circuit board and coupled to each of the networking processing system management connector, the non-networking component management connector, and the networking software management connector, communications between the respective operating systems provided by the at least two COFTA systems.

16. The method of claim 14, further comprising:

connecting, by a respective fan connector that is included on the circuit board and located adjacent each of the networking processing system management connector, the non-networking component management connector, and the networking software management connector, to one of the at least two COFTA systems to couple that respective fan connector to a fan subsystem on that COFTA system.

17. The method of claim 16, further comprising:

controlling, by a fan controller that is included in the plurality of non-networking components and coupled to each of the respective fan connectors, the fan subsystem coupled to that respective fan connector.

18. The method of claim 14, wherein the at least two COFTA systems include:

a networking processing system management COFTA system that is connected to the networking processing system management connector and that provides a networking processing system management operating system that manages the networking processing system via the networking processing system management connector;

a non-networking component management COFTA system that is connected to the non-networking component management connector and that provides a non-networking component management operating system that manages the plurality of non-networking components via the non-networking component management connector; and a networking software management COFTA system that is connected to the networking software management connector and that provides a networking software management operating system that manages the networking software via the networking software management connector.

19. The method of claim 14, wherein the at least two COFTA systems include:

a networking processing system/networking software management COFTA system that is connected to the networking processing system management connector and the networking software management connector, and that provides a networking processing system/networking software management operating system that manages the networking processing system via the networking processing system management connector, and manages the networking software via the networking software management connector; and a non-networking component management COFTA system that is connected to the non-networking component management connector and that provides a non-networking component management operating system that manages the plurality of non-networking components via the non-networking component management connector.

20. The method of claim 14, wherein the at least two COFTA systems include:

a networking processing system management COFTA system that is connected to the networking processing system management connector and that provides a networking processing system management operating system that manages the networking processing system via the networking processing system management connector; and a networking software/non-networking component management COFTA system that is connected to the networking software management connector and the non-networking component management connector, and that provides a networking software/non-networking component management operating system that manages the networking software via the networking software management connector, and manages the plurality of non-networking components via the non-networking component management connector.

* * * * *